US008872040B2

(12) United States Patent
Kanki et al.

(10) Patent No.: US 8,872,040 B2
(45) Date of Patent: Oct. 28, 2014

(54) WIRING STRUCTURE AND MANUFACTURING METHOD THEREOF, AND ELECTRONIC APPARATUS AND MANUFACTURING METHOD THEREOF

(75) Inventors: Tsuyoshi Kanki, Atsugi (JP); Shoichi Suda, Machida (JP); Yoshihiro Nakata, Atsugi (JP)

(73) Assignee: Fujitsu Limited, Kawasaki (JP)

( * ) Notice: Subject to any disclaimer, the term of this patent is extended or adjusted under 35 U.S.C. 154(b) by 190 days.

(21) Appl. No.: 13/530,815

(22) Filed: Jun. 22, 2012

(65) Prior Publication Data

US 2013/0048358 A1 Feb. 28, 2013

(30) Foreign Application Priority Data

Aug. 29, 2011 (JP) ................................ 2011-186585

(51) Int. Cl.
*H05K 1/00* (2006.01)
*H01L 23/00* (2006.01)
*H01L 23/498* (2006.01)
*H01L 23/538* (2006.01)

(52) U.S. Cl.
CPC ............ *H01L 23/5389* (2013.01); *H01L 24/19* (2013.01); *H01L 23/49816* (2013.01); *H01L 2224/12105* (2013.01); *H01L 2924/01029* (2013.01)
USPC ........... 174/258; 174/250; 174/252; 174/256; 174/266; 361/750; 257/99; 428/141; 428/154; 428/414; 428/687; 216/13; 216/17; 216/20; 29/830; 29/846; 29/847; 29/852

(58) Field of Classification Search
USPC .......... 174/258, 250, 252, 256, 266; 361/750; 257/99; 428/141, 154, 414, 687; 216/13, 17, 20; 29/830, 846, 847, 852
See application file for complete search history.

(56) References Cited

U.S. PATENT DOCUMENTS

| | | | | |
|---|---|---|---|---|
| 5,362,926 | A * | 11/1994 | Fukuda et al. | 174/256 |
| 5,480,048 | A * | 1/1996 | Kitamura et al. | 216/13 |
| 5,501,350 | A * | 3/1996 | Yoshida et al. | 216/20 |
| 5,979,044 | A * | 11/1999 | Sumi et al. | 29/830 |
| 6,175,084 | B1 * | 1/2001 | Saitoh et al. | 174/252 |
| 6,240,636 | B1 * | 6/2001 | Asai et al. | 29/852 |
| 6,286,207 | B1 * | 9/2001 | Oura et al. | 29/846 |
| 6,369,332 | B1 * | 4/2002 | Saitoh et al. | 174/260 |
| 6,417,461 | B1 * | 7/2002 | Hirahara et al. | 174/256 |
| 6,449,835 | B1 * | 9/2002 | Oura et al. | 29/830 |
| 6,523,256 | B1 * | 2/2003 | Oura et al. | 29/852 |
| 6,564,448 | B1 * | 5/2003 | Oura et al. | 29/830 |
| 2001/0052183 | A1 * | 12/2001 | Iba et al. | 29/846 |
| 2002/0187352 | A1 * | 12/2002 | Bae et al. | 428/414 |
| 2003/0000083 | A1 * | 1/2003 | Takahashi | 29/847 |
| 2003/0007332 | A1 * | 1/2003 | Seki et al. | 361/750 |
| 2003/0189829 | A1 * | 10/2003 | Shimizu et al. | 362/240 |

(Continued)

FOREIGN PATENT DOCUMENTS

| | | |
|---|---|---|
| JP | 64-64237 | 3/1989 |
| JP | 2007-220934 A1 | 8/2007 |

*Primary Examiner* — Xiaoliang Chen
(74) *Attorney, Agent, or Firm* — Kratz, Quintos & Manson, LLP

(57) ABSTRACT

A wiring structure includes: an insulating film formed over a substrate; a plurality of wirings formed on the insulating film; and an inducing layer, which is formed on the insulating film in a region between the plurality of wirings, a constituent atoms of the wirings are diffused in the inducing layer.

17 Claims, 70 Drawing Sheets

(56) References Cited

U.S. PATENT DOCUMENTS

| | | | | |
|---|---|---|---|---|
| 2004/0091688 | A1* | 5/2004 | Gaku et al. | 428/209 |
| 2004/0201446 | A1* | 10/2004 | Matsuda et al. | 338/308 |
| 2005/0207165 | A1* | 9/2005 | Shimizu et al. | 362/362 |
| 2005/0237747 | A1* | 10/2005 | Shimizu et al. | 362/294 |
| 2005/0242362 | A1* | 11/2005 | Shimizu et al. | 257/99 |
| 2005/0274689 | A1* | 12/2005 | Sakata et al. | 216/13 |
| 2006/0054589 | A1* | 3/2006 | Omori et al. | 216/13 |
| 2006/0115670 | A1* | 6/2006 | Tanaka et al. | 428/615 |
| 2006/0160409 | A1* | 7/2006 | Shimizu et al. | 439/490 |
| 2007/0141381 | A1* | 6/2007 | Suzuki et al. | 428/610 |
| 2007/0172674 | A1* | 7/2007 | Nozaki et al. | 428/458 |
| 2007/0187708 | A1* | 8/2007 | Setomoto et al. | 257/99 |
| 2008/0171138 | A1* | 7/2008 | Sakata et al. | 427/96.2 |
| 2009/0025966 | A1* | 1/2009 | Shimoosako et al. | 174/256 |
| 2009/0178840 | A1* | 7/2009 | Kim et al. | 174/266 |
| 2009/0277674 | A1* | 11/2009 | Oh et al. | 174/258 |
| 2009/0289030 | A1* | 11/2009 | Ueno | 216/17 |
| 2009/0317591 | A1* | 12/2009 | Sato et al. | 428/141 |
| 2010/0051322 | A1* | 3/2010 | Kim et al. | 174/250 |
| 2010/0190029 | A1* | 7/2010 | Ueki | 428/687 |
| 2010/0236820 | A1* | 9/2010 | Suh | 174/258 |
| 2010/0270063 | A1* | 10/2010 | Suzuki et al. | 174/257 |
| 2011/0223383 | A1* | 9/2011 | Goto et al. | 428/141 |
| 2011/0244183 | A1* | 10/2011 | Goto et al. | 428/145 |
| 2013/0199830 | A1* | 8/2013 | Morita et al. | 174/258 |

* cited by examiner

WIRING STRUCTURE AND MANUFACTURING METHOD THEREOF, AND ELECTRONIC APPARATUS AND MANUFACTURING METHOD THEREOF

CROSS-REFERENCE TO RELATED APPLICATION

This application is based upon and claims the benefit of priority of the prior Japanese Patent Application No. 2011-186585, filed on Aug. 29, 2011, the entire contents of which are incorporated herein by reference.

FIELD

The embodiments disclosed herein are related to a wiring structure and a manufacturing method thereof, and an electronic apparatus and a manufacturing method thereof.

BACKGROUND

Recently, miniaturization of the wiring structure of electronic circuits has been in accordance with demand such as reduction in size of electronic apparatuses, enhancement in performance, reduction in pricing, and so forth.

A reliability test is performed on a developed wiring structure for confirming whether or not this has sufficient reliability. Examples of such a reliability test include a HAST (Highly Accelerated temperature and humidity Stress Test) test. The HAST test is a test for evaluating insulating resistance between wirings by applying voltage between the wirings under high temperature and high humidity.

The following is reference documents:

[Document 1] Japanese Laid-open Patent Publication No. 2007-220934

[Document 2] Japanese Laid-open Patent Publication No. 64-64237

SUMMARY

According to an aspect of the invention, a wiring structure includes: an insulating film formed over a substrate; a plurality of wirings formed on the insulating film; and an inducing layer, which is formed on the insulating film in a region between the plurality of wirings, a constituent atoms of the wirings are diffused in the inducing layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In the event of forming multiple wirings on a first insulating film, and performing a HAST test on a wiring structure where a second insulating film is formed so as to cover such multiple wirings, migration advances along an interface between the first insulating film and the second insulating film, and consequently results in insulation breakdown. Such migration advances at a partial portion in a concentrative and overwhelming manner.

It may also be conceived to subject the upper portion of the first insulating film in a region between multiple wirings to etching, and to lower the height of the surface of the first insulating film in the region between multiple wirings as compared to the height of the surface of the first insulating film in a region covered with a wiring.

However, sufficient reliability has not been obtained in the event of having lowered the height of the surface of the first insulating film in the region between multiple wirings as compared to the height of the surface of the first insulating film in a region covered with wirings.

However, it may also be conceived to form a barrier film for restraining diffusion of constituent atoms of wirings so as to cover the upper and side faces of wirings.

However, simply having formed such a barrier film does not necessarily yield sufficient reliability.

In either case, migration has advanced at a partial portion in a concentrative and overwhelming manner resulting in insulation breakdown.

First Embodiment

Description will be made regarding a wiring structure according to a first embodiment and a manufacturing method thereof, and an electronic apparatus employing the wiring structure thereof and a manufacturing method thereof, with reference to FIGS. 1 through 17.

Now, though an example will be described wherein a wiring structure according to the present embodiment has been applied to an electronic apparatus, an object to which the wiring structure according to the present embodiment is applied is not restricted to electronic apparatuses. For example, the wiring structure according to the present embodiment may be applied to a circuit substrate.

[Electronic Apparatus]

Figure 1:
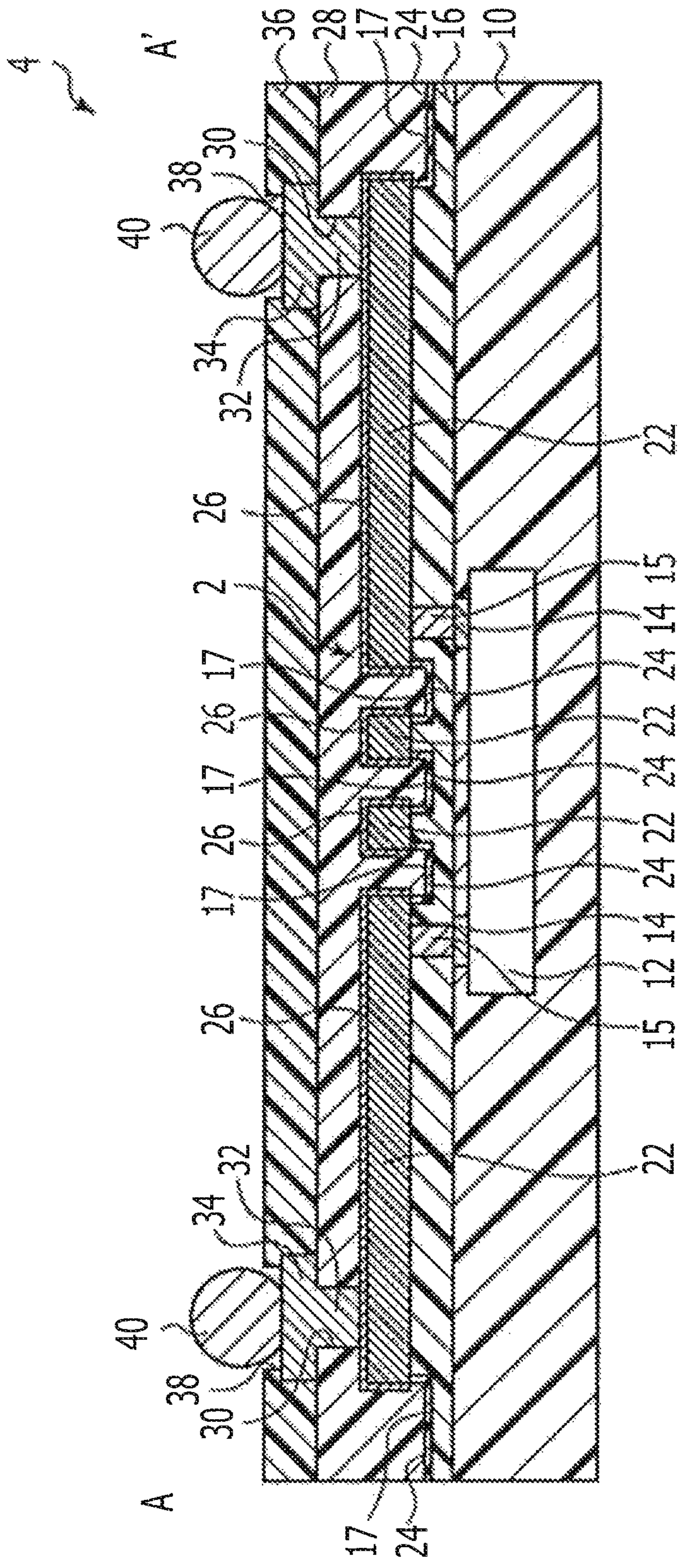
FIG. 1 is a cross-sectional view illustrating an electronic apparatus according to a first embodiment.
Figure 2:
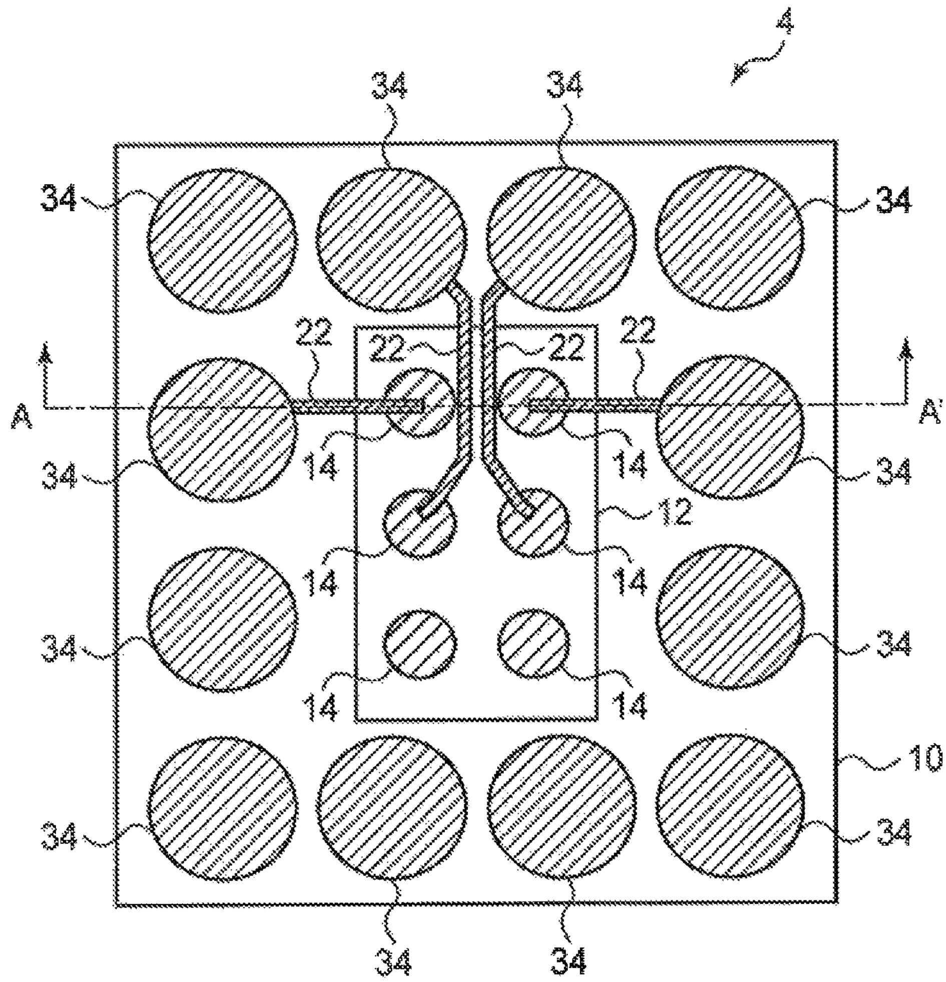
FIG. 2 is a plain view of the electronic apparatus according to the first embodiment.
Figure 3:
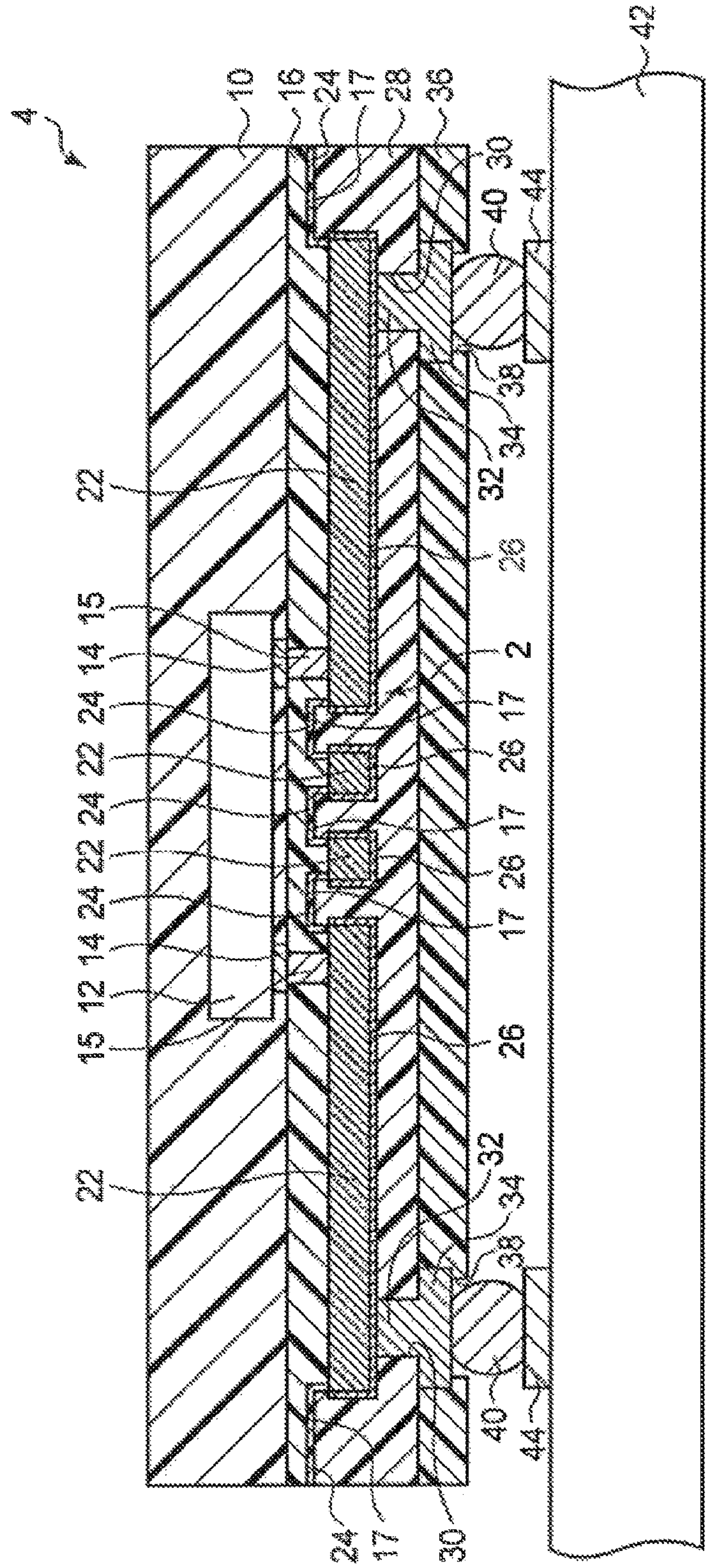
FIG. 3 is a cross-sectional view illustrating a state in which the electronic apparatus according to the first embodiment has been mounted on a circuit substrate.

First, an electronic apparatus according to the present embodiment will be described with reference to FIGS. 1 through 3. FIG. 1 is a cross-sectional view illustrating the electronic apparatus according to the present embodiment. FIG. 2 is a plain view of the electronic apparatus according to the present embodiment. FIG. 1 corresponds to cross-section A-A' in FIG. 2. FIG. 3 is a cross-sectional view illustrating a state in which the electronic apparatus according to the present embodiment has been mounted on a circuit substrate.

As illustrated in FIG. 1, a chip (bare chip) 12 is embedded in a resin layer (substrate, resin layer molding, sealing resin layer) 10. As for the material of the resin layer 10, an organic resin is employed, for example. As for such an organic resin, an epoxy resin is employed, for example. The chip 12 is a semiconductor chip, for example. As for such a semiconductor chip 12, an LSI (Large Scale Integration) is employed, for example. The thickness of the resin layer 10 is 200 μm to 1 mm or so, for example. The thickness of the chip 12 is 200 μm to 600 μm or so, for example.

With the chip 12, electrodes (surface electrode, external connection electrode) 14 are formed. One side of the electrodes 14 of the chip 12 (the face of the upper side on the paper in FIG. 1), i.e., the upper faces of the electrodes 14 of the chip 12 are exposed from the resin layer 10.

Vias 15 connected to the electrodes 14 are formed on the electrodes 14. As for the materials of the vias 15, copper (Cu) is employed, for example. The height of the vias 15 is 2 μm to 20 μm or so. Now, let us say that the heights of the vias 15 are 5 μm or so, for example.

An insulating film 16 is formed on the resin layer 10 where the vias 15 are formed. The vias 15 are embedded by the insulating film 16. One faces of the vias 15 (the face of the upper side on the paper in FIG. 1), i.e., the upper faces of the vias 15 are exposed from the insulating film 16. As for the materials of the insulating film 16, an organic resin is employed, for example. As for such an organic resin, a phenol resin is employed, for example. More specifically, as for the material of the insulating film 16, a positive-type photosensitive phenol resin is employed, for example. The film thickness of the insulating film 16 is 2 μm to 20 μm or so, for example. Now, let us say that the film thickness of the insulating film 16 is 5 μm, for example.

Note that the reason why a positive-type photosensitive phenol resin is employed as the insulating film 16 is because the positive-type photosensitive phenol resin has many impurities and large leakage current.

With one face (the face of the upper side on the paper in FIG. 1) of the insulating film 16, i.e., the upper face of the insulating film 16, multiple wirings 22 connected to the vias 15 respectively are formed. As for the materials of the wirings 22, Cu is employed, for example. With the insulating film 16 in a region between the multiple wirings 22, recessed portions 17 are formed. Therefore, the height of the upper face of the insulating film 16 in the region between the multiple wirings 22 is lower than the height of the upper face of the insulating film 16 in a region covered with the wirings 22. In other words, the height of the upper face of the insulating film 16 in the region not covered with the wirings 22 is lower than the height of the insulating film 16 in the region covered with the wirings 22. The depth of the recessed portions 17 is 800 nm or so, for example.

An inducing layer 24 for inducing diffusion (movement) of the constituent atoms (metal, metal ions) of the wirings 22 is formed on the insulating film 16 in the region between the multiple wirings 22. In other words, the layer 24 where the constituent atoms of the wirings 22 may readily be diffused as compared to the insulating films 16 and 28 is formed on the insulating film 16 in the region between the multiple wirings 22. Here, Cu which is a constituent atom of the wirings 22 may readily be diffused in the inducing layer 24 as compared to the insulating films 16 and 28. The inducing layer 24 is formed by altering the surface portion of the insulating film 16. More specifically, the inducing layer (altered layer) 24 is formed by roughening the surface portion of the insulating film 16. The inducing layer 24 is a roughened portion of the insulating film 16. Therefore, the inducing layer 24 is formed on the surface portion of the insulating film 16 in the region between the multiple wirings 22. The inducing layer 24 is formed on the bottom and side portions of the recessed portions 17 formed on the insulating film 16 in the region between the multiple wirings 22.

The inducing layer 24 has been roughened, and accordingly, hygroscopicity (absorbability) thereof is higher than those of the insulating films 16 and 28. Highness in hygroscopicity contributes to the constituent atoms of the wirings 22 being readily taken in the inducing layer 24, and to being readily diffused into the inducing layer 24.

Also, the inducing layer 24 has been roughened, and accordingly, density thereof is lower than those of the insulating films 16 and 28. Lowness in density contributes to the constituent atoms of the wirings 22 being readily taken in the inducing layer 24, and being readily diffused into the inducing layer 24.

The thickness of the inducing layer 24 is 5 nm to 300 nm, for example. Now, let us say that the thickness of the inducing layer 24 is 100 nm or so.

The insulation properties of the inducing layer 24 are lower than those of the insulating films 16 and 28. Highness/lowness in insulation properties affects ease of movement of the constituent atoms of the wirings 22. The insulating films 16 and 28 are relatively high in insulation properties, and accordingly, the constituent atoms of the wirings 22 are relatively hard to move in the insulating films 16 and 28. On the other hand, the insulation properties of the inducing layer 24 are relatively low, and accordingly, the constituent atoms of the wirings 22 have relatively ease of movement in the inducing layer 24.

A barrier film 26 is formed on the upper and side faces of the wirings 22. The barrier film 26 is for restraining the constituent atoms of the wirings 22 from diffusing into the insulating film 28. As for the material of the barrier film 26, cobalt tungsten phosphorus (CoWP) is employed, for example. The film thickness of the barrier film 26 is 5 nm to 100 nm or so, for example. Now, let us say that the thickness of the barrier film 26 is 20 nm or so, for example.

In this way, the wiring structure 2 according to the present embodiment is formed wherein the inducing layer 24 for inducing diffusion of the constituent atoms of the wirings 22 is formed on the insulating film 16 in the region between the multiple wirings 22.

The insulating film 28 is formed on one face side (the upper side on the paper in FIG. 1) of the insulating film 16, i.e., on the insulating film 16 so as to cover the wirings 22 where the barrier film 26 is formed. As for the material of the insulating film 28, an organic resin is employed, for example. As for such an organic resin, a positive-type photosensitive phenol resin is employed, for example. The film thickness of the insulating film 28 is 5 μm to 30 μm or so, for example. Now, let us say that the film thickness of the insulating film 28 is 10 μm, for example.

Note that the reason why a positive-We photosensitive phenol resin is employed as the insulating film 28 is because the positive-type photosensitive phenol resin has many impurities and large leakage current.

Openings (contact hole) 30 extending to the wirings 22 are formed on the insulating film 28. Vias (electroconductor plugs) 32 are formed in the openings 30. Electrode pads 34 formed integral with the vias 32 are formed on one face side (the upper side on the paper in FIG. 1) of the insulating film 28, i.e., on the insulating film 28. As for the materials of the vias 32 and electrode pads 34, Cu is employed, for example.

A plating film (not illustrated) is formed on the upper and side faces of the electrode pads 34. As for such a plating film, a laminated film (not illustrated) made up of a nickel (Ni) film and a gold (Au) film is employed, for example.

A solder resist film 36 is formed on one face side (the upper side on the paper in FIG. 1) of the insulating film 28, i.e., on the insulating film 28. Openings 38 from which the electrode pads 34 are exposed are formed on the solder resist film 36. Solder bumps (solder balls) 40 are formed on one face sides (the upper side on the paper in FIG. 1) of the electrode pads 34, i.e., on the electrode pads 34. The solder bumps 40 are electrically connected to the electrodes 14 of the chip 12 via the electrode pads 34 and wirings 22, respectively. In this way, an electronic apparatus (wafer level package) 4 according to the present embodiment having the wiring structure 2 is formed.

The electronic apparatus 4 according to the present embodiment is, as illustrated in FIG. 3, mounted on the circuit substrate 42, for example. Electrodes 44 are formed on the surface of the circuit substrate 42. The electrodes 44 are electrically connected to a wiring (not illustrated) or the like formed on the circuit substrate 42. As for the materials of the electrodes 44, Au, Cu, or the like is employed, for example. As for the circuit substrate 42, a resin substrate or ceramics substrate or the like is employed, for example.

The electrode pads 34 of the electronic apparatus 4, and the electrodes 44 of the circuit substrate 42 are jointed with the solder bumps 40, for example. In this way, according to the present embodiment, the inducing layer 24 for inducing diffusion of the constituent atoms of the wirings 22 is formed on the insulating film 16 in the region between the multiple wirings 22. Therefore, according to the present embodiment, migration does not intensely advance at a partial portion, and migration gradually advances in an overall and even manner. Therefore, according to the present embodiment, time until insulation breakdown occurs may sufficiently be prolonged, whereby the wiring structure 2 having high reliability, and the electronic apparatus 4 having the wiring structure thereof may be provided.

Moreover, according to the present embodiment, the recessed portions 17 are formed in the insulating film 16 in the region between the multiple wirings 22, and the inducing layer 24 is formed on the bottom and side portions of the recessed portions 17. Therefore, according to the present embodiment, the advancing route of migration is bypassed by an amount equivalent to the depths of the recessed portions 17, and time until insulation breakdown occurs may further be prolonged.

(Manufacturing Method of Electronic Apparatus)

Next, a method for manufacturing the electronic apparatus according to the present embodiment will be described with reference to FIGS. 4A through 17. FIGS. 4A through 17 are process cross-sectional views illustrating the method for manufacturing the electronic apparatus according to the present embodiment.

Figure 4A:
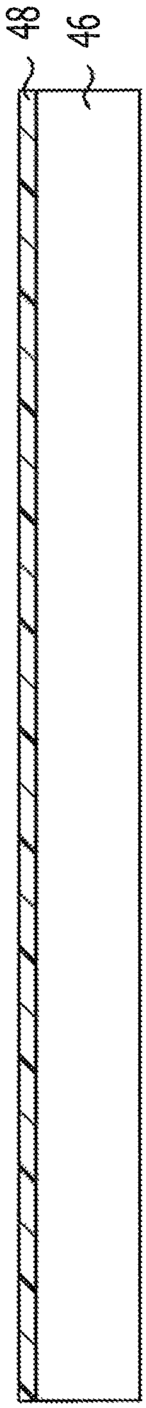
FIGS. 4A and 4B are process cross-sectional views (Part 1) illustrating a method for manufacturing the electronic apparatus according to the first embodiment.

First, as illustrated in FIG. 4A, an adhesive layer 48 is formed on a supporting substrate 46. As for the supporting substrate 46, silicon substrate, stainless (SUS) substrate, glass substrate, or the like is employed, for example. It is desirable to set the thickness of the supporting substrate 46 thicker than the thickness of the resin layer 10. As for the adhesive layer 48, an adhesive layer that may be peeled by application of heat, i.e., an adhesive layer whereby thermal ablation may be performed is formed. The thickness of the adhesive layer 48 is 100 μm or so, for example.

Figure 4B:
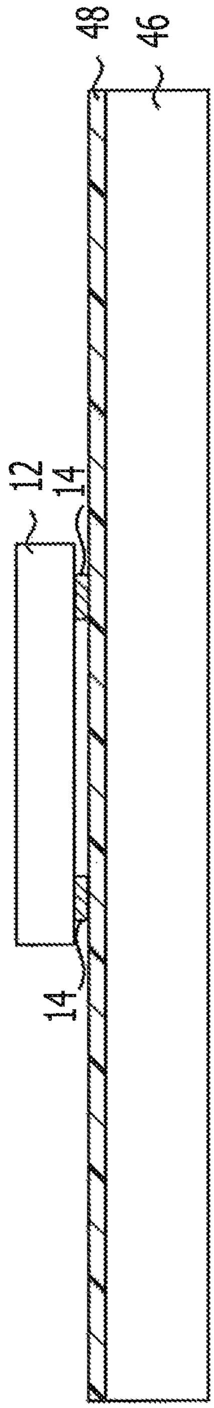

Next, as illustrated in FIG. 4B, the chip 12 is disposed on the adhesive layer 48. As for the chip 12, a semiconductor chip is employed, for example. The electrodes 14 are formed on the chip 12. At the time of disposing the chip 12 on the adhesive layer 48, the chip 12 is disposed so that the electrodes 14 of the chip 12 are in contact with the adhesive layer 48. Thus, the chip 12 is disposed on the adhesive layer 48.

Figure 5A:
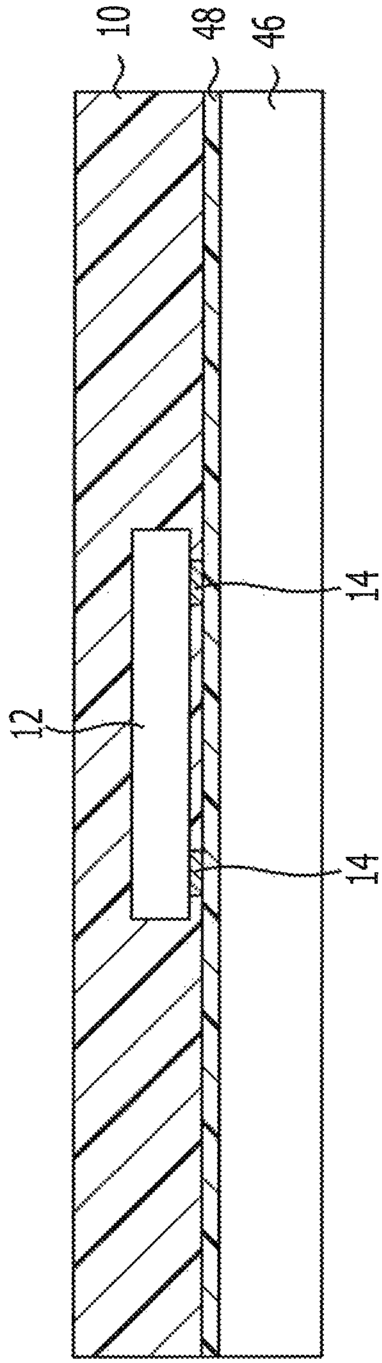
FIGS. 5A and 5B are process cross-sectional views (Part 2) illustrating a method for manufacturing the electronic apparatus according to the first embodiment.

Next, as illustrated in FIG. 5A, the resin layer 10 is formed on the entire surface of the adhesive layer 48 where the chip 12 has been disposed. As for the material of the resin layer 10, an organic resin is employed, for example. More specifically, as for the material of the resin layer 10, an epoxy resin is employed, for example. The resin layer 10 is filled in space between the chip 12 and the adhesive layer 48. Thus, the side faces of the electrodes 14 of the chip 12 are covered with the resin layer 10. Thus, the chip 12 is in a state embedded by the resin layer 10.

Figure 5B:
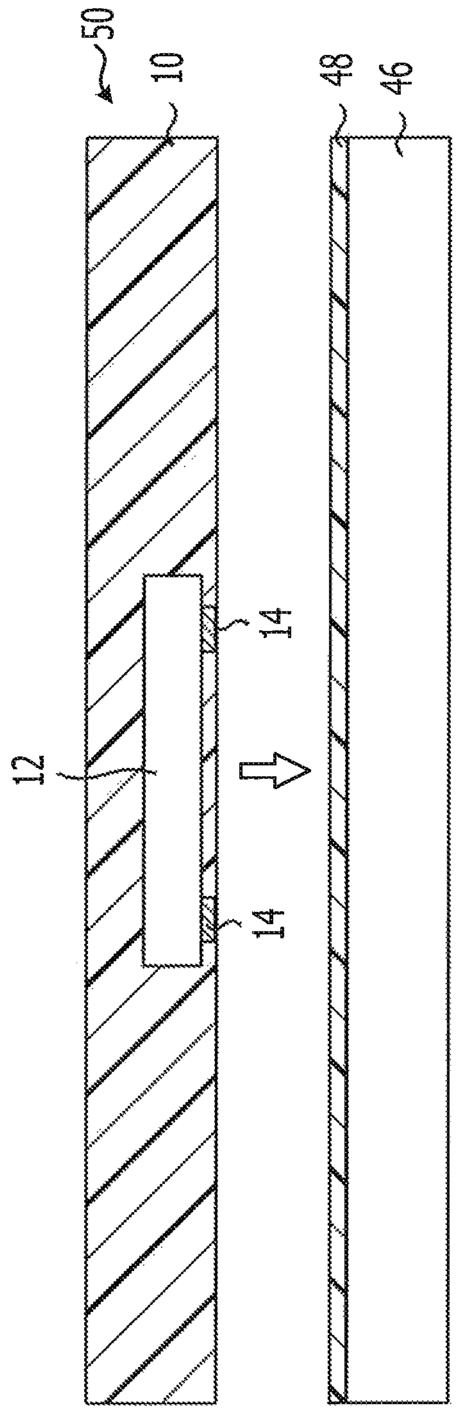

Next, as illustrated in FIG. 5B, the supporting substrate 46 and adhesive layer 48 are peeled from the resin layer 10 and chip 12. That is to say, the supporting substrate 46 and adhesive layer 48 are removed from the resin layer 10 in which the chip 12 is embedded. In the event of employing an adhesive layer whereby thermal abrasion may be performed as the adhesive layer 48, the adhesibility of the adhesive layer 48 may be lowered by performing thermal treatment at the time of peeling the supporting substrate and adhesive layer 48 from the resin layer 10 and chip 12. In this way, a structure (pseudo-wafer, resin substrate) 50 where the chip 12 is embedded in the resin layer 10 is obtained. One face (face adjacent to the adhesive layer 48) of the structure 50 is in a state in which the electrodes 14 of the chip 12 are exposed. Note that such technology is referred to as pseudo SOC (System On Chip).

Figure 6A:
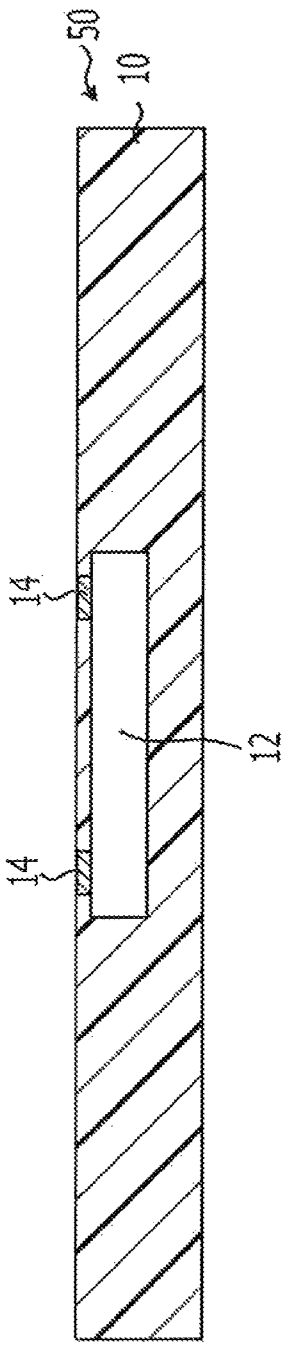
FIGS. 6A and 6B are process cross-sectional views (Part 3) illustrating a method for manufacturing the electronic apparatus according to the first embodiment.

Next, the upper and lower sides of the structure 50 are reversed (see FIG. 6A). Next, an adherence layer (barrier layer) (not illustrated) is formed on one face (face on the upper side on the paper in FIG. 6A) of the structure 50, i.e., the entire surface on the structure 50, for example, by the sputtering method. As for the material of the adherence layer, titanium (Ti) is employed, for example. The thickness of the adherence layer is 20 nm or so, for example.

Figure 6B:
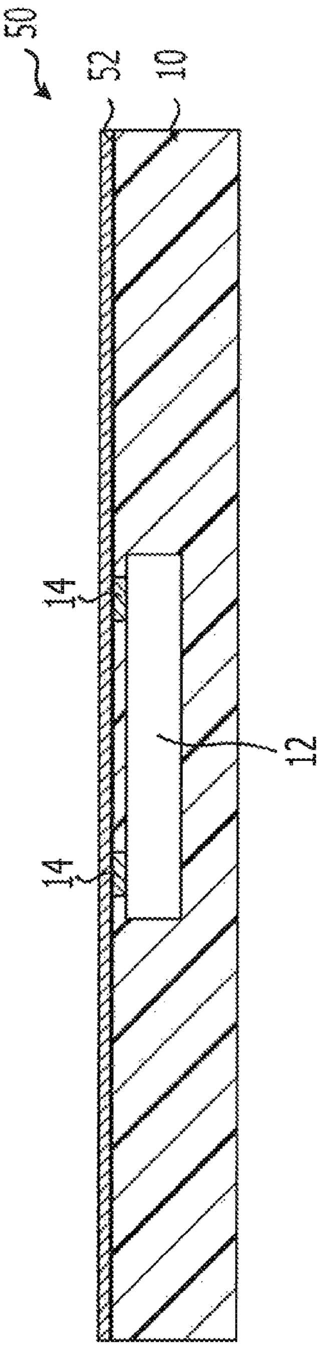

Next, a seed layer 52 is formed on the entire surface of one face side (upper side on the paper in FIG. 6B) of the structure 50 where the adherence layer is formed, for example, by the sputtering method (see FIG. 6B). As for the material of the seed layer 52, Cu is employed, for example. The thickness of the seed layer 52 is 100 nm or so, for example.

Figure 7A:
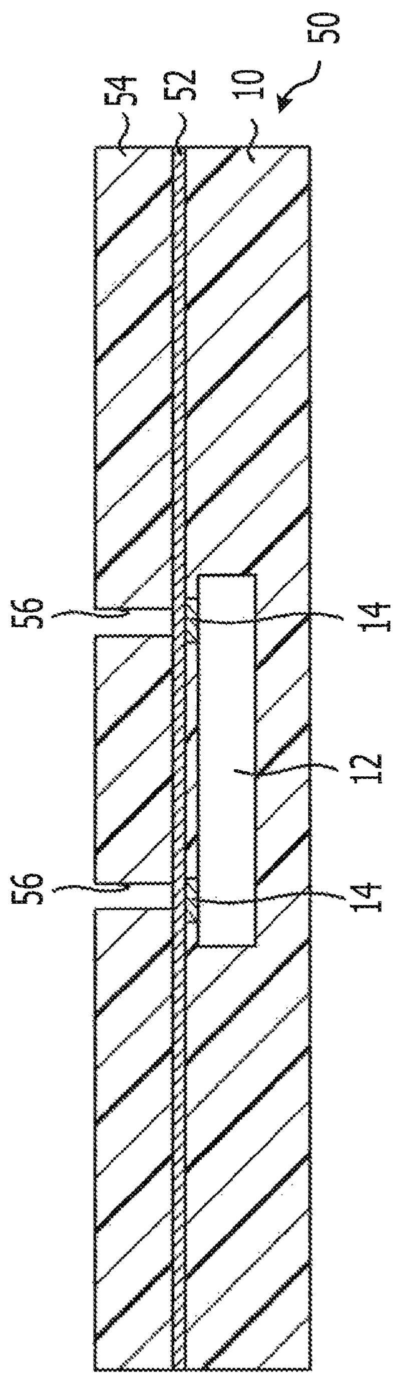
FIGS. 7A and 7B are process cross-sectional views (Part 4) illustrating a method for manufacturing the electronic apparatus according to the first embodiment.

Next, as illustrated in FIG. 7A, a photo resist film 54 is formed on the entire surface of one face side (upper side on the paper in FIG. 7A) of the structure 50, for example, by the spin coating method. The film thickness of the photo resist film 54 is 8 μm or so, for example.

Next, openings 56 are formed in the photo resist film 54 using the photolithographic technique. At the time of exposing the patterns of the openings 56 on the photo resist film 54, a stepper, contact aligner, or the like is employed, for example. As for a developing solution at the time of developing the photo resist film 54, TMAH (Tetra Methyl Ammonium Hydroxide) is employed, for example.

Next, the photo resist film 54 is altered. Such altering is for facilitating electroplating by hydrophilically improving the surface of the photo resist film 54. At the time of altering the photo resist film 54, $O_2$ plasma irradiation, ultraviolet irradiation, or the like is employed, for example.

Figure 7B:
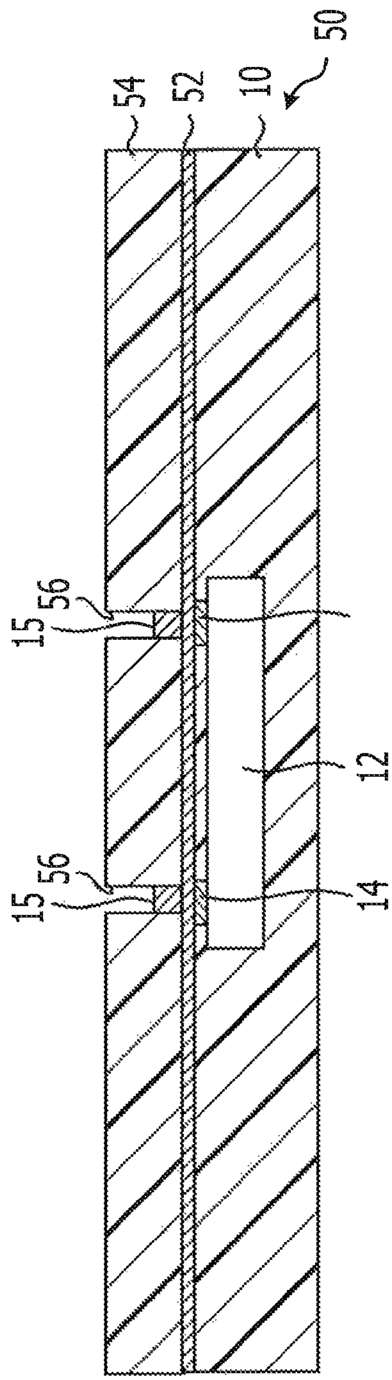

Next, as illustrated in FIG. 7B, vias (electroconductive plugs) 15 are formed, for example, by the electroplating method. As for a plating bath used for forming the vias 15, a copper-sulfate plating bath is employed, for example. The height of the vias 15 is 2 μm to 20 μm or so, for example.

Next, the photo resist film 54 is peeled. As for peeling liquid at the time of peeling the photo resist film 54, NMP (N-MethylPyrrolidone) or acetone or the like is employed, for example.

Figure 8A:
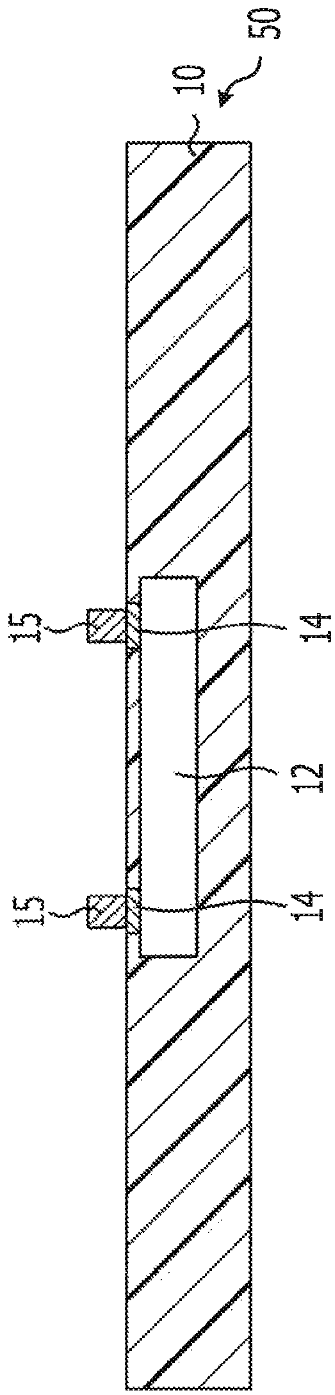
FIGS. 8A and 8B are process cross-sectional views (Part 5) illustrating a method for manufacturing the electronic apparatus according to the first embodiment.

Next, for example, according to wet etching, the seed layer 52 and adherence layer exposed around the vias 15 are removed (see FIG. 8A). As for an etching solution used at the time of subjecting the seed layer 52 to etching, a potassium sulfate solution, ferric chloride solution, ammonium-peroxodisulfate solution, or the like is employed, for example. As for an etching solution used for subjecting the adherence layer to etching, an ammonium fluoride solution is employed, for example. Note that the etching method of the adherence layer is not restricted to wet etching. For example, the adherence layer may be subjected to etching by dry etching. At the time of subjecting the adherence layer to dry etching, $CF_4$ gas may be employed as etching gas, for example.

Figure 8B:
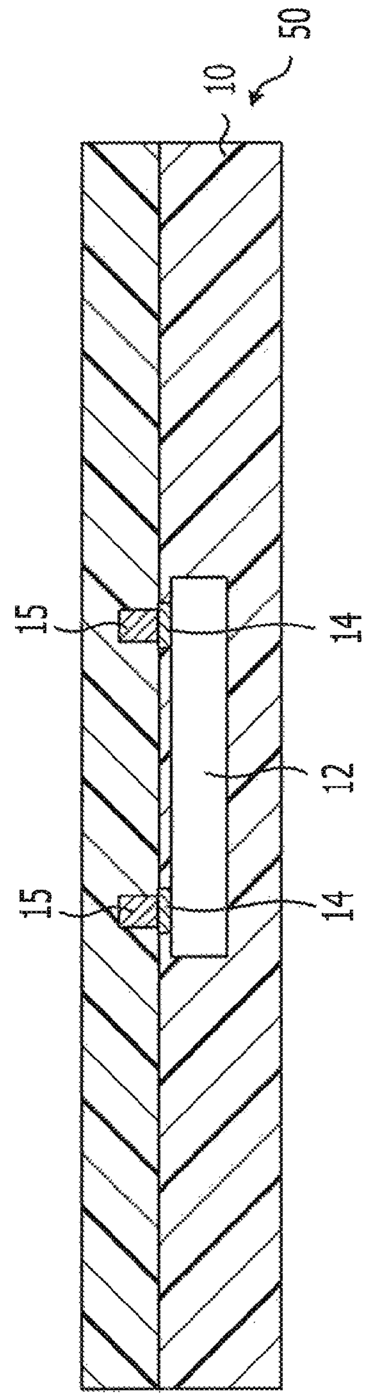

Next, as illustrated in FIG. 8B, the insulating film 16 is formed on the entire surface of one face side (upper side on the paper in FIG. 8B) of the structure 50, i.e., on the entire surface on the structure 50, for example, by the spin coating method. As for the material of the insulating film 16, an organic resin is employed, for example. As for such an organic resin, a phenol resin is employed, for example. More specifically, as for the material of the insulating film 16, a positive-type photosensitive phenol resin is employed, for example. The film thickness of the insulating film 16 is 3 μm to 25 μm or so, for example.

Figure 9A:
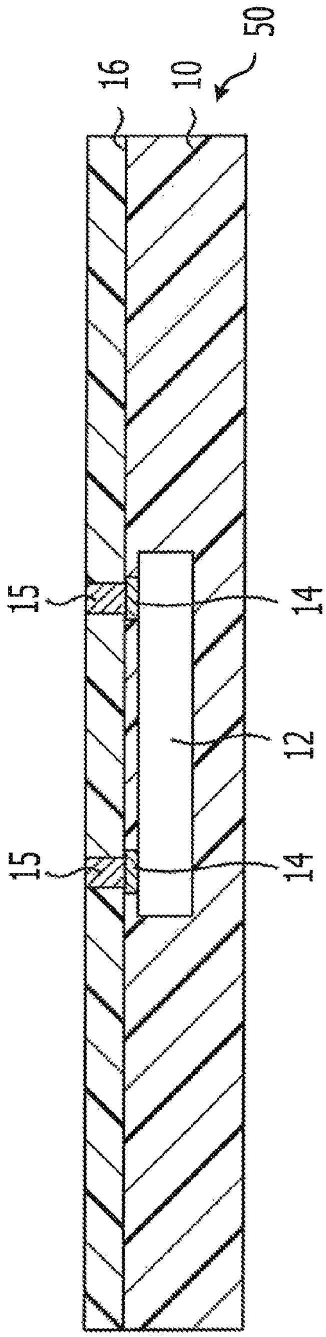
FIGS. 9A and 9B are process cross-sectional views (Part 6) illustrating a method for manufacturing the electronic apparatus according to the first embodiment.
Figure 9B:
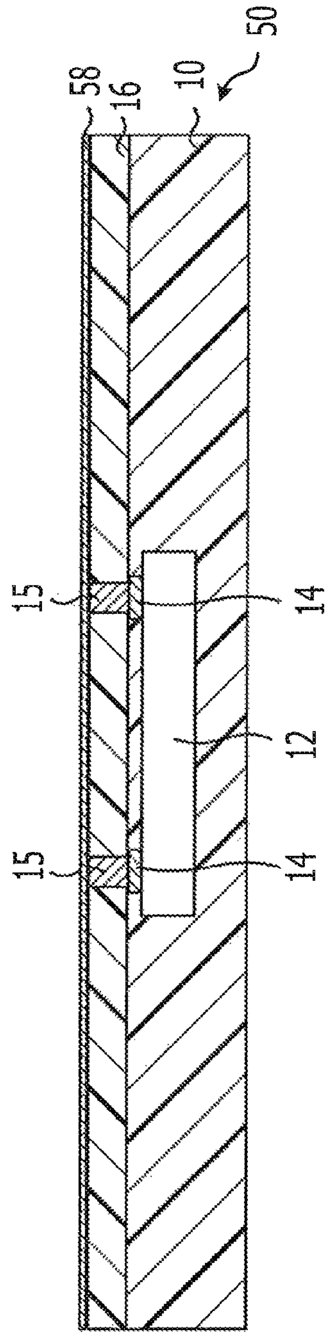

Next, as illustrated in FIG. 9A, for example, according to the CMP (Chemical Mechanical Polishing) method, one face side (upper side on the paper in FIG. 9A) of the insulating film 16 is polished until the surfaces of the vias 15 are exposed. Thus, the surface of the insulating film 16 is flattened. The film thickness of the insulating film 16 becomes 2 μm to 20 μm or so, for example.

Next, for example, an adherence layer having film thickness of 20 nm or so (not illustrated) is formed on the entire surface of one face side (upper side on the paper in FIG. 9A) of the structure 50 where the insulating film 16 is formed, for example, by the spattering method. As for the material of the adherence layer, Ti is employed, for example. The thickness of the adherence layer is 20 nm or so, for example.

Next, a seed layer 58 is formed on the entire surface of one face side (upper side on the paper in FIG. 9B) of the structure 50 where the adherence layer is formed, for example, by the spattering method. As for the material of the seed layer 58, Cu is employed, for example. The thickness of the seed layer is 10 nm or so, for example.

Next, a photo resist film 60 is formed on the entire surface of one face side (upper side on the paper in FIG. 10A) of the structure 50 where the seed layer 58 is formed, for example, by the spin coating method. The film thickness of the photo resist film 60 is 3 μm or so, for example.

Figure 10A:
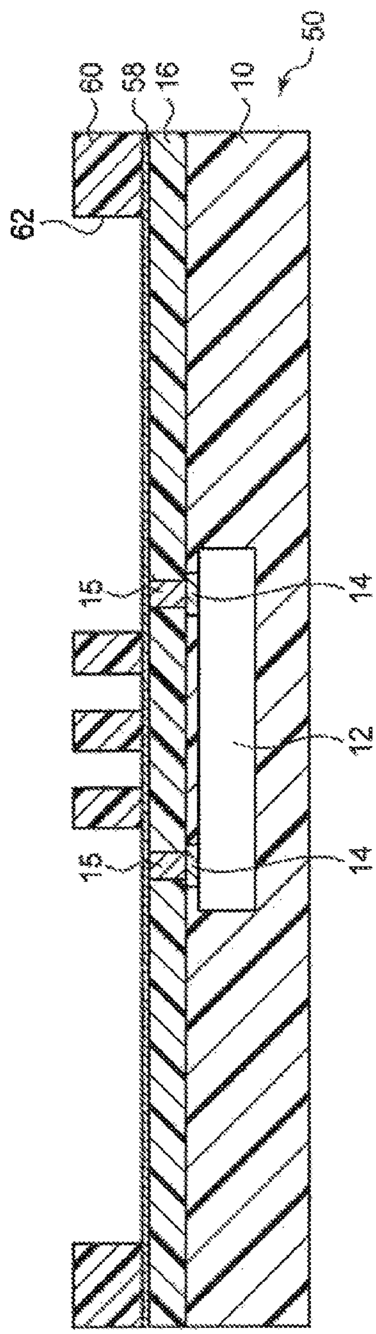
FIGS. 10A and 10B are process cross-sectional views (Part 7) illustrating a method for manufacturing the electronic apparatus according to the first embodiment.

Next, an opening 62 is formed in a photo resist film 60 using the photolithographic technique (see FIG. 10A). Such an opening 62 is for forming the wirings 22.

Next, the photo resist film 60 is altered. Such altering is for facilitating electroplating by hydrophilically improving the surface of the photo resist film 60. At the time of altering the photo resist film 60, $O_2$ plasma irradiation, ultraviolet irradiation, or the like is employed, for example.

Figure 10B:
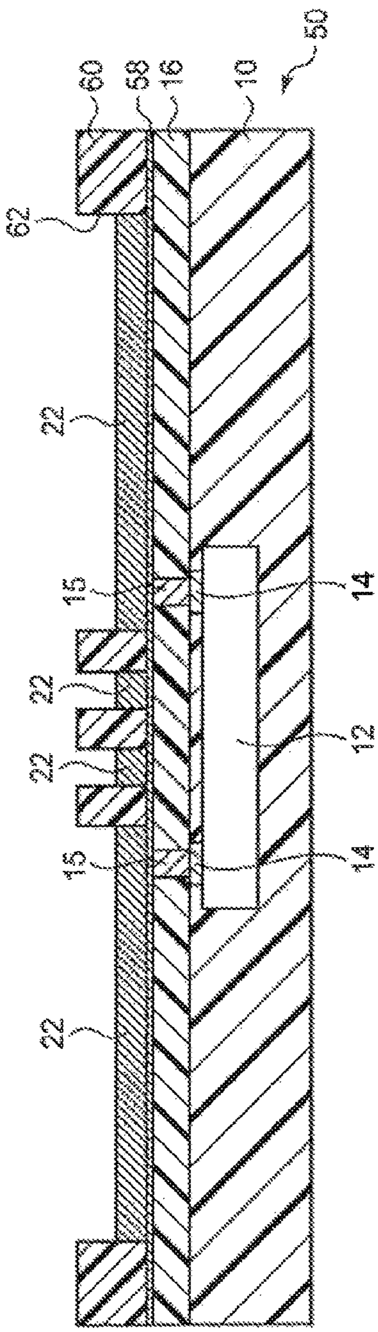

Next, as illustrated in FIG. 10B, for example, according to the electroplating method, the wirings 22 are formed, for example. The height of the wirings 22 is 1 μm to 5 μm or so, for example. As for the materials of the wirings 22, Cu is employed, for example. As for a plating bath used for forming the wirings 22, a copper-sulfate plating bath is employed, for example.

Next, the photo resist film 60 is peeled. As for peeling liquid at the time of peeling the photo resist film 60, NMP or acetone or the like is employed, for example.

Next, the seed layer 58 and adherence layer of a portion exposed around the wirings 22 are subjected to etching removal. As for an etching solution used at the time of subjecting the seed layer 58 to etching, a potassium sulfate solution, ferric chloride solution, ammonium-peroxodisulfate solution, or the like is employed, for example. As for an etching solution used for subjecting the adherence layer to etching, an ammonium fluoride solution or the like is employed, for example.

Note that the etching method of the adherence layer is not restricted to wet etching. For example, the adherence layer may be subjected to etching by dry etching. At the time of subjecting the adherence layer to dry etching, $CF_4$ gas may be employed as etching gas, for example. In this way, the wirings (rewiring layers) 22 electrically connected to the electrodes 14 of the chip 12 via the vias 15 are formed (see FIG. 11A).

Next, for example, according to dry etching, the insulating film 16 in the region not covered by the wirings 22 is subjected to etching. At the time of subjecting the insulating film 16 to dry etching, $O_2$ gas is employed, for example. Thus, the height of the upper face of the insulating film 16 in the region not covered by the wirings 22 is lowered as compared to the height of the insulating film 16 in the region covered by the wirings 22. That is to say, the recessed portions 17 are formed in the insulating film 16 in the region not covered by the wirings 22. The etching amount (depth of etching) of the insulating film 16 is 800 nm or so, for example.

Figure 12A:
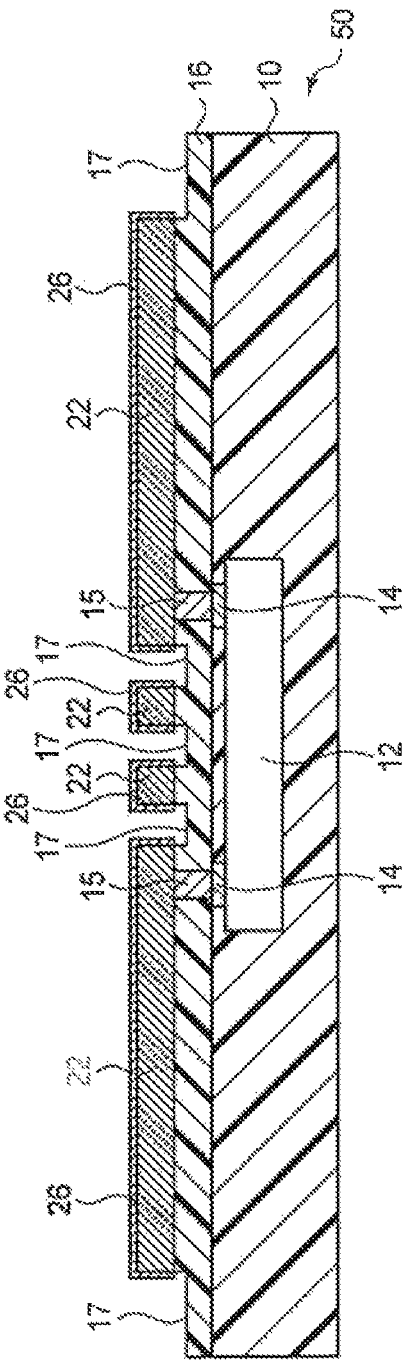
FIGS. 12A and 12B are process cross-sectional views (Part 9) illustrating a method for manufacturing the electronic apparatus according to the first embodiment.
Figure 12B:
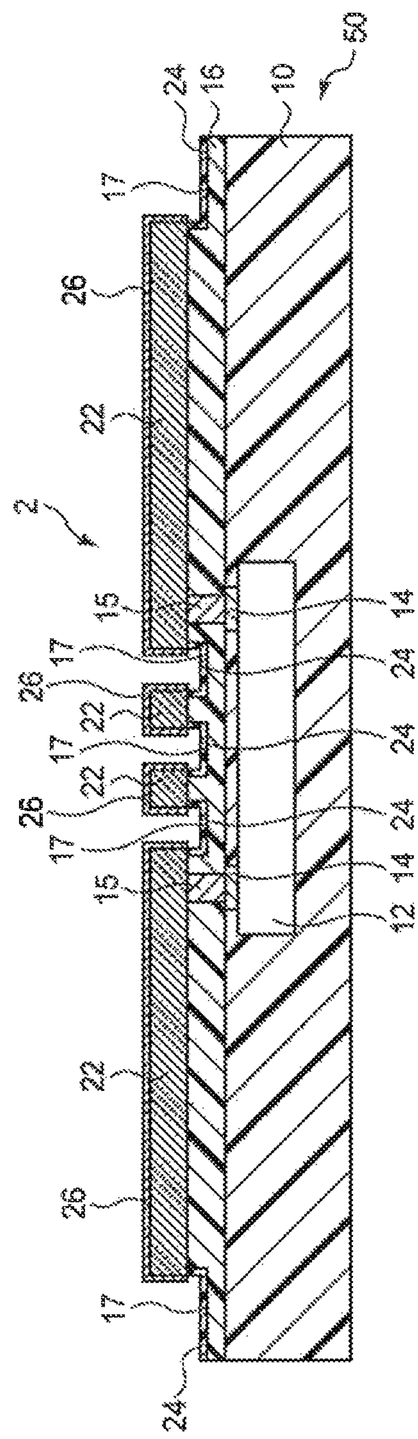

Next, as illustrated in FIG. 12A, for example, according to the electroless plating method, a barrier film 26 is formed on the top face and side face of the wirings 22. The barrier film 26 is for restraining the constituent atoms of the wirings 22 from diffusing into the insulating film 28. As for the material of the barrier film 26, CoWP is employed, for example. The film thickness of the barrier film 26 is 5 nm to 100 nm or so, for example. Now, let us say that the film thickness of the barrier film 26 is 20 nm or so, for example.

Next, the inducing layer 24 for inducing diffusion of the constituent atoms (metal, metal ions) of the wirings 22 is formed on the insulating film 16 in the region not covered by the wirings 22. That is to say, the layer 24 whereby the constituent atoms of the wirings 22 may readily diffuse as compared to the insulating films 16 and 28 is formed on the insulating film 16 in the region not covered by the wirings 22. Such an inducing layer 24 may be formed by roughening the surface portion of the insulating film 16, for example. Roughening of the insulating film 16 may be performed by plasma processing, for example. At the time of performing plasma processing on the insulating film 16, Ar plasma is employed, for example. High-frequency power to be applied to the electrodes at the time of generating Ar plasma is 300 W or so, for example. The time for plasma processing is three minutes or so, for example. The thickness of the inducing layer 24 is 5 nm to 100 nm or so, for example. Now, let us say that the thickness of the inducing layer 24 is 50 nm or so, for example. The inducing layer 24 is consequently formed on the bottom and side portions of the recessed portions 17 formed on the insulating film 16 in the region between the multiple wirings 22.

In this way, the wiring structure 2 according to the present embodiment is formed wherein the inducing layer 24 for inducing diffusion of the constituent atoms of the wirings 22 is formed on the insulating film 16 in the region not covered with the wirings 22.

Next, the insulating film 28 is formed on the entire surface of one face side (upper side on the paper in FIG. 13A) of the structure 50 where the wiring structure 2 is formed, i.e., on the entire surface on the structure 50, for example, by the spin coating method. As for the material of the insulating film 28, an organic resin is employed, for example. As for such an organic resin, a phenol resin is employed, for example. More specifically, as for the material of the insulating film 28, a positive-type photosensitive phenol resin is employed, for example. The film thickness of the insulating film 28 is 5 μm or so, for example.

Figure 13A:
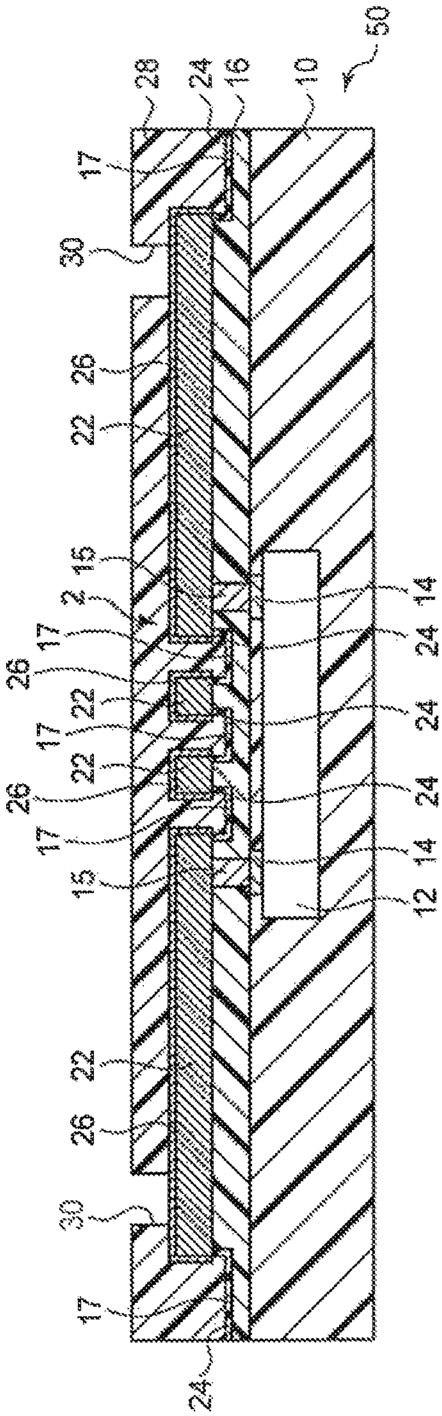
FIGS. 13A and 13B are process cross-sectional views (Part 10) illustrating a method for manufacturing the electronic apparatus according to the first embodiment.
Figure 13B:
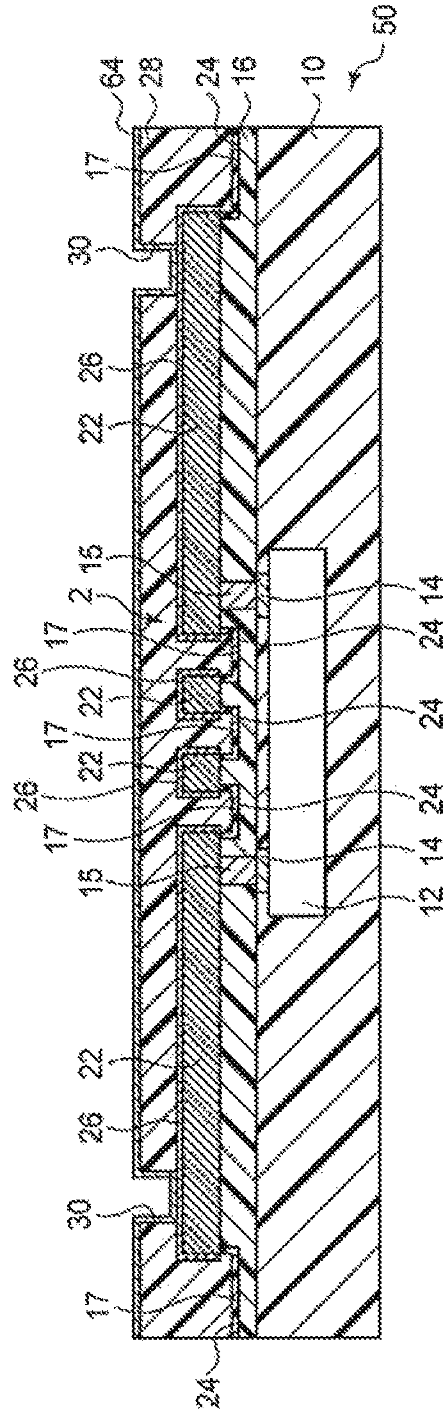

Next, openings 30 extending to the wirings 22 are formed on the insulating film 28 using the photolithographic technique (see FIG. 13A). The openings 30 are for embedding the vias (electroconductive plugs) 32.

Next, an adherence layer (not illustrated) is formed on the entire surface of one face side (upper side on the paper in FIG. 13A) of the structure 50 where the insulating film 28 is formed, i.e., the entire surface on the structure 50, for example, by the sputtering method. As for the material of the adherence layer, Ti is employed, for example. The thickness of the adherence layer is 20 nm or so, for example.

Next, a seed layer 64 is formed on the entire surface of one face side (upper side on the paper in FIG. 13B) of the structure 50 where the adherence layer is formed, for example, by the sputtering method. As for the material of the seed layer 64, Cu is employed, for example. The thickness of the seed layer 64 is 100 nm or so, for example.

Next, a photo resist film 66 is formed on the entire surface of one face side (upper side on the paper in FIG. 14A) of the structure 50, i.e., the entire surface of the structure 50, for example, by the spin coating method. The film thickness of the photo resist film 66 is 8 μm or so, for example.

Figure 14A:
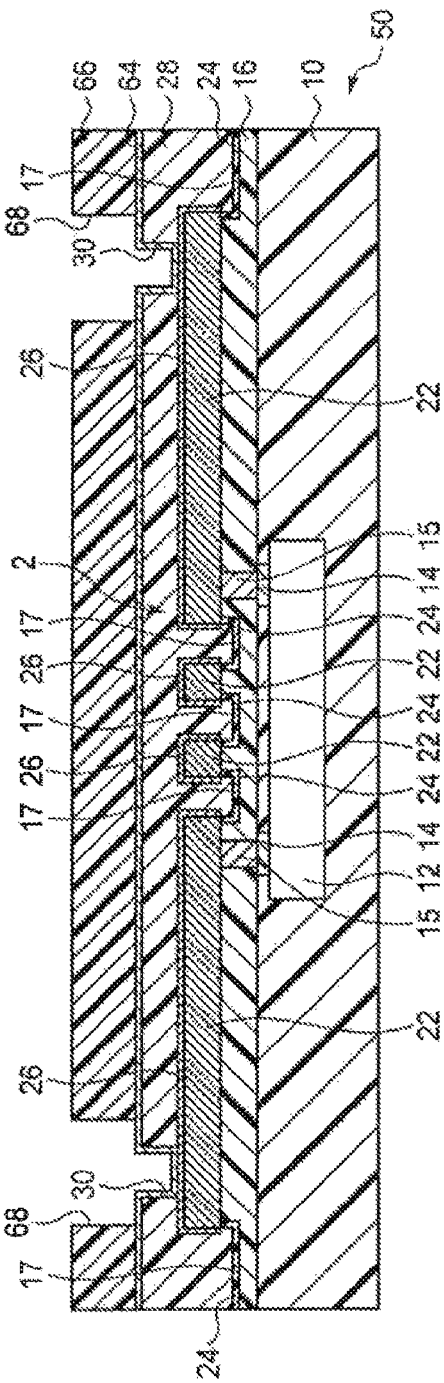
FIGS. 14A and 14B are process cross-sectional views (Part 11) illustrating a method for manufacturing the electronic apparatus according to the first embodiment.
Figure 14B:
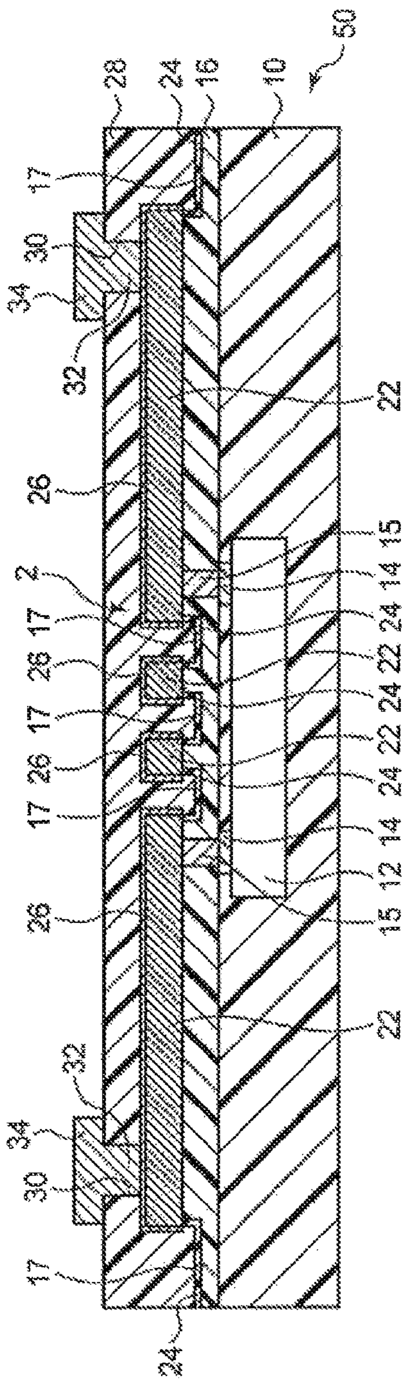
Figure 15A:
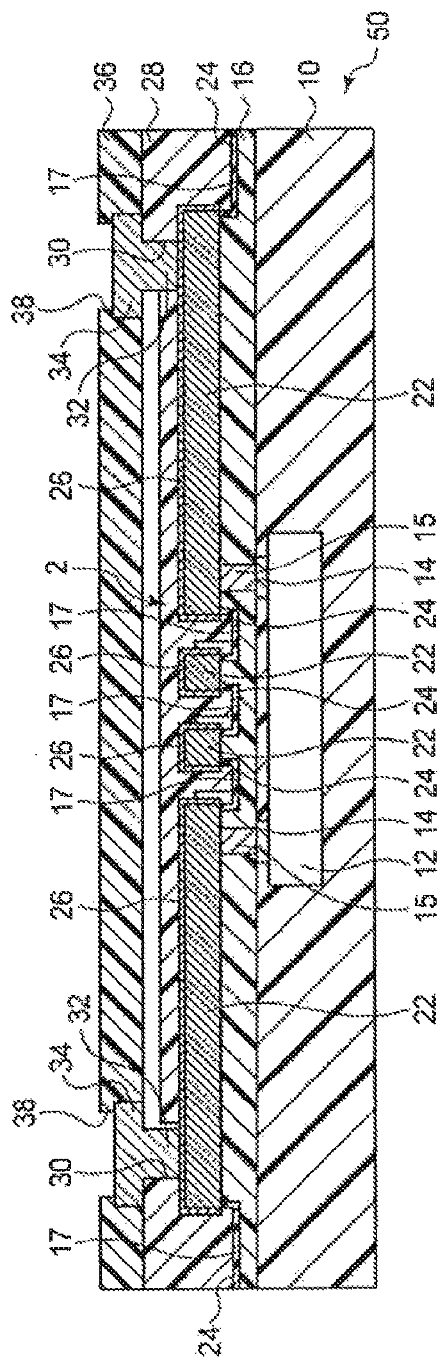
FIGS. 15A and 15B are process cross-sectional views (Part 12) illustrating a method for manufacturing the electronic apparatus according to the first embodiment.
Figure 15B:
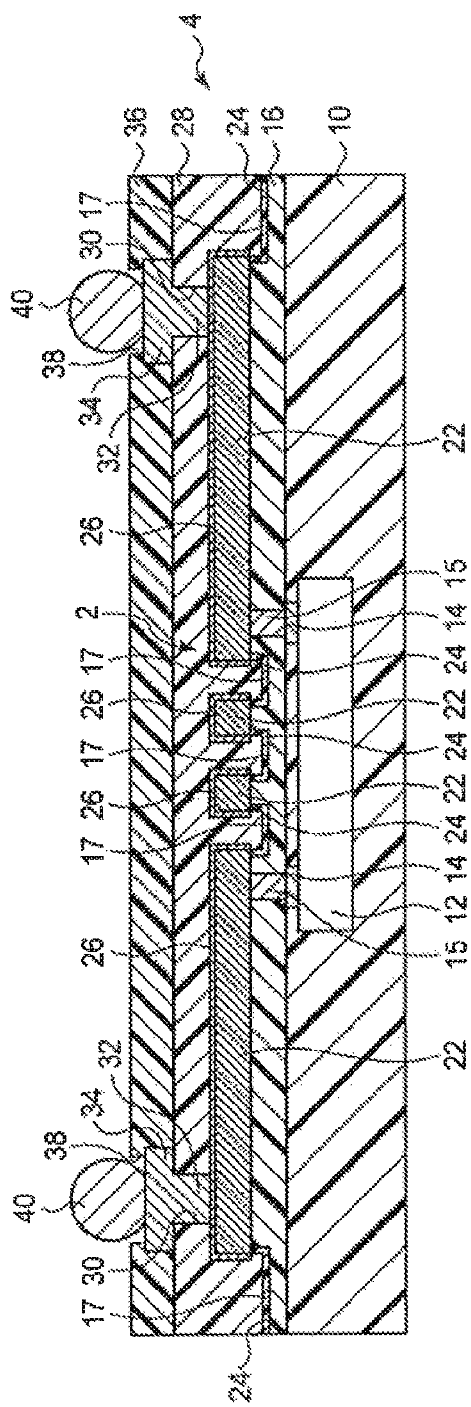

Next, openings 68 are formed in the photo resist film 66 using the photolithographic technique (see FIG. 14A). Such openings 68 are for forming the electrode pads 34.

Next, the photo resist film 66 is altered. Such altering is for facilitating electroplating by hydrophilically improving the surface of the photo resist film 66. At the time of altering the photo resist film 66, $O_2$ plasma irradiation, ultraviolet irradiation, or the like is employed, for example.

Next, the vias 32 and electro pads 34 are formed within the openings 68 of the photo resist film 66, for example, by the electroplating method. The vias 32 and electro pads 34 are integrally formed. As for the materials of the vias 32 and electro pads 34, Cu is employed, for example.

Next, the photo resist film 66 is peeled. As for peeling liquid at the time of peeling the photo resist film 66, NMP or acetone or the like is employed, for example.

Next, the seed layer 64 and adherence layer of a portion exposed around the electrode pads 34 are subjected to etching removal. As for an etching solution used at the time of subjecting the seed layer 64 to etching, a potassium sulfate solution, ferric chloride solution, ammonium-peroxodisulfate solution, or the like is employed, for example. As for an etching solution used for subjecting the adherence layer to etching, an ammonium fluoride solution or the like is employed, for example.

Note that the etching method of the adherence layer is not restricted to wet etching. For example, the adherence layer may be subjected to etching by dry etching. At the time of subjecting the adherence layer to dry etching, $CF_4$ gas may be employed as etching gas, for example. In this way, the electrode pads 34 electrically connected to the wirings 22 via the vias 32 are formed (see FIG. 14B).

Next, a laminated film (not illustrated) made up of a Ni film and an Au film is formed on the surfaces of the electrode pads 34, for example, by the electroless plating method. The film thickness of the Ni film is 20 nm to 1 μm or so, for example. Now, the film thickness of the Ni film is 200 nm or so. The film thickness of the Au film is 200 nm to 1 μm or so, for example. Now, let us say that the film thickness of the Au film is 300 nm or so.

Next, the solder resist film 36 is formed on the entire surface of one face side (upper side on the paper in FIG. 15A) of the structure 50, i.e., the entire surface on the structure 50, for example, by the spin coating method. The film thickness of the solder resist film 36 is 10 μm to 30 μm, for example.

Next, openings 38 extending to the electrode pads 34 are formed in the solder resist film 36 using the photolithographic technique.

Next, the solder bumps (solder balls) 40 are formed on the electrode pads 34 exposed within the openings 38. The solder bumps 40 are electrically connected to the electrodes 14 of the chip 12 via the electrode pads 34 and wirings 22, respectively. In this way, the electronic apparatus (wafer level package) 4 according to the present embodiment having the wiring structure 2 is formed (see FIG. 15B).

Figure 16:
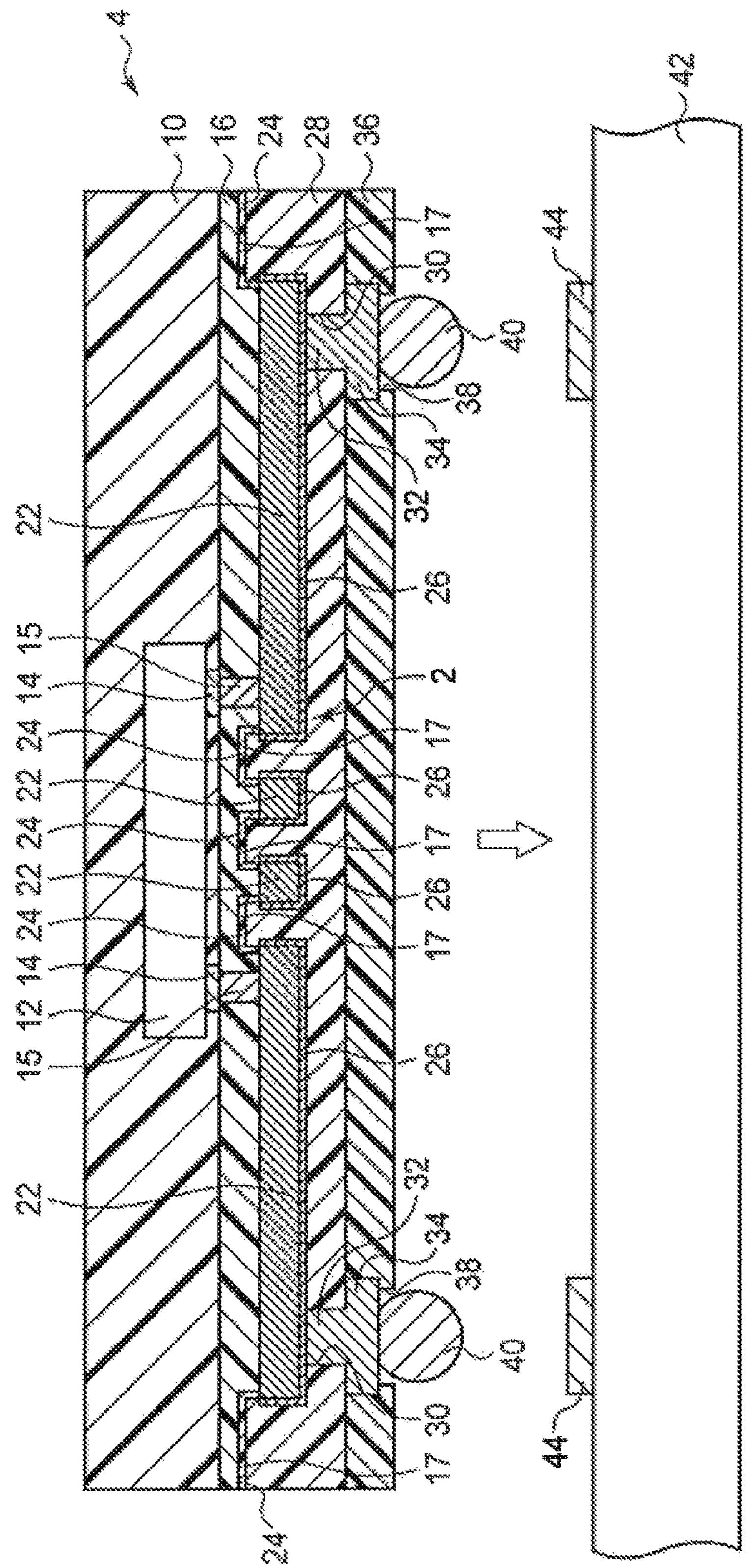
FIG. 16 is a process cross-sectional view (Part 13) illustrating a method for manufacturing the electronic apparatus according to the first embodiment.

The electronic apparatus 4 according to the present embodiment is mounted on the circuit substrate 42, for example. At the time of mounting the electronic apparatus 4 according to the present embodiment on the circuit substrate 42, first, as illustrated in FIG. 16, the electronic apparatus 4 according to the present embodiment is disposed on the circuit substrate 42. As for the circuit substrate 42, a resin substrate or ceramics substrate or the like is employed, for example. The electrodes 44 for connecting to the bumps 40 of the electronic apparatus 4 are formed on the surface of the circuit substrate 42. As for the materials of the electrodes 44, Au, Cu, or the like is employed, for example. The electrodes 44 are electrically connected to wirings (not illustrated) formed on the circuit substrate 42. At the time of disposing the electronic apparatus 4 on the circuit substrate 42, the electronic apparatus 4 is disposed on the circuit substrate 42 so as to mutually connect the bumps 40 of the electronic apparatus 4, and the electrodes 44 of the circuit substrate 42. In this way, the electronic apparatus 4 according to the present embodiment is disposed on the circuit substrate 42.

Figure 17:
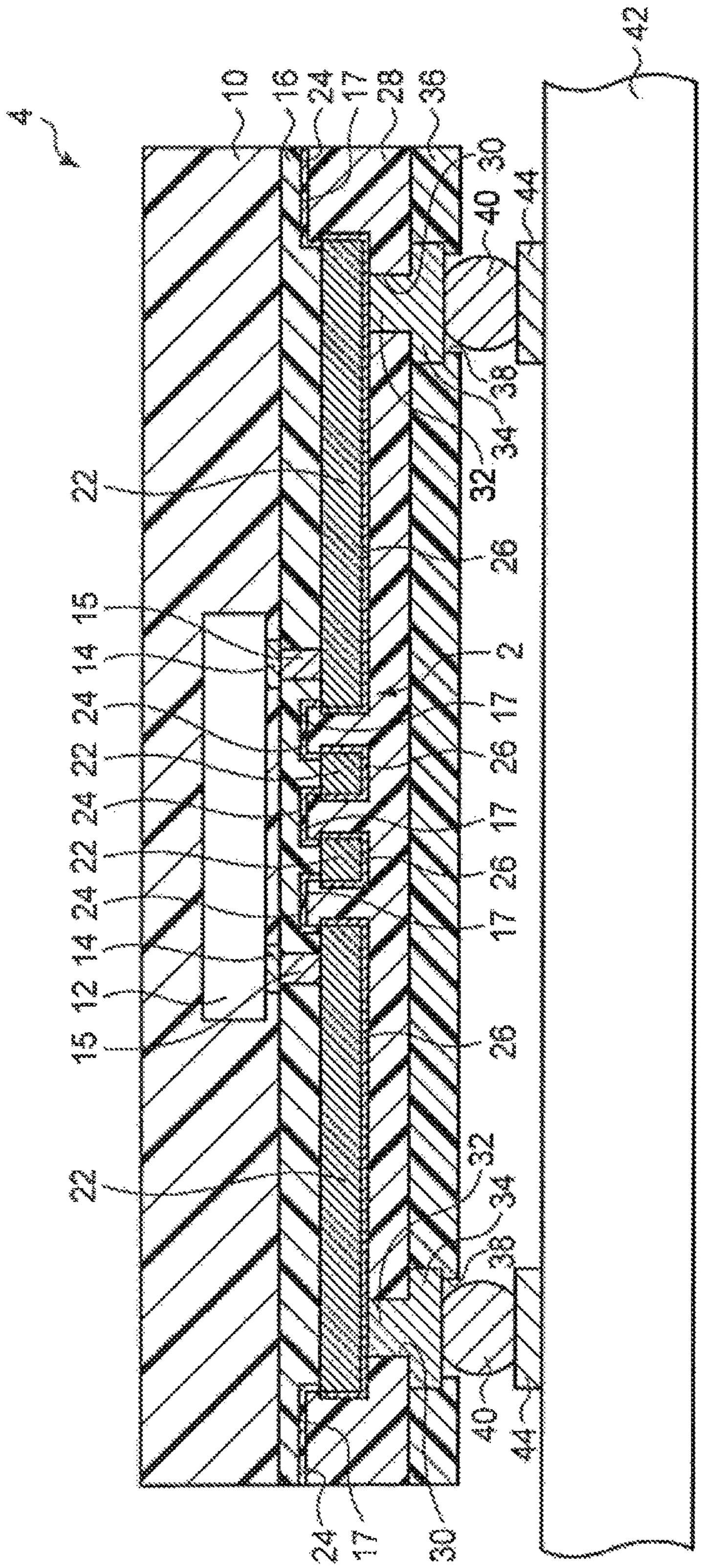
FIG. 17 is a process cross-sectional view (Part 14) illustrating a method for manufacturing the electronic apparatus according to the first embodiment.

Next, the electrode pads 34 on the electronic apparatus 4 side, and the electrodes 44 on the circuit substrate 42 side are jointed using the solder bumps 40 by performing thermal treatment (reflow) (see FIG. 17). In this way, the electronic apparatus 4 according to the present embodiment is disposed on the circuit substrate 42.

As described above, according to the present embodiment, the inducing layer 24 for inducing diffusion of the constituent atoms (metal ions) of the wirings 22 is formed on the insulating film 16 in the region between the multiple wirings 22. Therefore, according to the present embodiment, migration does not intensely advance at a partial portion, and migration gradually advances in an overall and even manner. Therefore, according to the present embodiment, time until insulation breakdown occurs may sufficiently be prolonged, whereby the wiring structure 2 having high reliability, and the electronic apparatus 4 having the wiring structure 2 thereof may be provided.

Moreover, according to the present embodiment, the recessed portions 17 are formed in the insulating film 16 in the region between the multiple wirings 22, and the inducing layer 24 is formed on the bottom and side portions of the recessed portions 17. Therefore, according to the present embodiment, the advancing route of migration is bypassed by an amount equivalent to the depths of the recessed portions 17, and time until insulation breakdown occurs may further be prolonged.

(Evaluation Results)

Next, the evaluation results of the wiring structure according to the present embodiment will be described.

Figure 18:
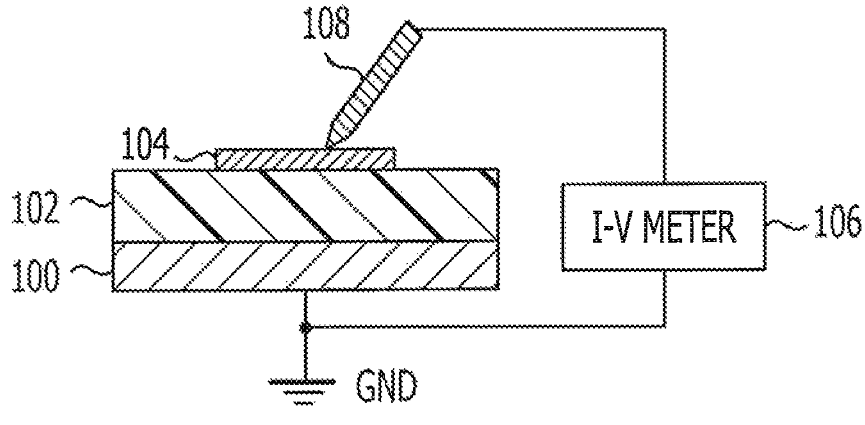
FIG. 18 is a diagram illustrating an evaluating circuit of insulation properties.
Figure 19:
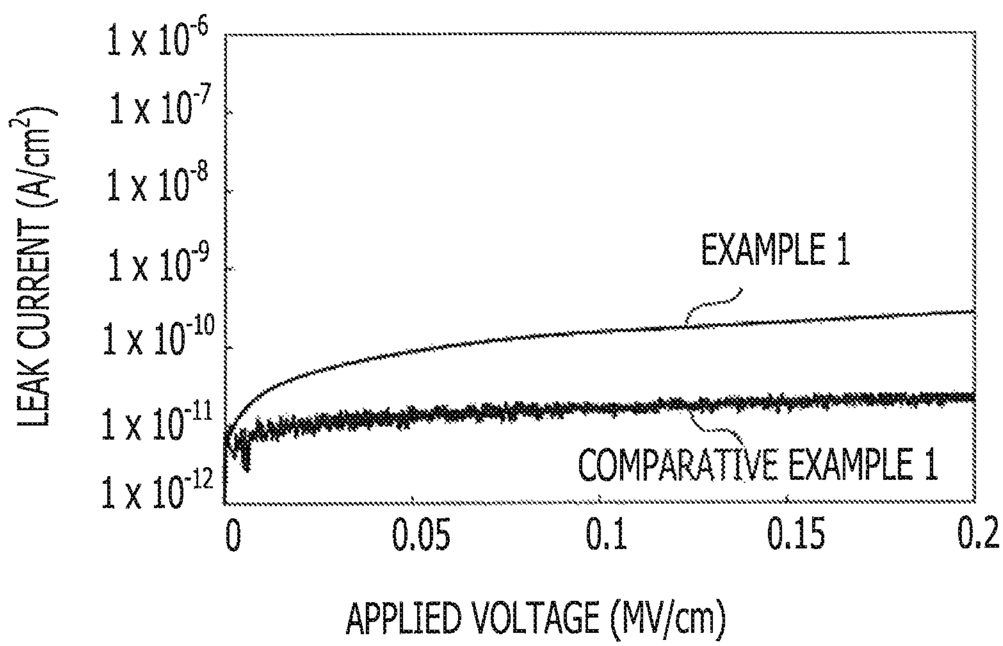
FIG. 19 is a graph (Part 1) illustrating measurement results of insulation properties.

FIG. 18 is a diagram illustrating an evaluation circuit for insulation properties. FIG. 19 is a graph illustrating measurement results for insulation properties. The horizontal axis in FIG. 19 indicates applied voltage per increment length, and the vertical axis in FIG. 19 indicates leak current.

As illustrated in FIG. 18, an insulating film 102 is formed on a silicon substrate 100 having low resistance. Electrodes 104 of Au are formed on the insulating film 102. One of the input terminals of an I-V meter 106, and the silicon substrate 100 are electrically connected to the ground. The other input terminal of the I-V meter 106 is electrically connected to the electrodes 104 via a probe needle 108.

In the event of having measured relationship between the applied voltage and leak current using the evaluation circuit as illustrated in FIG. 18, measurement results as illustrated in FIG. 19 were obtained.

Example 1 illustrated in FIG. 19 corresponds to the present embodiment. With Example 1, the insulating film 102 of a positive-type photosensitive phenol resin was formed on the silicon substrate 100, the insulating film 102 was roughened by performing plasma processing, and the electrodes 104 were formed on the roughened insulating film 102.

With Comparative Example 1, the insulating film 102 of a positive-type photosensitive phenol resin were formed on the silicon substrate 100, and ultraviolet irradiation was performed on this insulating film 102.

As may be understood from FIG. 19, with Example 1, leak current was greater as compared to Comparative Example 1. Thus, according to Example 1, it may be seen that the insulating film 102 with insulation properties being relatively low may be obtained.

The roughened insulating film 102 according to the Example 1 corresponds to the inducing layer 24 according to the present embodiment (see FIG. 1) formed by roughening the surface portion of the insulating film 16 (see FIG. 1). With an insulating film with low insulation properties, the constituent atoms (metal ions) of the wirings 22 (see FIG. 1) are readily diffused. Therefore, according to the present embodiment, migration does not intensely advance at a partial portion, and migration gradually advances in an overall and even manner. Therefore, according to the present embodiment, time until insulation breakdown occurs may sufficiently be prolonged, whereby the wiring structure 2 having high reliability, and the electronic apparatus 4 having the wiring structure 2 thereof may be provided.

Next, HAST test results of the wiring structure according to the present embodiment will be described.

The temperature at the time of a HAST test was set to 130° C., and the humidity at the time of the HAST test was set to 85%. The bias voltage has been set to 3.5 V. With the HAST test, a case where insulating resistance equal to or greater than $1\times10^{6}\Omega$ was held for 150 hours or more was determined to be OK.

As Example 2, a HAST test was performed on the wiring structure 2 according to the present embodiment, i.e., the wiring structure 2 where the inducing layer 24 had been formed by roughening the surface portion of the insulating film 16. With Example 2, 95% of test samples were determined to be OK.

On the other hand, with Comparative Example 2 wherein a HAST test was performed on the wiring structure where ultraviolet processing had been performed on the insulating film 16, the number of test samples determined to be OK were a mere 5%. In this way, according to the present embodiment, it may be seen that the wiring structure 2 with high reliability may be obtained.

(Modification (Part 1))

Next, description will be made regarding a wiring structure according to a modification (Part 1) of the present embodiment and a manufacturing method thereof, and an electronic apparatus employing the wiring structure thereof and a manufacturing method thereof, with reference to FIG. 20 through FIG. 22B.

Figure 20:
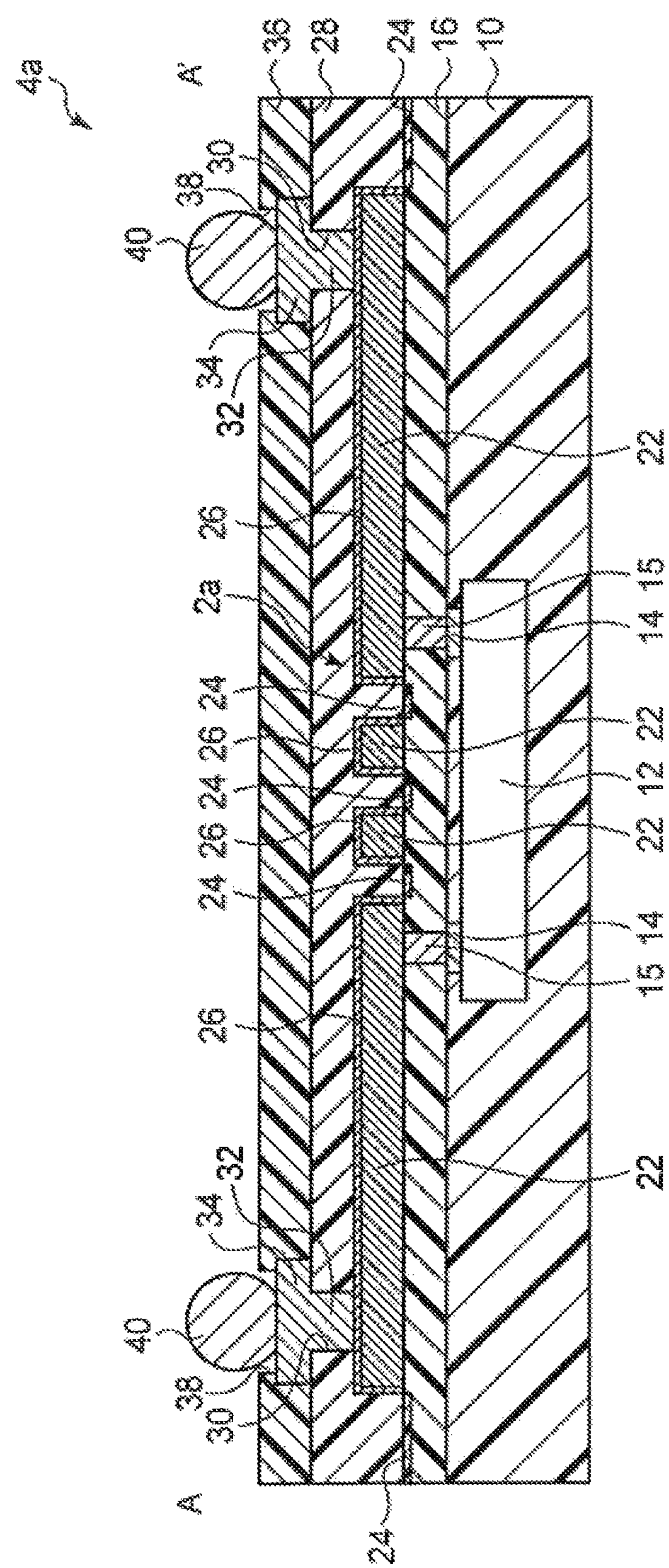
FIG. 20 is a cross-sectional view illustrating an electronic apparatus according to a modification (Part 1) of the first embodiment.

First, a wiring structure according to the present modification and an electronic apparatus having the wiring structure thereof will be described with reference to FIG. 20. FIG. 20 is a cross-sectional view illustrating the electronic apparatus according to the present modification.

The electronic apparatus according to the present modification is an electronic apparatus wherein the recessed portions 17 are not formed in the insulating film 16 in the region between the multiple wirings 22.

As illustrated in FIG. 20, with the present modification, the recessed portions 17 (see FIG. 1) are not formed in the insulating film 16 in the region between the multiple wirings 22. Therefore, the height of the surface of the insulating film 16 in the region between the multiple wirings 22 is not set lower than the height of the surface of the insulating film 16 in the region covered with the wirings 22.

The inducing layer 24 for inducing diffusion of the constituent atoms of the wirings 22 is formed on the insulating film 16 in the region between the multiple wirings 22. The inducing layer 24 is formed by roughening the surface portion of the insulating film 16.

In this way, an electronic apparatus 4*a* according to the present modification is formed wherein the inducing layer 24 for inducing diffusion of the constituent atoms of the wirings 22 is formed on the insulating film 16 in the region between the multiple wirings 22.

As described above, an arrangement may be made wherein the recessed portions 17 are not formed in the insulating film 16 in the region between the multiple wirings 22.

With the present modification as well, the inducing layer 24 for inducing diffusion of the constituent atoms of the wirings 22 is formed on the insulating film 16 in the region between the multiple wirings 22, and accordingly, migration does not intensely advance at a partial portion, and migration gradually advances in an overall and even manner.

Next, a method for manufacturing the electronic apparatus according to the present modification will be described with reference to FIGS. 21A through 22B. FIGS. 21A through 22B are process cross-sectional views illustrating the method for manufacturing the electronic apparatus according to the present modification.

Figure 21A:
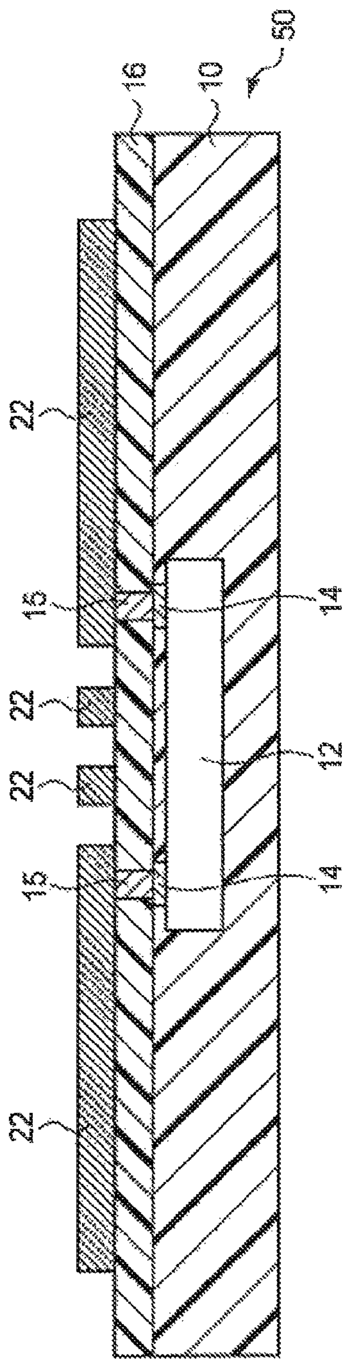
FIGS. 21A and 21B are process cross-sectional views (Part 1) illustrating a method for manufacturing the electronic apparatus according to the modification (Part 1) of the first embodiment.

First, from a process for forming the adhesive layer 48 on the supporting substrate 46 to a process for subjecting the seed layer 58 and so forth exposed around the wirings 22 to etching are the same as with the method for manufacturing the electronic apparatus according to the first embodiment illustrated in FIGS. 4A through 11A, and accordingly, description thereof will be omitted (see FIG. 21A).

Figure 21B:
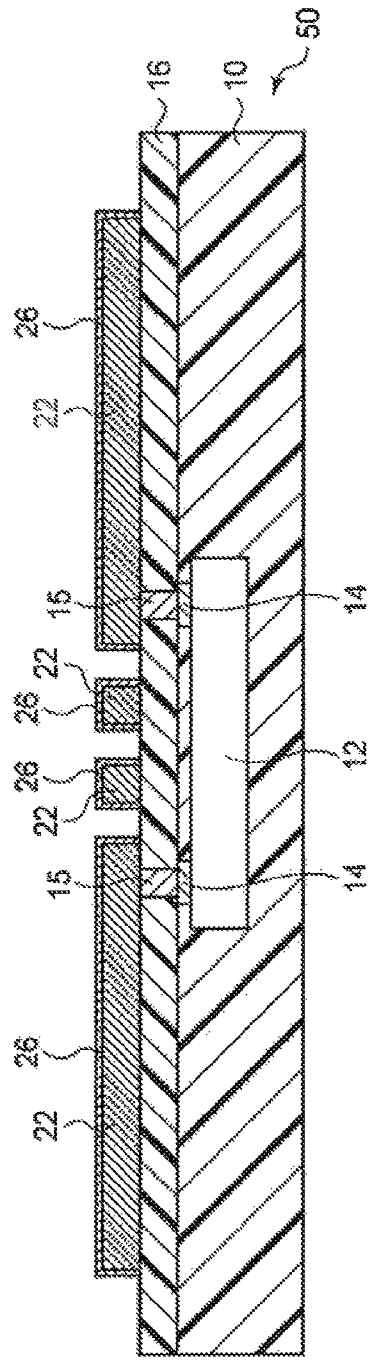

Next, in the same way as with the method for manufacturing the electronic apparatus according to the first embodiment described above with reference to FIG. 12A, the barrier film 26 is formed on the upper and side faces of the wirings 22 (see FIG. 21B).

Figure 22A:
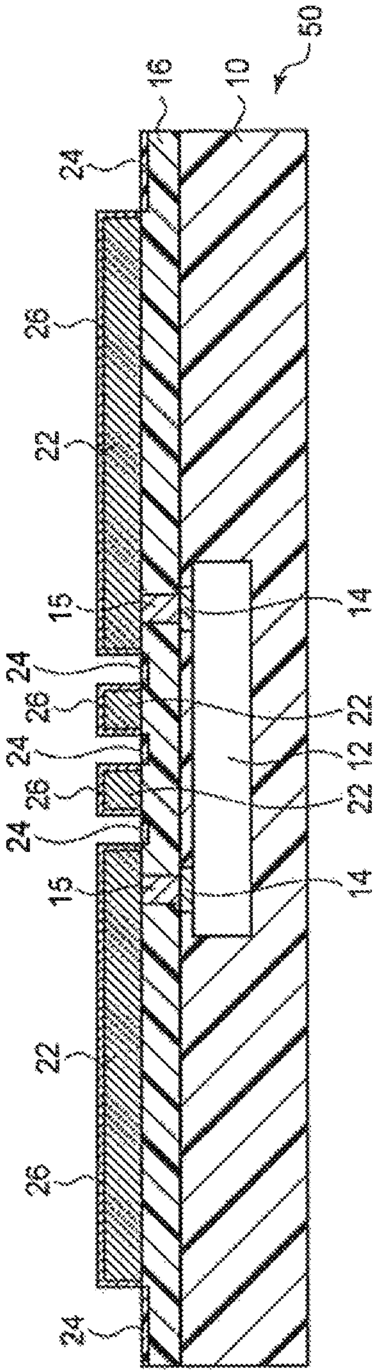
FIGS. 22A and 22B are process cross-sectional views (Part 2) illustrating the method for manufacturing the electronic apparatus according to the modification (Part 1) of the first embodiment.

Next, in the same way as with the method for manufacturing the electronic apparatus according to the first embodiment described above with reference to FIG. 12B, the inducing layer 24 for inducing diffusion of the constituent atoms of the wirings 22 is formed on the insulating film 16 in the region not covered with the wirings 22 (see FIG. 22A).

The method for manufacturing the electronic apparatus according to the present modification after this is the same as the method for manufacturing the electronic apparatus according to the first embodiment described above with reference to FIGS. 13A through 15B, and accordingly, description thereof will be omitted.

Figure 22B:
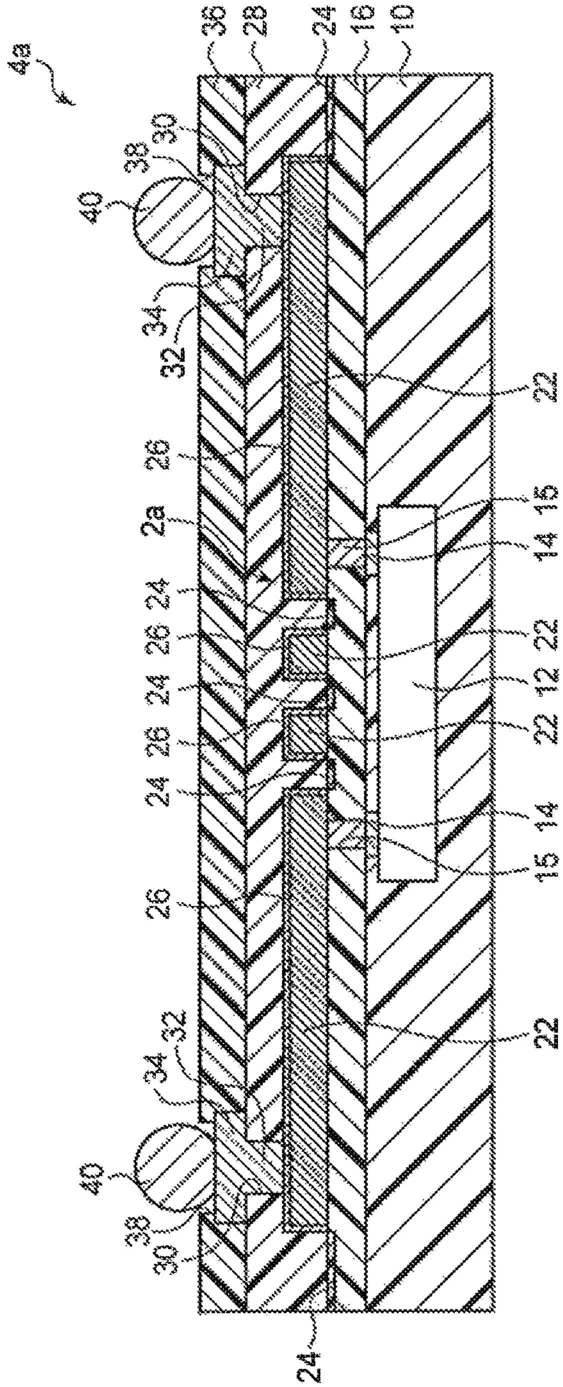

In this way, the electronic apparatus (wafer level package) 4*a* according to the present modification having the wiring structure 2*a* is formed wherein the inducing layer 24 for inducing diffusion of the constituent atoms of the wirings 22 is formed on the insulating film 16 in the region not covered with the wirings 22 (see FIG. 22B).

The electronic apparatus 4*a* according to the present modification thus formed may be mounted on the circuit substrate 42 in the same way as with the method for manufacturing the electronic apparatus according to the first embodiment described with reference to FIGS. 16 and 17.

Next, HAST test results of the wiring structure according to the present modification will be described.

Conditions for the HAST test were set in the same way as the conditions for the HAST test as to the wiring structure according to the first embodiment described above.

As Example 3 a HAST test was performed on the wiring structure 2*a* according to the present modification. With Example 3, the inducing layer 24 was formed by roughening the surface portion of the insulating film 16 without forming the recessed portions 17 in the insulating film 16 in the region between the multiple wirings 22. With the Example 3, 50% of test samples were determined to be OK.

On the other hand, as Comparative Example 3 a HAST test was performed on the wiring structure where ultraviolet processing had been performed on the insulating film 16. With Comparative Example 3, ultraviolet processing was performed on the surface portion of the insulating film 16 without forming the recessed portions 17 in the insulating film 16 in the region between the multiple wirings 22. With Comparative Example 3, the number of test samples determined to be OK was 0%.

Thus, it may be seen that a certain level of reliability may be had with the present modification as well. However, in the light of obtaining sufficient high reliability, it is desirable to form the recessed portions 17 in the insulating film 16 in the region between the multiple wirings 22.

(Modification (Part 2))

Next, description will be made regarding a wiring structure according to a modification (Part 2) of the present embodiment and a manufacturing method thereof, and an electronic apparatus employing the wiring structure thereof and a manufacturing method thereof, with reference to FIGS. 23 through 25.

First, a wiring structure according to the present modification and an electronic apparatus having the wiring structure thereof will be described with reference to FIG. 23. FIG. 23 is a cross-sectional view illustrating the electronic apparatus according to the present modification.

The electronic apparatus according to the present modification is an electronic apparatus wherein the recessed portions 17 are not formed in the insulating film 16 in the region between the multiple wirings 22, and also the barrier film 26 for covering the upper and side faces of the wirings 22 is not formed.

Figure 23:
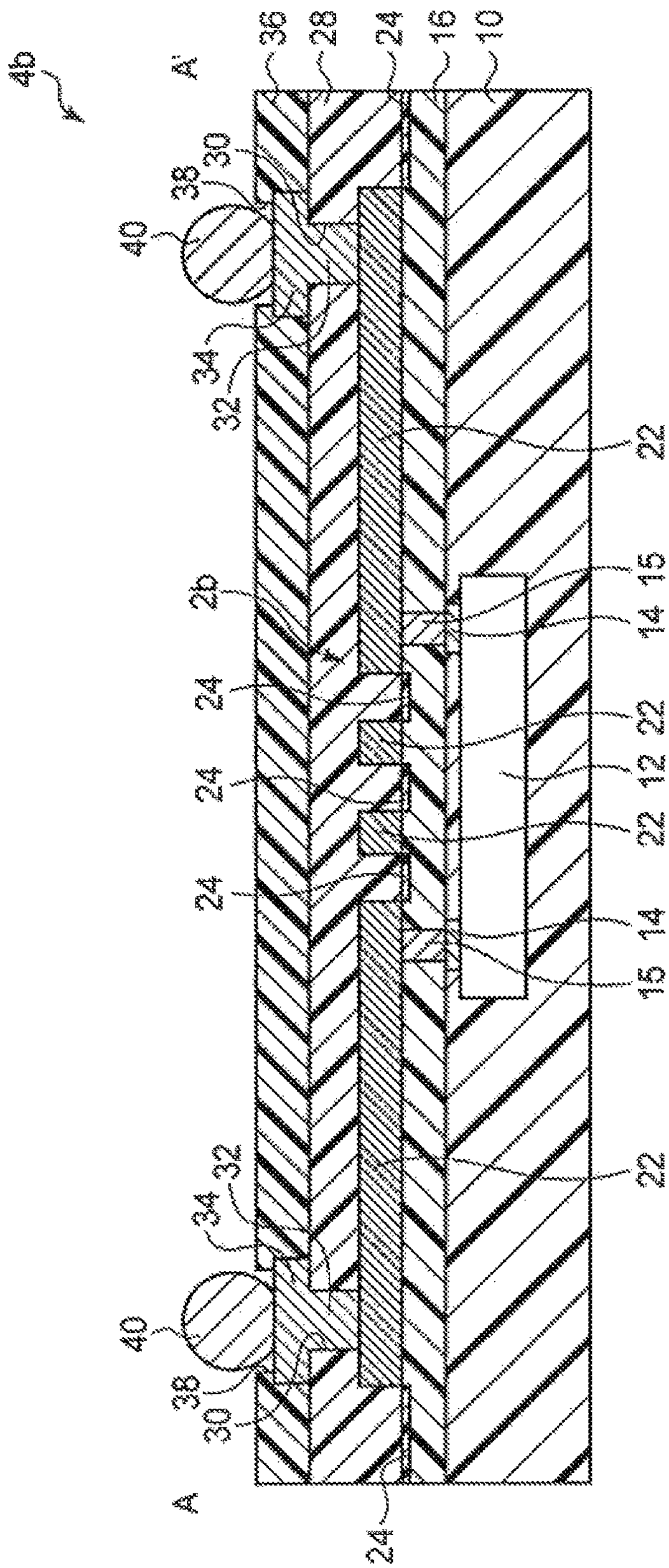
FIG. 23 is a cross-sectional view illustrating an electronic apparatus according to a modification (Part 2) of the first embodiment.
Figure 24A:
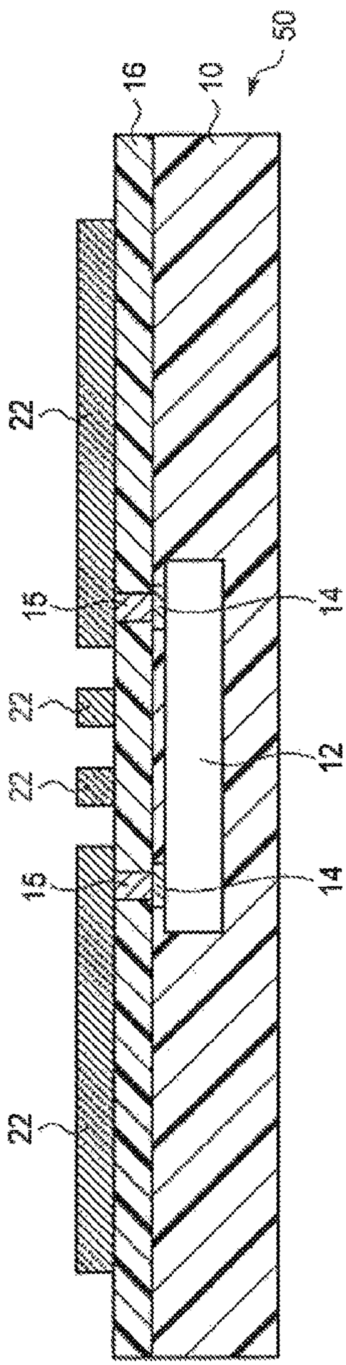
FIGS. 24A and 24B are process cross-sectional views (Part 1) illustrating a method for manufacturing the electronic apparatus according to the modification (Part 2) of the first embodiment.

As illustrated in FIG. 23, with the present modification, the recessed portions 17 (see FIG. 1) are not formed in the insulating film 16 in the region between the multiple wirings 22.

The inducing layer 24 for inducing diffusion of the constituent atoms of the wirings 22 is formed on the insulating film 16 in the region between the multiple wirings 22. The inducing layer 24 is formed by roughening the surface portion of the insulating film 16.

With the present modification, the barrier film 26 (see FIG. 1) for covering the upper and side faces of the wirings 22 is not formed. In this way, an electronic apparatus 4*b* having a wiring structure 2*b* is formed wherein the inducing layer 24 for inducing diffusion of the constituent atoms of the wirings 22 is formed on the insulating film 16 in the region between the multiple wirings 22.

As described above, an arrangement may be made in which the recessed portions 17 are not formed in the insulating film 16 in the region between the multiple wirings 22, and also an arrangement may be made in which the barrier film 26 for covering the upper and side faces of the wirings 22 is not formed.

With the present modification as well, the inducing layer 24 is formed on the insulating film 16 in the region between the multiple wirings 22, and accordingly, migration does not intensely advance at a partial portion, and migration gradually advances in an overall and even manner. Therefore, with the present modification as well, time until insulation breakdown occurs may sufficiently be prolonged, which may contribute to improvement in reliability.

Next, a method for manufacturing the electronic apparatus according to the present modification will be described with reference to FIGS. 24A through 25. FIGS. 24A through 25 are process cross-sectional views illustrating the method for manufacturing the electronic apparatus according to the present modification.

First, from a process for forming the adhesive layer 48 on the supporting substrate 46 to a process for subjecting the seed layer 58 and so forth exposed around the wirings 22 to etching are the same as with the method for manufacturing the electronic apparatus according to the first embodiment illustrated in FIGS. 4A through 11A, and accordingly, description thereof will be omitted (see FIG. 24A).

Figure 24B:
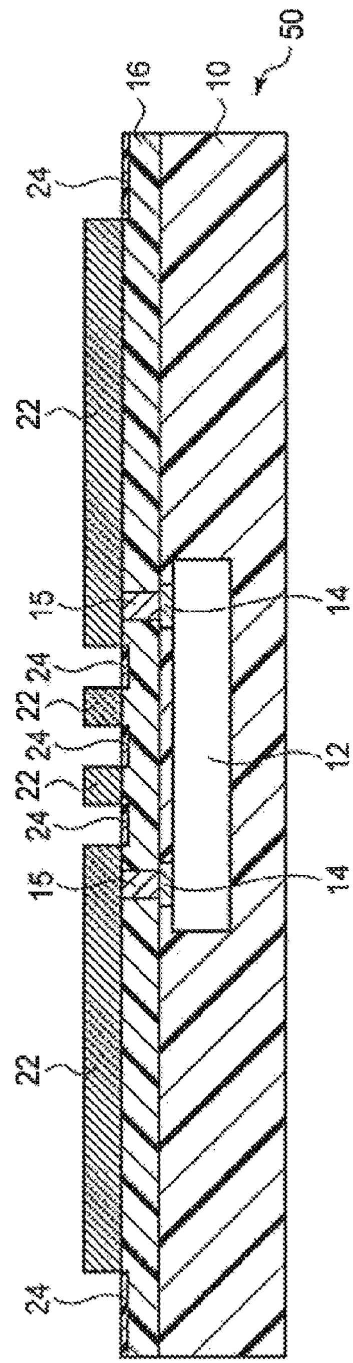
Figure 25:
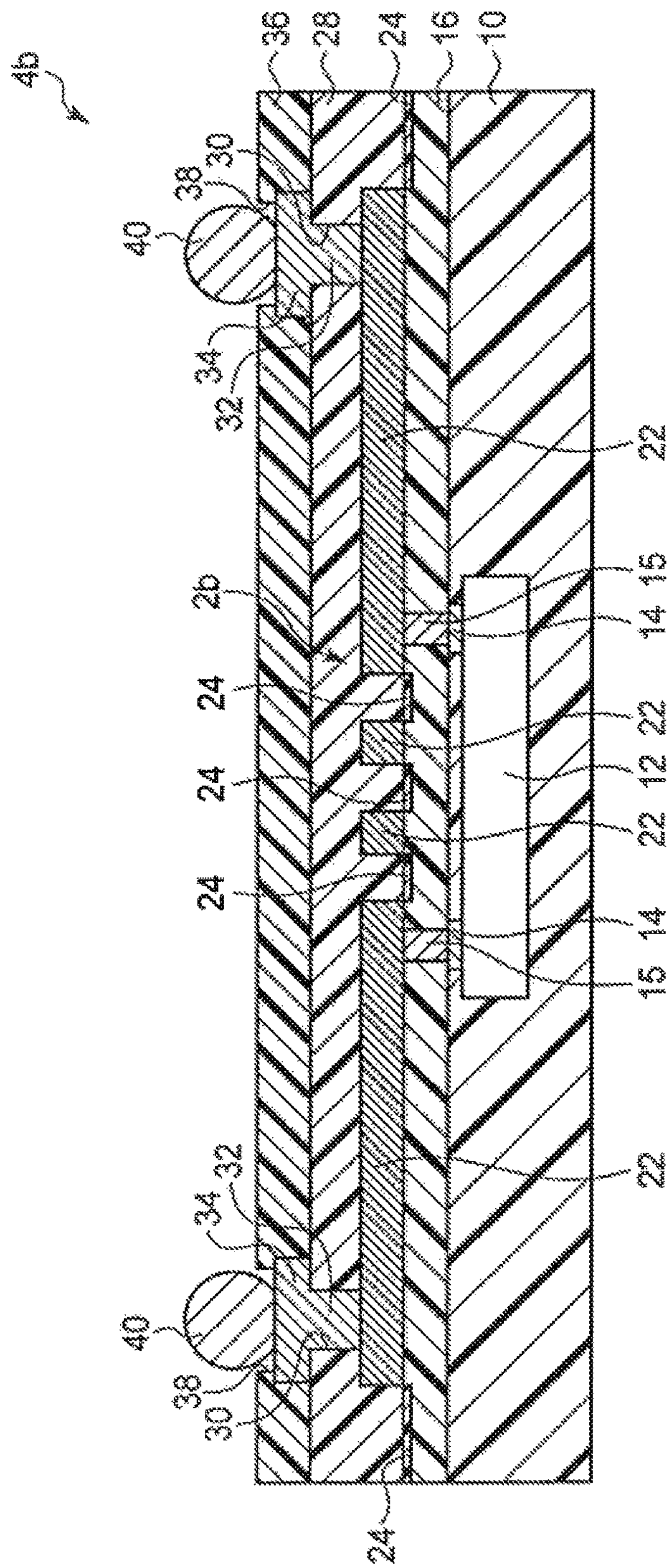
FIG. 25 is a process cross-sectional view (Part 2) illustrating the method for manufacturing the electronic apparatus according to the modification (Part 2) of the first embodiment.

Next, in the same way as with the method for manufacturing the electronic apparatus described above with reference to FIG. 12B, the inducing layer 24 for inducing diffusion of the constituent atoms of the wirings 22 is formed on the insulating film 16 in the region not covered with the wirings 22 (see FIG. 24B).

The method for manufacturing the electronic apparatus according to the present modification after this is the same as the method for manufacturing the electronic apparatus according to the first embodiment described above with reference to FIGS. 13A through 15B, and accordingly, description thereof will be omitted. In this way, the electronic apparatus 4*b* according to the present modification having the wiring structure 2*b* is formed wherein the inducing layer 24 for inducing diffusion of the constituent atoms of the wirings 22 is formed on the insulating film 16 in the region not covered with the wirings 22 (see FIG. 25).

The electronic apparatus 4*b* according to the present modification thus formed may be mounted on the circuit substrate 42 in the same way as with the method for manufacturing the electronic apparatus according to the first embodiment described with reference to FIGS. 16 and 17.

Next, HAST test results of the wiring structure according to the present modification will be described.

Conditions for the HAST test according to the present modification were set in the same way as the conditions for the HAST test as to the wiring structure according to the first embodiment described above.

As Example 4 a HAST test was performed on the wiring structure according to the present modification. With Example 4, the inducing layer 24 was formed by roughening the surface portion of the insulating film 16 without forming the recessed portions 17 in the insulating film 16 in the region between the multiple wirings 22, and without forming the barrier film 26 on the upper and side faces of the wirings 22. With Example 4, 15% of test samples were determined to be OK.

On the other hand, as Comparative Example 4 a HAST test was performed on the wiring structure where ultraviolet processing had been performed on the insulating film 16. With Comparative Example 4, ultraviolet processing was performed on the surface portion of the insulating film 16 without forming the recessed portions 17 in the insulating film 16 in the region between the multiple wirings 22, and without forming the barrier film 26 for covering the upper and side faces of the wirings 22. With Comparative Example 4, the number of test samples determined to be OK was 0%.

Thus, it may be seen that the present modification also may contribute to improvement in reliability on some level. However, in the light of obtaining sufficient reliability, it is desirable to form the recessed portions 17 in the insulating film 16 in the region between the multiple wirings 22, and to form the barrier film 26 for covering the upper and side faces of the wirings 22.

(Modification (Part 3))

Next, description will be made regarding a wiring structure according to a modification (Part 3) of the present embodiment and a manufacturing method thereof, and an electronic apparatus employing the wiring structure thereof and a manufacturing method thereof, with reference to FIGS. 26 through 28B.

Figure 26:
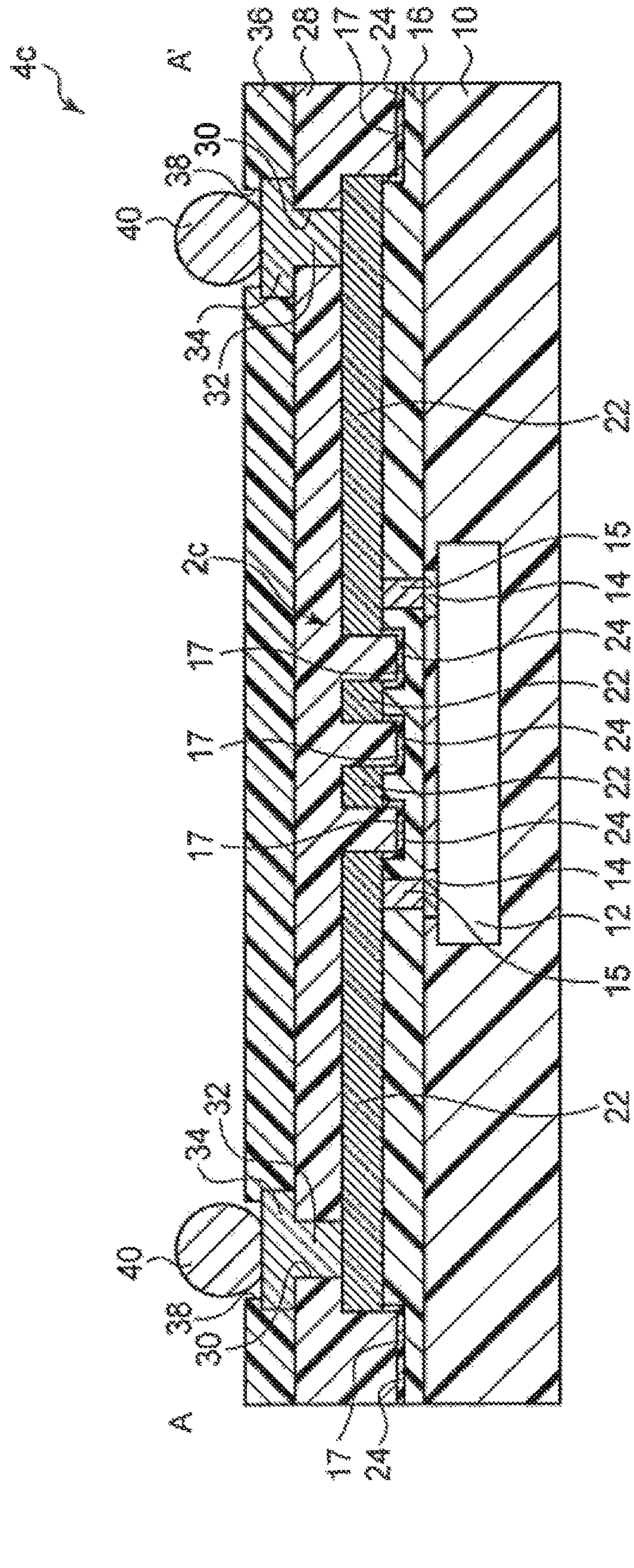
FIG. 26 is a cross-sectional view illustrating an electronic apparatus according to a modification (Part 3) of the first embodiment.

First, a wiring structure according to the present modification and an electronic apparatus having the wiring structure thereof will be described with reference to FIG. 26. FIG. 26 is a cross-sectional view illustrating the electronic apparatus according to the present modification.

The electronic apparatus according to the present modification is an electronic apparatus wherein while the recessed portions 17 is formed in the insulating film 16 in the region between the multiple wirings 22, and the barrier film 26 for covering the upper and side faces of the wirings 22 is not formed.

As illustrated in FIG. 26, with the present modification, the recessed portions 17 is formed in the insulating film 16 in the region between the multiple wirings 22. Therefore, the height of the surface of the insulating film 16 in the region between the multiple wirings 22 is not set lower than the height of the surface of the insulating film 16 in the region covered with the wirings 22.

The inducing layer 24 for inducing diffusion of the constituent atoms of the wirings 22 is formed on the insulating film 16 in the region between the multiple wirings 22. The inducing layer 24 is formed by roughening the surface portion of the insulating film 16.

With the present modification, the barrier film 26 (see FIG. 1) for covering the upper and side faces of the wirings 22 is not formed. In this way, an electronic apparatus 4*c* having a wiring structure 2*c* is formed wherein the inducing layer 24 for inducing diffusion of the constituent atoms of the wirings 22 is formed on the insulating film 16 in the region between the multiple wirings 22.

As described above, an arrangement may be made wherein while the recessed portions 17 is formed in the insulating film 16 in the region between the multiple wirings 22, the barrier film 26 for covering the upper and side faces of the wirings 22 is not formed.

With the present modification as well, the inducing layer 24 is formed on the insulating film 16 in the region between the multiple wirings 22, and accordingly, migration does not intensely advance at a partial portion, and migration gradually advances in an overall and even manner. Therefore, with the present modification as well, time until insulation breakdown occurs may sufficiently be prolonged, which may contribute to improvement in reliability.

Next, a method for manufacturing the electronic apparatus according to the present modification will be described with reference to FIGS. 27A through 28B. FIGS. 27A through 28B are process cross-sectional views illustrating the method for manufacturing the electronic apparatus according to the present modification.

Figure 27A:
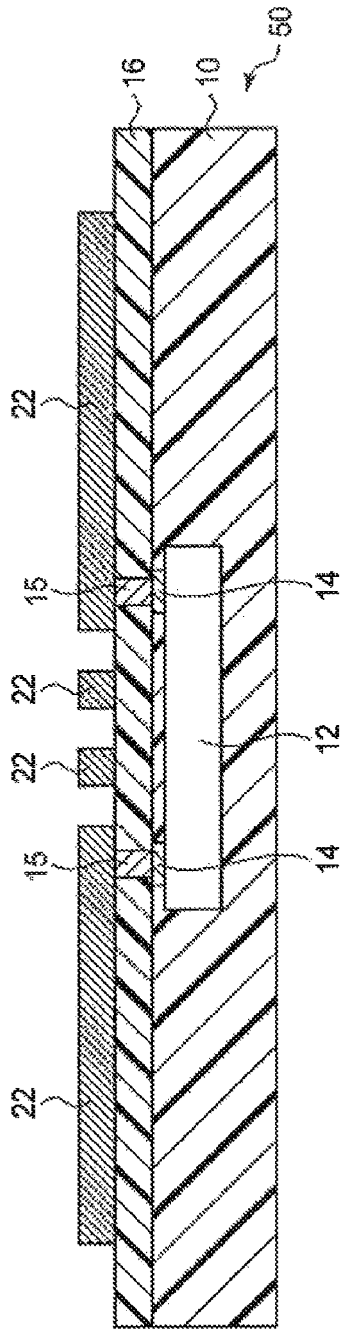
FIGS. 27A and 27B are process cross-sectional views (Part 1) illustrating a method for manufacturing the electronic apparatus according to the modification (Part 3) of the first embodiment.

First, from a process for forming the adhesive layer 48 on the supporting substrate 46 to a process for subjecting the seed layer 58 and so forth exposed around the wirings 22 to etching are the same as with the method for manufacturing the electronic apparatus according to the first embodiment illustrated in FIGS. 4A through 11A, and accordingly, description thereof will be omitted (see FIG. 27A).

Figure 27B:
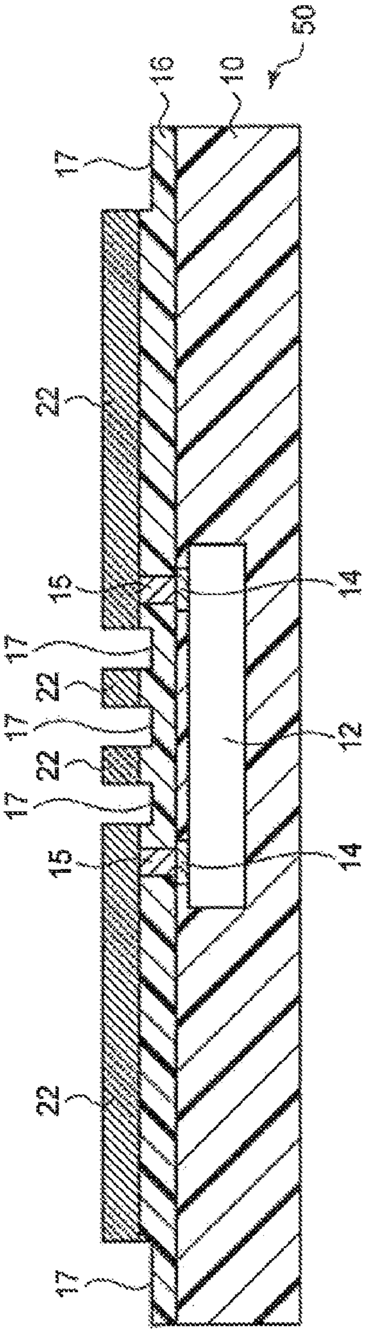

Next, in the same way as with the method for manufacturing the electronic apparatus according to the first embodiment described above with reference to FIG. 11B, the insulating film 16 in the region not covered with the wirings 22 is subjected to etching (see FIG. 27B).

Figure 28A:
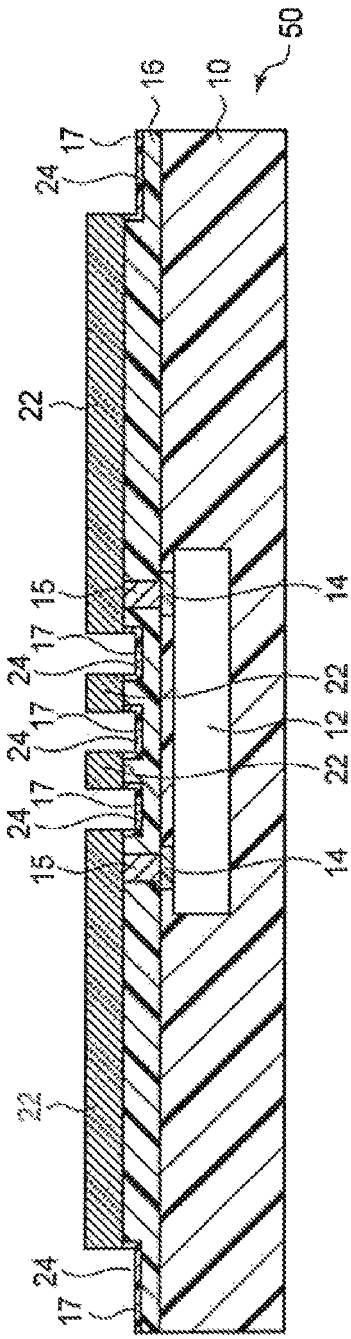
FIGS. 28A and 28B are process cross-sectional views (Part 2) illustrating the method for manufacturing the electronic apparatus according to the modification (Part 3) of the first embodiment.
Figure 28B:
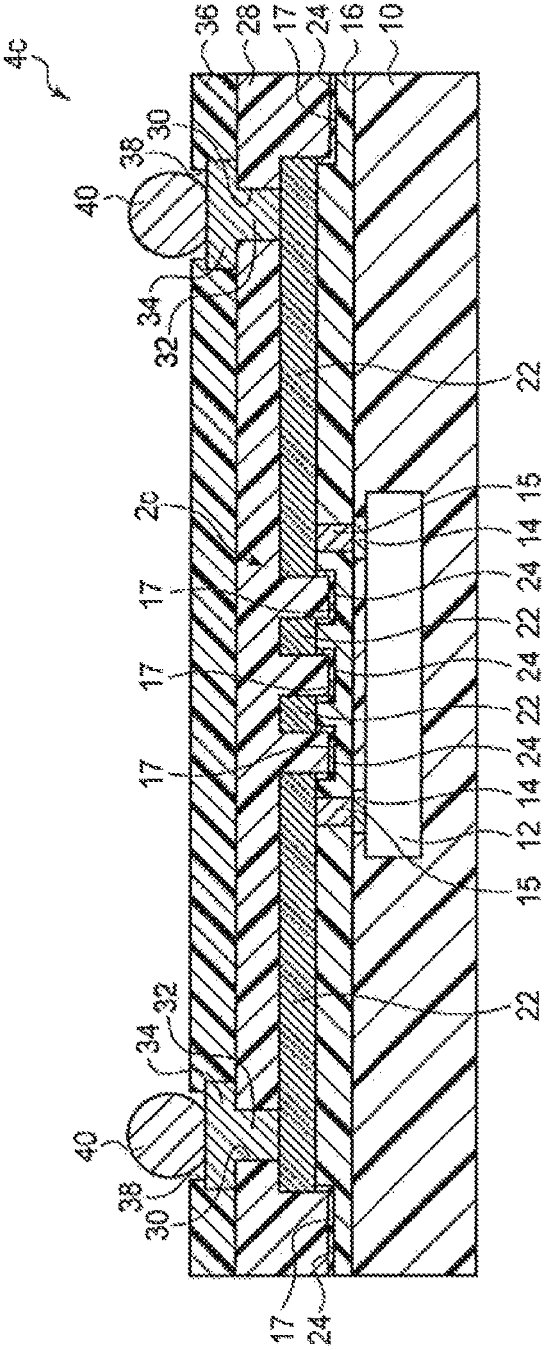

Next, in the same way as with the method for manufacturing the electronic apparatus according to the first embodiment described above with reference to FIG. 12B, the inducing layer 24 for inducing diffusion of the constituent atoms of the wirings 22 is formed on the insulating film 16 in the region not covered with the wirings 22 (see FIG. 28A).

The method for manufacturing the electronic apparatus according to the present modification after this is the same as the method for manufacturing the electronic apparatus according to the first embodiment described above with reference to FIGS. 13A through 15B, and accordingly, description thereof will be omitted. In this way, the electronic apparatus 4*c* according to the present modification having the wiring structure 2*c* is formed wherein the inducing layer 24 for inducing diffusion of the constituent atoms of the wirings 22 is formed on the insulating film 16 in the region not covered with the wirings 22 (see FIG. 28B).

After this, in the same way as with the method for manufacturing the electronic apparatus according to the first embodiment described above with reference to FIGS. 16 and 17, the electronic apparatus 4*c* is mounted on the circuit substrate 42. In this way, the electronic apparatus according to the present modification is manufactured.

Next, the HAST test results of the wiring structure according to the present modification will be described.

The conditions for the HAST test according to the present modification were set as with the conditions for the HAST test as to the wiring structure according to the first embodiment described above.

Example 5 is an embodiment wherein a HAST test was performed on the wiring structure according to the present modification. With Example 5, the recessed portions 17 were formed in the insulating film 16 in the region between the multiple wirings 22, the barrier film 26 for covering the upper and side portions of the wirings 22 were not formed, and the inducing layer 24 was formed by roughening the surface portion of the insulating film 16. As a result of the HAST test, 45% of test samples were determined to be OK in the case of Example 5.

Comparative Example 5 is an example wherein a HAST test was performed on the wiring structure where ultraviolet processing had been performed on the insulating film 16. With Comparative Example 5, the recessed portions 17 were formed in the insulating film 16 in the region between the multiple wirings 22, the barrier film 26 for covering the upper and side portions of the wirings 22 was not formed, and ultraviolet processing was performed on the surface portion of the insulating film 16. The number of test samples determined to be OK was 0% in the case of Comparative Example 5.

Thus, it may be seen that the present modification also may contribute to improvement in reliability on some level. However, in the light of obtaining sufficient reliability, it is desirable to form the barrier film 26 for covering the upper and side faces of the wirings 22.

Second Embodiment

Description will be made regarding a wiring structure according to a second embodiment and a manufacturing method thereof, and an electronic apparatus and electronic apparatus manufacturing method employing the wiring structure thereof, with reference to FIGS. 29 through 31. The same components as with the wiring structure according to the first embodiment illustrated in FIGS. 1 through 28B and the manufacturing method thereof and so forth are denoted with the same reference numerals, and description thereof will be omitted or simplified.

(Electronic Apparatus)

First, an electronic apparatus according to the present embodiment will be described with reference to FIG. 29. FIG. 29 is a cross-sectional view illustrating the electronic apparatus according to the present embodiment.

With the electronic apparatus according to the present embodiment, an inducing layer 24*a* is formed by damaging the surface portion of the insulating film 16.

In the same way as with the electronic apparatus according to the first embodiment, the recessed portions 17 are formed in the insulating film 16 in the region between the multiple wirings 22. The depths of the recessed portions 17 is 800 nm or so, for example.

The inducing layer 24*a* for inducing diffusion of the constituent atoms of the wirings 22 is formed on the insulating film 16 in the region between the multiple wirings 22. In other words, the layer 24*a* whereby the constituent atoms of the wirings 22 may readily diffuse as compared to the insulating films 16 and 28 is formed on the insulating film 16 in the region between the multiple wirings 22. The inducing layer 24 is formed on the bottom and side portions of the recessed portions 17 formed in the insulating film 16 in the region between the multiple wirings 22. The inducing layer 24*a* is formed by altering the surface portion of the insulating film 16. More specifically, the inducing layer (altered layer) 24*a* is formed by damaging the surface portion of the insulating film 16. Accordingly, the inducing layer 24*a* is a damaged portion of the insulating film 16.

The inducing layer 24*a* has been damaged, and accordingly, hygroscopicity (absorbability) thereof is higher than those of the insulating films 16 and 28. Highness in hygroscopicity contributes to the constituent atoms of the wirings 22 being readily taken in the inducing layer 24*a*, and being readily diffused into the inducing layer 24*a*. Also, the inducing layer 24*a* has been damaged, and accordingly, density thereof is lower than those of the insulating films 16 and 28. Lowness in density contributes to the constituent atoms of the wirings 22 being readily taken in the inducing layer 24*a*, and being readily diffused into the inducing layer 24*a*.

The thickness of the inducing layer 24*a* is 5 nm to 300 nm or so, for example. Now, let us say that the thickness of the inducing layer 24*a* is 10 nm to 100 nm or so.

The insulation properties of the inducing layer 24*a* are lower than those of the insulating films 16 and 28 in the same way as with the insulating layer 24 according to the first embodiment. Highness/lowness in insulation properties affects ease of movement (dispersion) of the constituent atoms of the wirings 22. The insulating films 16 and 28 are relatively high in insulation properties, and accordingly, the constituent atoms of the wirings 22 are relatively hard to move in the insulating films 16 and 28. On the other hand, the insulation properties of the inducing layer 24*a* is relatively low, and accordingly, the constituent atoms of the wirings 22 have relatively ease of movement in the inducing layer 24*a*.

The barrier film 26 is formed on the upper and side faces of the wirings 22 in the same way as with the electronic apparatus according to the first embodiment. In this way, the electronic apparatus (wafer level package) 4*d* according to the present modification having a wiring structure 2*d* is formed wherein the inducing layer 24*a* for inducing diffusion of the constituent atoms of the wirings 22 is formed on the insulating film 16 in the region between the multiple wirings 22.

(Manufacturing Method of Electronic Apparatus)

Next, a method for manufacturing the electronic apparatus according to the present embodiment will be described with reference to FIGS. 30A through 31. FIGS. 30A through 31 are process cross-sectional views illustrating the method for manufacturing the electronic apparatus according to the present embodiment.

First, from a process for forming the adhesive layer 48 on the supporting substrate 46 to a process for forming the barrier film 26 on the upper and side faces of the wirings 22 are the same as with the method for manufacturing the electronic apparatus according to the first embodiment illustrated in FIGS. 4A through 12A, and accordingly, description thereof will be omitted (see FIG. 30A).

Figure 30A:
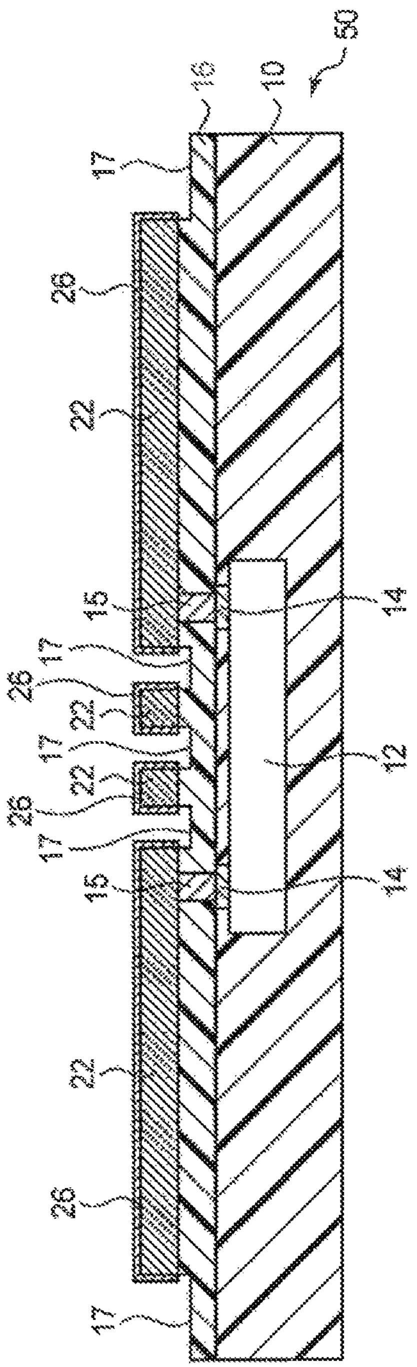
FIGS. 30A and 30B are process cross-sectional views (Part 1) illustrating a method for manufacturing the electronic apparatus according to the second embodiment.
Figure 30B:
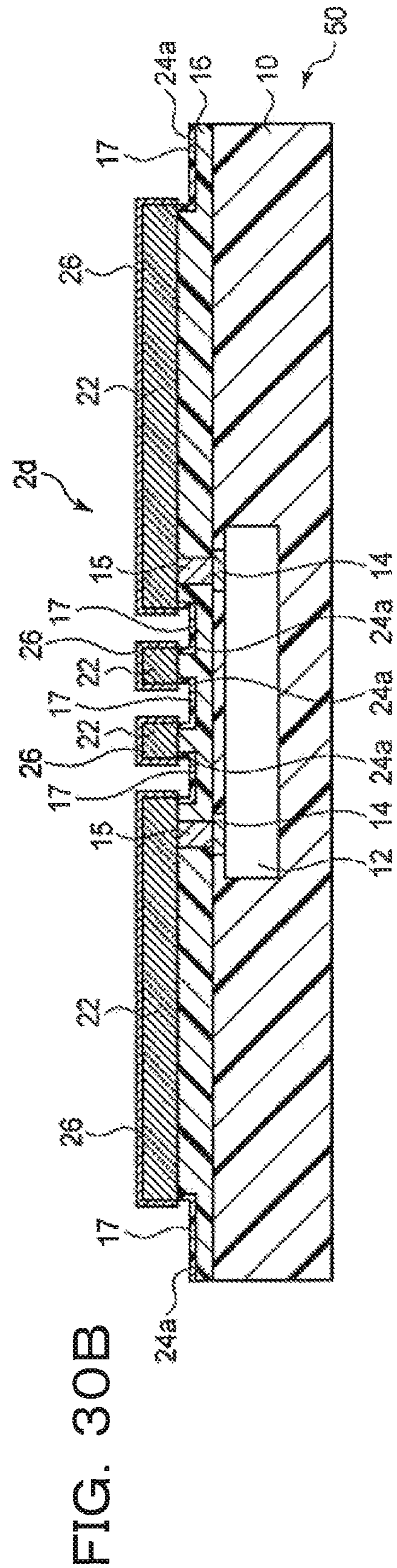
Figure 31:
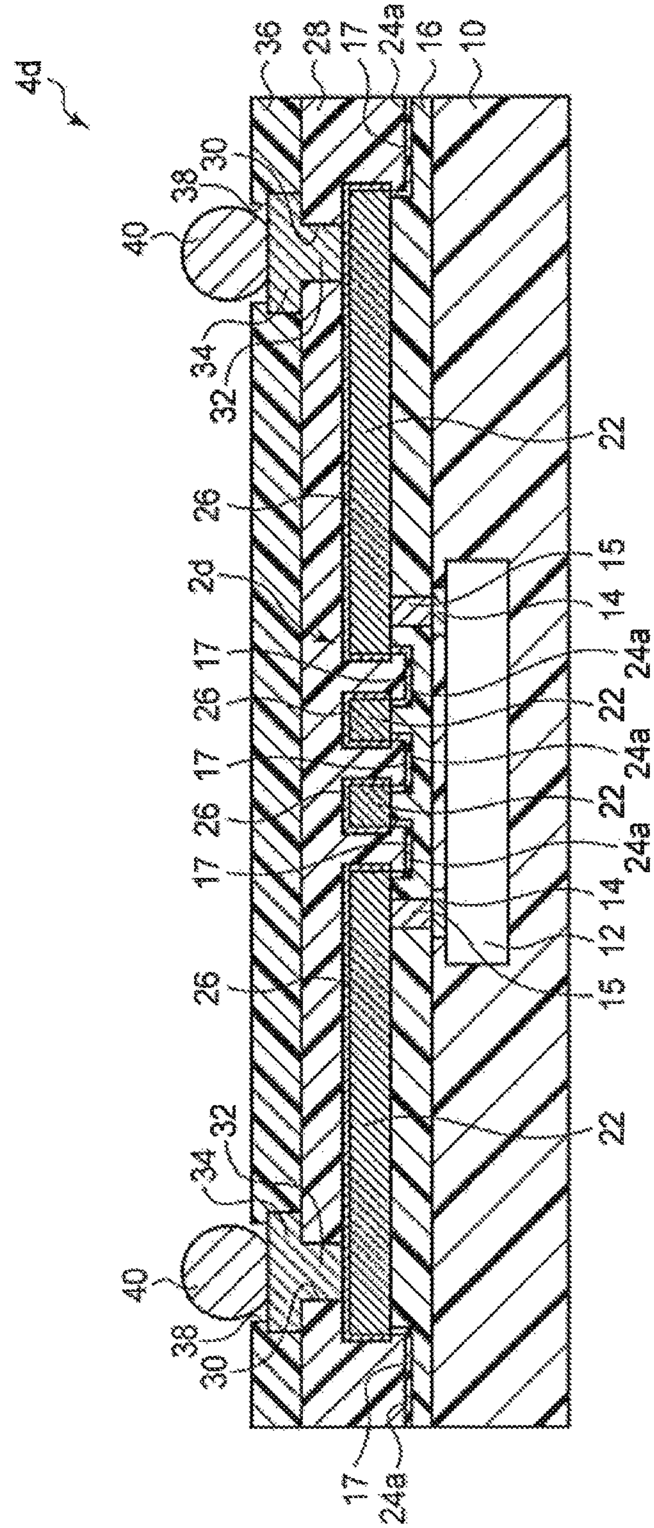
FIG. 31 is a process cross-sectional view (Part 2) illustrating the method for manufacturing the electronic apparatus according to the second embodiment.

Next, the inducing layer 24*a* for inducing diffusion of the constituent atoms of the wirings 22 is formed on the insulating film 16 in the region not covered with the wirings 22 (see FIG. 30B). That is to say, the layer 24*a* where the constituent atoms of the wirings 22 may readily be diffused as compared to the insulating films 16 and 28 is formed on the insulating film 16 in the region not covered with the wirings 22. Such an inducing layer 24*a* may be formed by damaging the surface portion of the insulating film 16. Damaging as to the insulating film 16 may be performed by dipping the insulating film 16 in an alkaline chemical, for example. As for such an alkaline chemical, an alkaline chemical including ammonia is employed, for example. The pH of this alkaline chemical is 10.0 or more, for example. The temperature of this alkaline chemical is 50° C. or higher, for example. Time for dipping the insulating film 16 into this chemical is five minutes or so. The thickness of the inducing layer 24*a* is 50 nm to 300 nm or so, for example. Now, let us say that the thickness of the inducing layer 24*a* is 100 nm or so, for example.

Note that, though description has been made here regarding a case where an alkaline chemical including ammonia is employed as an alkaline chemical, an alkaline chemical to be employed is not restricted to this. For example, an alkaline chemical including TMAH, an alkaline chemical including KOH (potassium hydroxide), or the like may be employed as an alkaline chemical.

In this way, a wiring structure 2*d* according to the present embodiment is formed wherein the inducing layer 24*a* for inducing diffusion of the constituent atoms of the wirings 22 is formed on the insulating film 16 in the region between the multiple wirings 22.

The method for manufacturing the electronic apparatus according to the present embodiment after this is the same as the method for manufacturing the electronic apparatus according to the first embodiment described with reference to FIGS. 13A through 15B, and accordingly, description thereof will be omitted. In this way, an electronic apparatus 4*d* according to the present embodiment having a wiring structure 2*d* is formed wherein the inducing layer 24*a* for inducing diffusion of the constituent atoms of the wirings 22 is formed on the insulating film 16 in the region between the multiple wirings 22 (see FIG. 31).

After this, in the same way as with the method for manufacturing the electronic apparatus according to the first embodiment described with reference to FIGS. 16 and 17, the electronic apparatus 4*d* is mounted on the circuit substrate 42.

(Evaluation Results)

Next, evaluation results of the wiring structure according to the present embodiment will be described.

Figure 32:
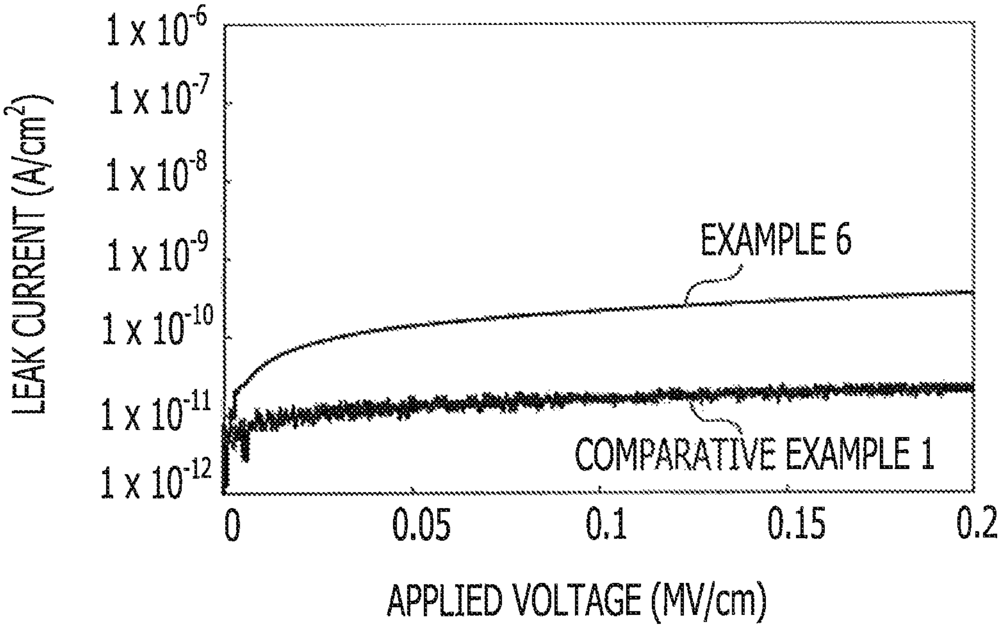
FIG. 32 is a graph (Part 2) illustrating measurement results of insulation properties.

FIG. 32 is a graph illustrating measurement results for insulation properties. The horizontal axis in FIG. 32 indicates applied voltage per increment length, and the vertical axis in FIG. 32 indicates leak current. As for the evaluation circuit, the same evaluation circuit as that of the first embodiment illustrated in FIG. 18 was employed.

Example 6 illustrated in FIG. 32 corresponds to the present embodiment. With Example 6, the insulating film 102 of the positive-type photosensitive phenol resin was formed on the silicon substrate 100, and the insulating film 102 was damaged by being dipped into an alkaline chemical.

On the other hand, Comparative Example 1 is, as described above, an example wherein the insulating film 102 of the positive-type photosensitive phenol resin was formed on the silicon substrate 100, and ultraviolet irradiation was performed on this insulating film 102.

As may be understood from FIG. 32, with Example 6, leak current is increased as compared to Comparative Example 1. Thus, according to Example 6, it may be seen that the insulating film 102 having relatively low insulation properties may be obtained.

Figure 29:
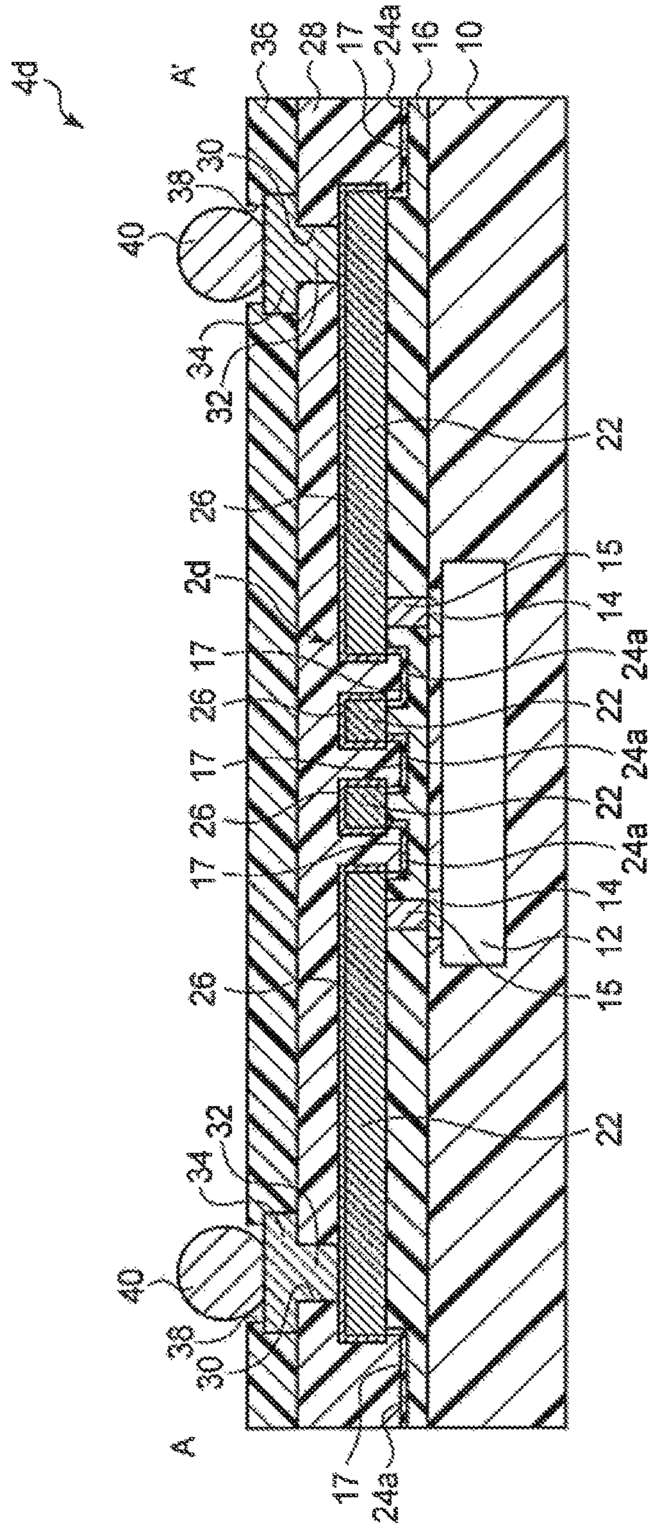
FIG. 29 is a cross-sectional view illustrating an electronic apparatus according to a second embodiment.

The insulating film 102 damaged in Example 6 corresponds to the inducing layer 24*a* (see FIG. 29) formed by damaging the surface portion of the insulating film 16 (see FIG. 29). With an insulating film having low insulation properties, the constituent atoms of the wirings 22 (see FIG. 29) readily diffuse. Accordingly, with the present embodiment as well, migration does not intensely advance at a partial portion, and migration gradually advances in an overall and even manner. Therefore, with the present embodiment as well, it may be seen that time until insulation breakdown occurs may sufficiently be prolonged, whereby the wiring structure 2*d* having high reliability, and the electronic apparatus 4*d* having the wiring structure 2*d* thereof may be provided.

Next, the HAST test results of the wiring structure according to the present embodiment will be described.

The conditions for the HAST test according to the present embodiment were set as with the conditions for the HAST test as to the wiring structure according to the first embodiment described above.

As Example 7, a HAST test was performed on the wiring structure 2*d* wherein the inducing layer 24*a* had been formed by damaging the wiring structure 2*d* according to the present embodiment, i.e., the surface portion of the insulating film 16. With Example 7, 95% of test samples were determined to be OK.

On the other hand, in the case of Comparative Example 2 wherein a HAST test was performed on the wiring structure where ultraviolet processing had been performed on the insulating film 16, as described above, the number of test samples determined to be OK was a mere 5%.

As described above, it may be seen that according to the present embodiment, the wiring structure 2*d* having high reliability may be obtained.

(Modification (Part 1))

Next, description will be made regarding a wiring structure according to a modification (Part 1) of the present embodiment and a manufacturing method thereof, and an electronic apparatus employing the wiring structure thereof and a manufacturing method thereof, with reference to FIGS. 33 through 35B.

Figure 33:
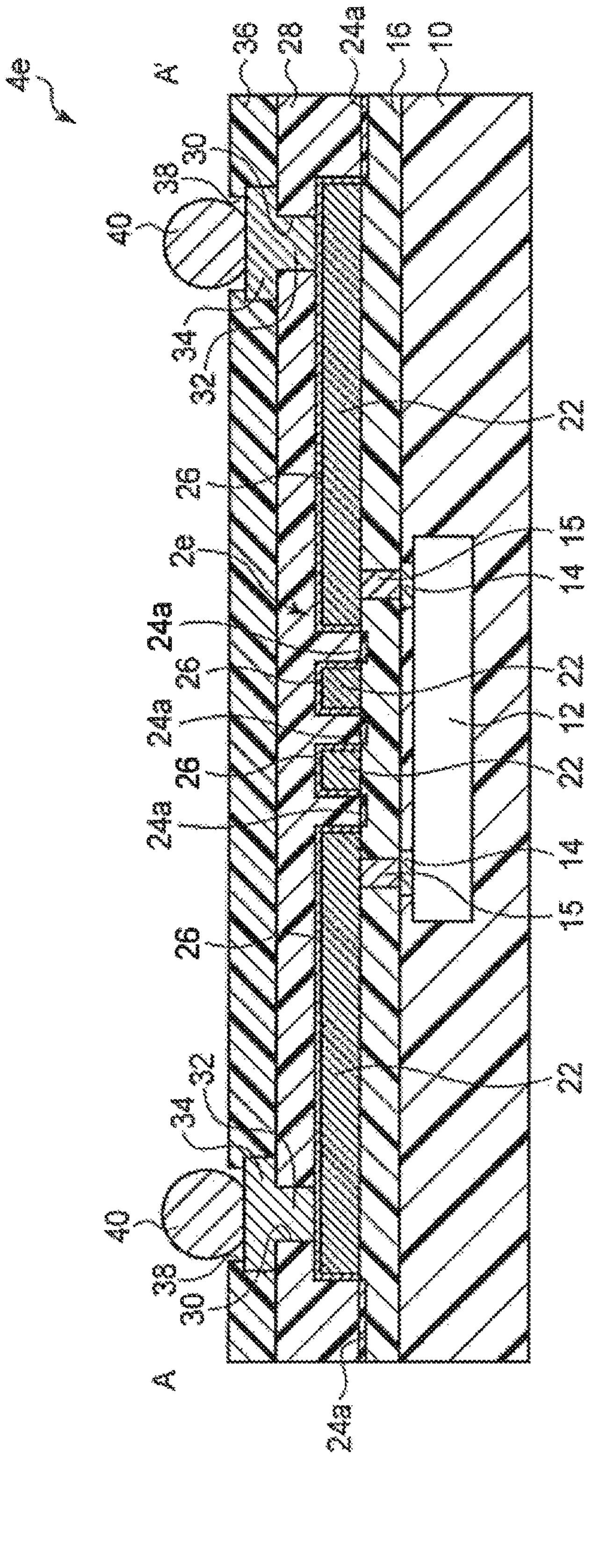
FIG. 33 is a cross-sectional view illustrating an electronic apparatus according to a modification (Part 1) of the second embodiment.

First, a wiring structure according to the present modification and an electronic apparatus having the wiring structure thereof will be described with reference to FIG. 33. FIG. 33 is a cross-sectional view illustrating the electronic apparatus according to the present modification.

The electronic apparatus according to the present modification is an electronic apparatus wherein the recessed portions 17 are not formed in the insulating film 16 in the region between the multiple wirings 22.

As illustrated in FIG. 33, with the present modification, the recessed portions 17 (see FIG. 29) are not formed in the insulating film 16 in the region between the multiple wirings 22. Therefore, the height of the surface of the insulating film 16 in the region between the multiple wirings 22 is not set lower than the height of the surface of the insulating film 16 in the region covered with the wirings 22.

The inducing layer 24*a* for inducing diffusion of the constituent atoms of the wirings 22 is formed on the insulating film 16 in the region between the multiple wirings 22. The inducing layer 24*a* is formed by damaging the surface portion of the insulating film 16.

In this way, an electronic apparatus 4*e* having a wiring structure 2*e* is formed wherein the inducing layer 24*a* for inducing diffusion of the constituent atoms of the wirings 22 is formed on the insulating film 16 in the region between the multiple wirings 22.

As described above, an arrangement may be made wherein the recessed portions 17 are not formed in the insulating film 16 in the region between the multiple wirings 22.

With the present modification as well, the inducing layer 24*a* is formed on the insulating film 16 in the region between the multiple wirings 22, and accordingly, migration does not intensely advance at a partial portion, and migration gradually advances in an overall and even manner. Therefore, with the present modification as well, time until insulation breakdown occurs may sufficiently be prolonged, whereby the wiring structure having high reliability, and the electronic apparatus having the wiring structure thereof may be provided.

Next, a method for manufacturing the electronic apparatus according to the present modification will be described with reference to FIGS. 34A through 35B. FIGS. 34A through 35B are process cross-sectional views illustrating the method for manufacturing the electronic apparatus according to the present modification.

Figure 34A:
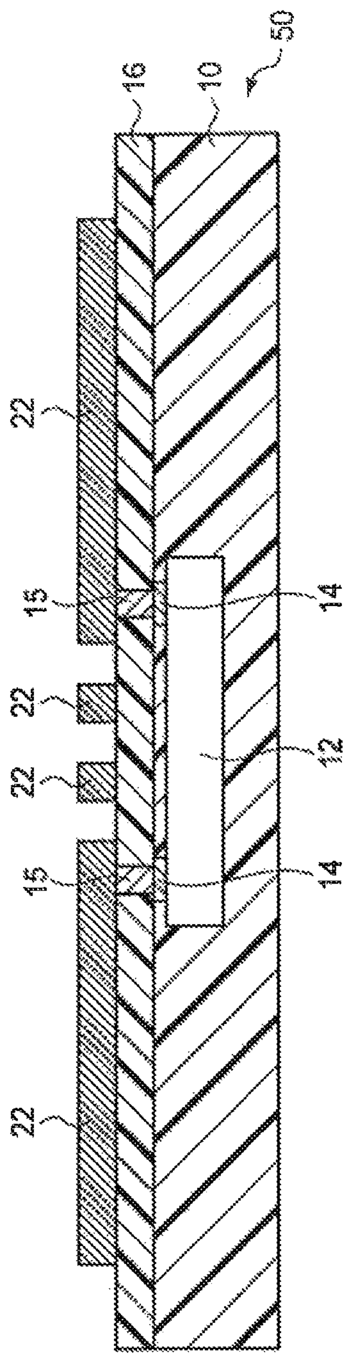
FIGS. 34A and 34B are process cross-sectional views (Part 1) illustrating a method for manufacturing the electronic apparatus according to the modification (Part 1) of the second embodiment.

First, from a process for forming the adhesive layer 48 on the supporting substrate 46 to a process for subjecting the seed layer 58 and so forth exposed around the wirings 22 to etching are the same as with the method for manufacturing the electronic apparatus according to the first embodiment illustrated in FIGS. 4A through 11A, and accordingly, description thereof will be omitted (see FIG. 34A).

Figure 34B:
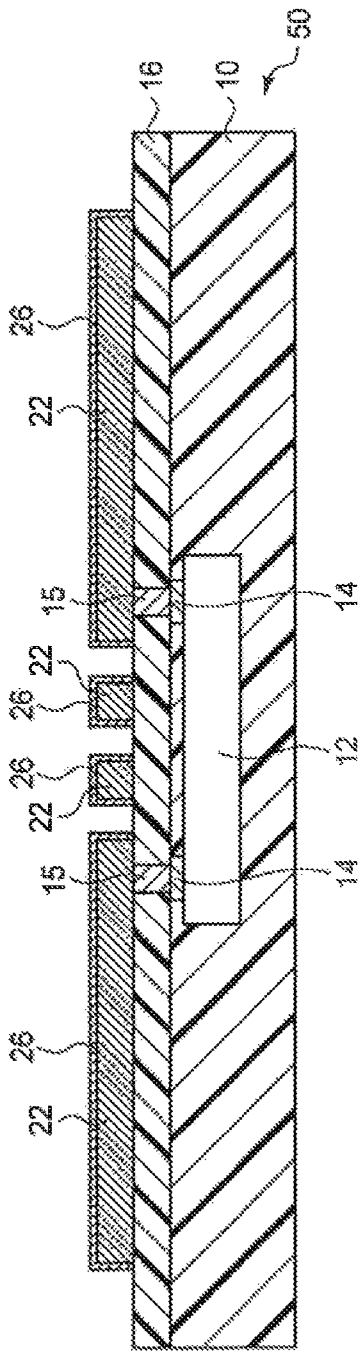

Next, in the same way as with the method for manufacturing the electronic apparatus according to the first embodiment described above with reference to FIG. 12A, the barrier film 26 is formed on the upper and side faces of the wirings 22 (see FIG. 34B).

Figure 35A:
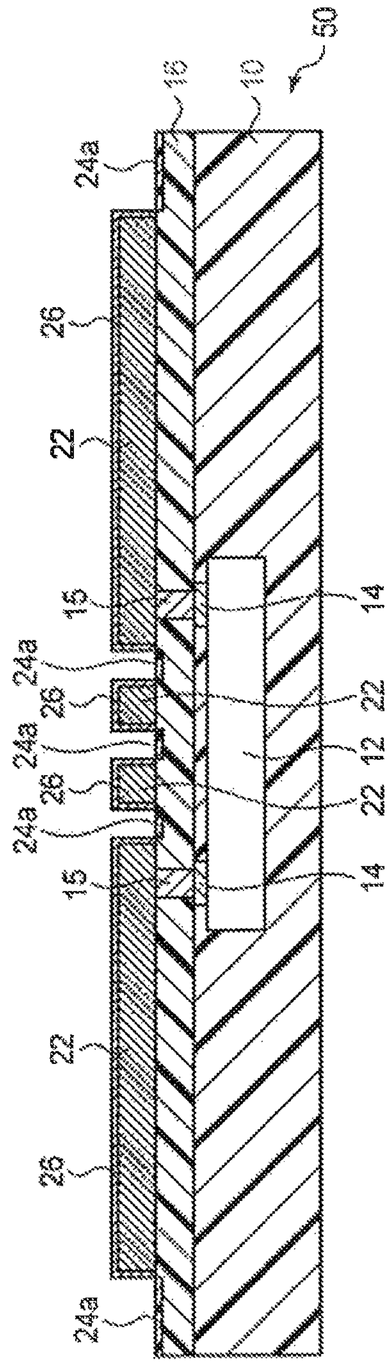
FIGS. 35A and 35B are process cross-sectional views (Part 2) illustrating the method for manufacturing the electronic apparatus according to the modification (Part 1) of the second embodiment.

Next, in the same way as with the method for manufacturing the electronic apparatus according to the second embodiment described above with reference to FIG. 30B, the inducing layer 24*a* for inducing diffusion of the constituent atoms of the wirings 22 is formed on the insulating film 16 in the region not covered with the wirings 22 (see FIG. 35A).

The method for manufacturing the electronic apparatus according to the present modification after this is the same as the method for manufacturing the electronic apparatus according to the first embodiment described above with reference to FIGS. 13A through 15B, and accordingly, description thereof will be omitted.

Figure 35B:
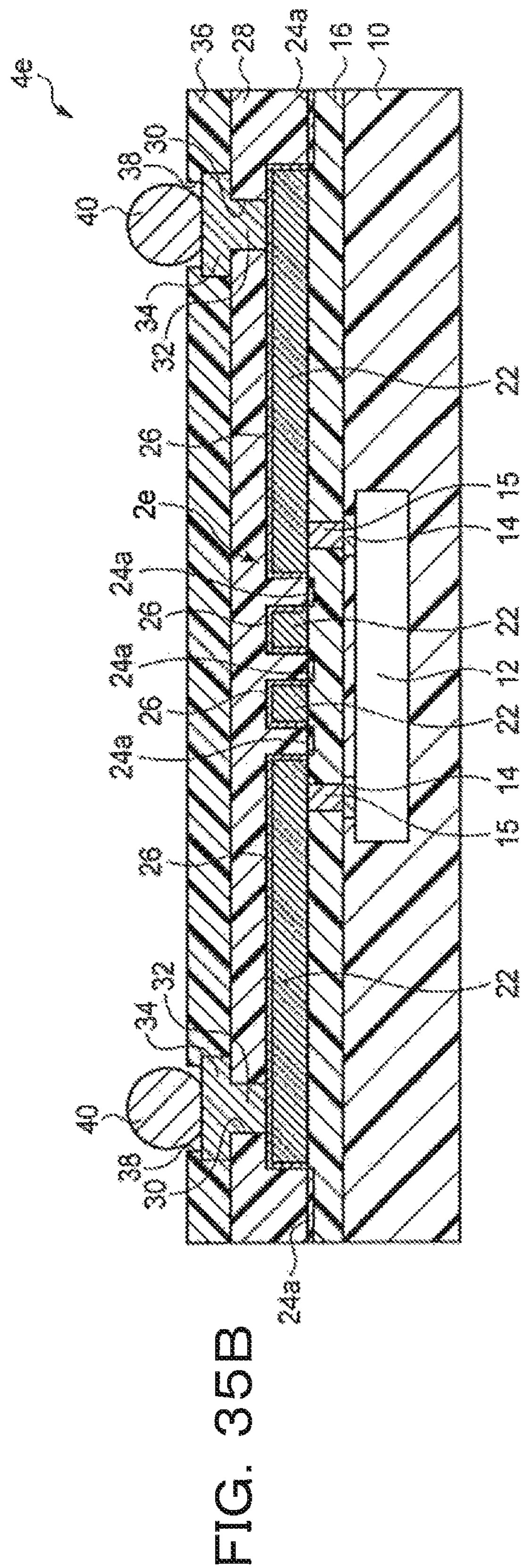

In this way, an electronic apparatus 4*e* according to the present modification having a wiring structure 2*e* is formed wherein the inducing layer 24*a* for inducing diffusion of the constituent atoms of the wirings 22 is formed on the insulating film 16 in the region not covered with the wirings 22 (see FIG. 35B).

The electronic apparatus 4*e* according to the present modification thus formed may be mounted on the circuit substrate 42 in the same way as with the method for manufacturing the electronic apparatus according to the first embodiment described with reference to FIGS. 16 and 17.

Next, the HAST test results of the wiring structure according to the present modification will be described.

The conditions for the HAST test according to the present modification were set as with the conditions for the HAST test as to the wiring structure according to the first embodiment described above.

As Example 8, a HAST test was performed on the wiring structure 2*e* according to the present modification. With Example 8, the inducing layer 24*a* was formed by damaging the surface portion of the insulating film 16 without forming the recessed portions 17 in the insulating film 16 in the region between the multiple wirings 22. With Example 8, 60% of test samples were determined to be OK.

On the other hand, in the case of Comparative Example 3 wherein ultraviolet processing was performed on the surface portion of the insulating film 16 without forming the recessed portions 17 in the insulating film 16 in the region between the multiple wirings 22, as described above, the number of test samples determined to be OK was 0%.

Thus, it may be seen that with the present modification as well, reliability is obtained on some level. However, in the light of obtaining sufficient reliability, it is desirable to form the recessed portions 17 in the insulating film 16 in the region between the multiple wirings 22.

(Modification (Part 2))

Next, description will be made regarding a wiring structure according to a modification (Part 2) of the present embodiment and a manufacturing method thereof, and an electronic apparatus employing the wiring structure thereof and a manufacturing method thereof, with reference to FIGS. 36 through 38.

First, a wiring structure according to the present modification and an electronic apparatus having the wiring structure thereof will be described with reference to FIG. 36. FIG. 36 is a cross-sectional view illustrating the electronic apparatus according to the present modification.

The electronic apparatus according to the present modification is an electronic apparatus wherein the recessed portions 17 are not formed in the insulating film 16 in the region between the multiple wirings 22, and the barrier film 26 for covering the upper and side faces of the wirings 22 is not formed.

Figure 36:
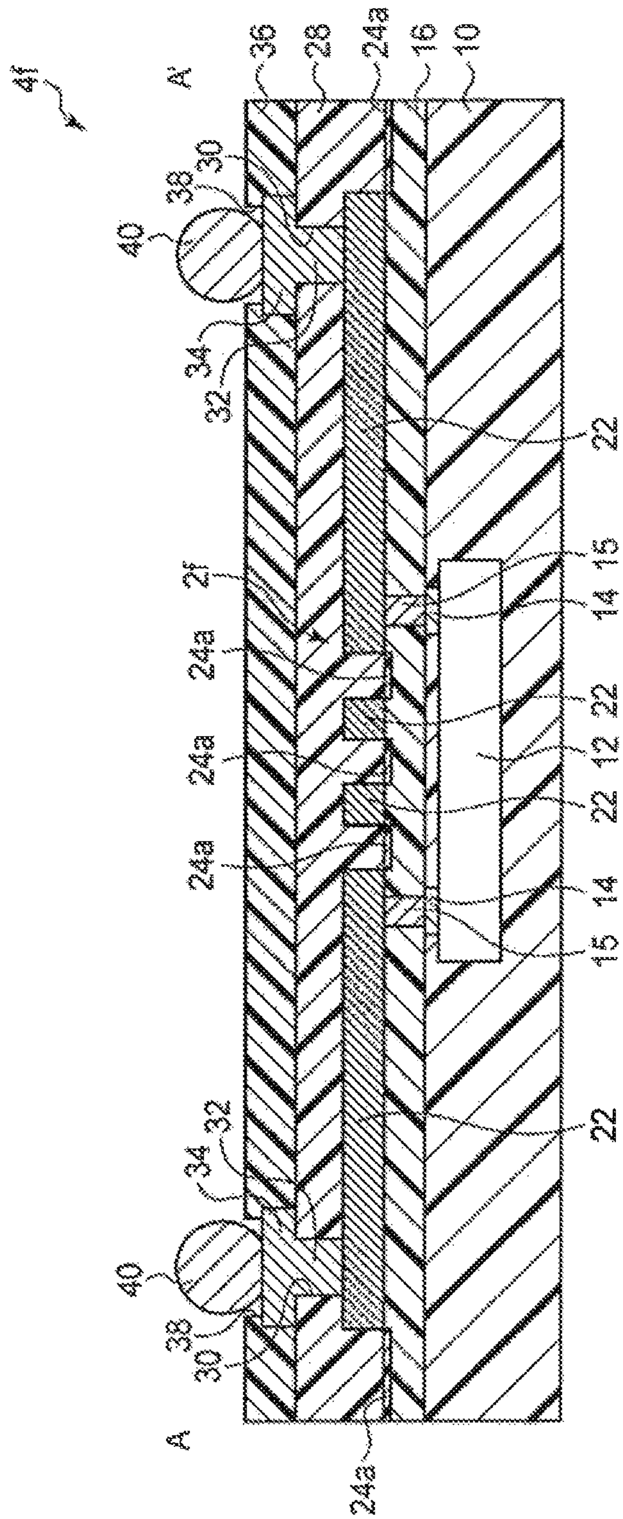
FIG. 36 is a cross-sectional view illustrating an electronic apparatus according to a modification (Part 2) of the second embodiment.
Figure 37A:
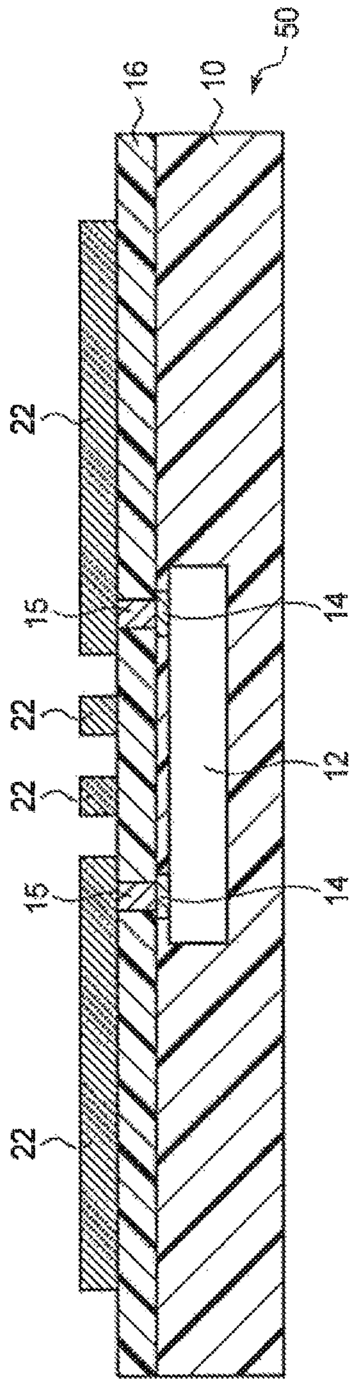
FIGS. 37A and 37B are process cross-sectional views (Part 1) illustrating a method for manufacturing the electronic apparatus according to the modification (Part 2) of the second embodiment.

As illustrated in FIG. 36, with the present modification, the recessed portions 17 (see FIG. 29) are not formed in the insulating film 16 in the region between the multiple wirings 22. Therefore, the height of the surface of the insulating film 16 in the region between the multiple wirings 22 is not set lower than the height of the surface of the insulating film 16 in the region covered with the wirings 22.

The inducing layer 24*a* for inducing diffusion of the constituent atoms of the wirings 22 is formed on the insulating film 16 in the region between the multiple wirings 22. The inducing layer 24*a* is formed by damaging the surface portion of the insulating film 16.

With the present modification, the barrier film 26 (see FIG. 29) for covering the upper and side faces of the wirings 22 is not formed. In this way, an electronic apparatus 4*f* according to the present modification having a wiring structure 2*f* is formed wherein the inducing layer 24*a* for inducing diffusion of the constituent atoms of the wirings 22 is formed on the insulating film 16 in the region between the multiple wirings 22.

As described above, an arrangement may be made wherein the recessed portions 17 is not formed in the insulating film 16 in the region between the multiple wirings 22, and also the barrier film 26 for covering the upper and side faces of the wirings 22 is not formed.

With the present modification as well, the inducing layer 24*a* is formed on the insulating film 16 in the region between the multiple wirings 22, and accordingly, migration does not intensely advance at a partial portion, and migration gradually advances in an overall and even manner. Therefore, with the present modification as well, time until insulation breakdown occurs may sufficiently be prolonged, which contributes to improvement in reliability.

Next, a method for manufacturing the electronic apparatus according to the present modification will be described with reference to FIGS. 37A through 38. FIGS. 37A through 38 are process cross-sectional views illustrating the method for manufacturing the electronic apparatus according to the present modification.

First, from a process for forming the adhesive layer 48 on the supporting substrate 46 to a process for subjecting the seed layer 58 and so forth exposed around the wirings 22 to etching are the same as with the method for manufacturing the electronic apparatus according to the first embodiment illustrated in FIGS. 4A through 11A, and accordingly, description thereof will be omitted (see FIG. 37A).

Figure 37B:
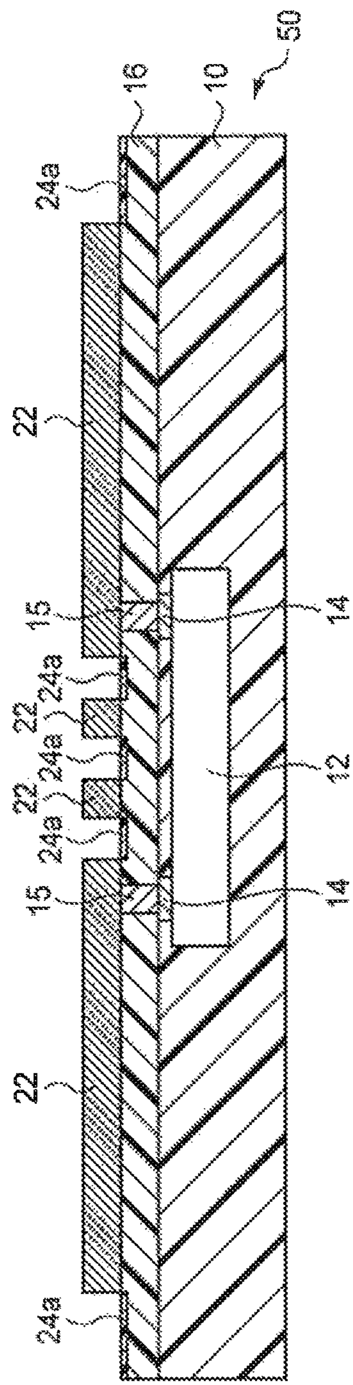
Figure 38:
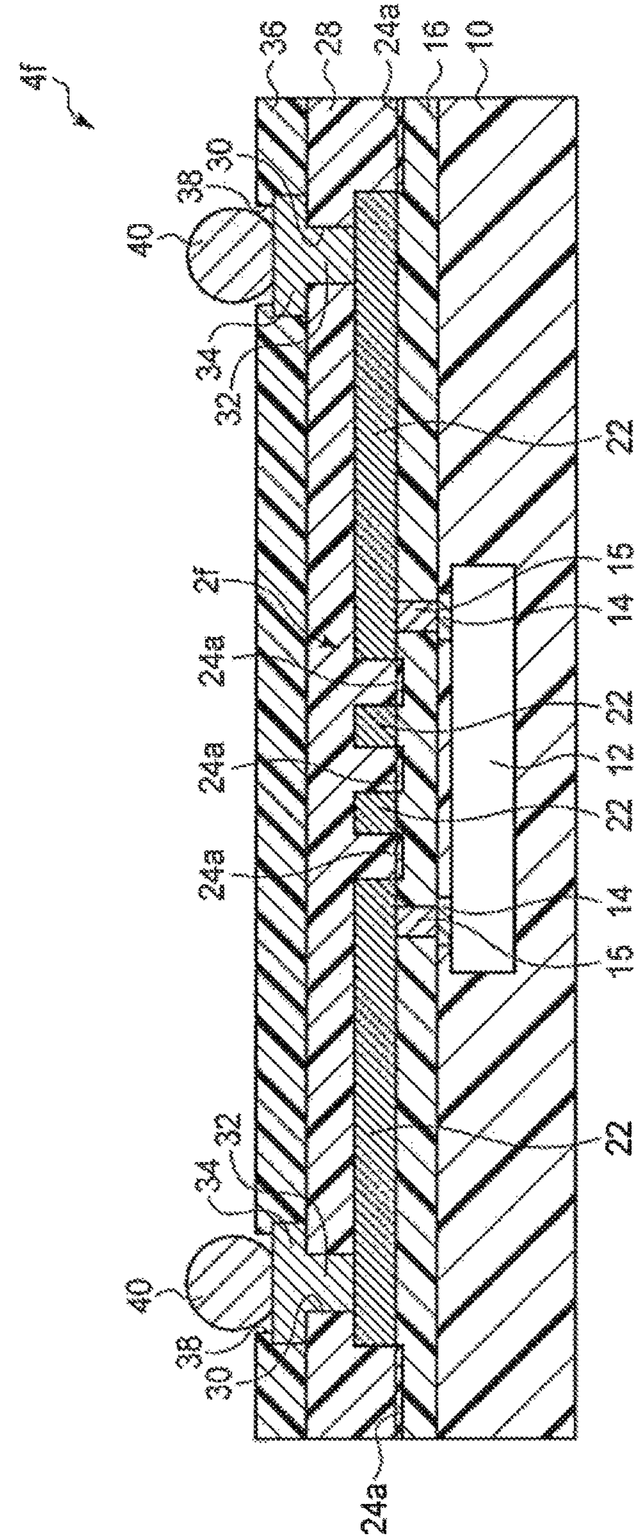
FIG. 38 is a process cross-sectional view (Part 2) illustrating the method for manufacturing the electronic apparatus according to the modification (Part 2) of the second embodiment.

Next, in the same way as with the method for manufacturing the electronic apparatus according to the second embodiment described above with reference to FIG. 30B, the inducing layer 24*a* for inducing diffusion of the constituent atoms of the wirings 22 is formed on the insulating film 16 in the region not covered with the wirings 22 (see FIG. 37B).

The method for manufacturing the electronic apparatus according to the present modification after this is the same as the method for manufacturing the electronic apparatus according to the first embodiment described above with reference to FIGS. 13A through 15B, and accordingly, description thereof will be omitted. In this way, the electronic apparatus 4*f* according to the present modification having the wiring structure 2*f* is formed wherein the inducing layer 24*a* for inducing diffusion of the constituent atoms of the wirings 22 is formed on the insulating film 16 in the region not covered with the wirings 22 (see FIG. 25).

The electronic apparatus 4*f* according to the present modification thus formed may be mounted on the circuit substrate 42 in the same way as with the method for manufacturing the electronic apparatus according to the first embodiment described with reference to FIGS. 16 and 17.

Next, the HAST test results of the wiring structure according to the present modification will be described.

The conditions for the HAST test according to the present modification were set as with the conditions for the HAST test as to the wiring structure according to the first embodiment described above.

As Example 9, a HAST test was performed on the wiring structure 2*f* according to the present modification. With Example 9, the inducing layer 24*a* was formed by damaging the surface portion of the insulating film 16 without forming the recessed portions 17 in the insulating film 16 in the region between the multiple wirings 22, and without forming the barrier film 26 for covering the upper and side faces of the wirings 22. With Example 9, 10% of test samples were determined to be OK.

On the other hand, in the case of Comparative Example 4 wherein ultraviolet processing was performed on the surface portion of the insulating film 16 without forming the recessed portions 17 in the insulating film 16 in the region between the multiple wirings 22, and without forming the barrier film 26 on the upper and side faces of the wirings 22, as described above, the number of test samples determined to be OK was 0%.

Thus, it may be seen that the present modification also may contribute to improvement in reliability on some level. However, in the light of obtaining sufficient reliability, it is desirable to form the recessed portions 17 in the insulating film 16 in the region between the multiple wirings 22, and to form the barrier film 26 for covering the upper and side faces of the wirings 22.

(Modification (Part 3))

Next, description will be made regarding a wiring structure according to a modification (Part 3) of the present embodiment and a manufacturing method thereof, and an electronic apparatus employing the wiring structure thereof and a manufacturing method thereof, with reference to FIGS. 39 through 41B.

Figure 39:
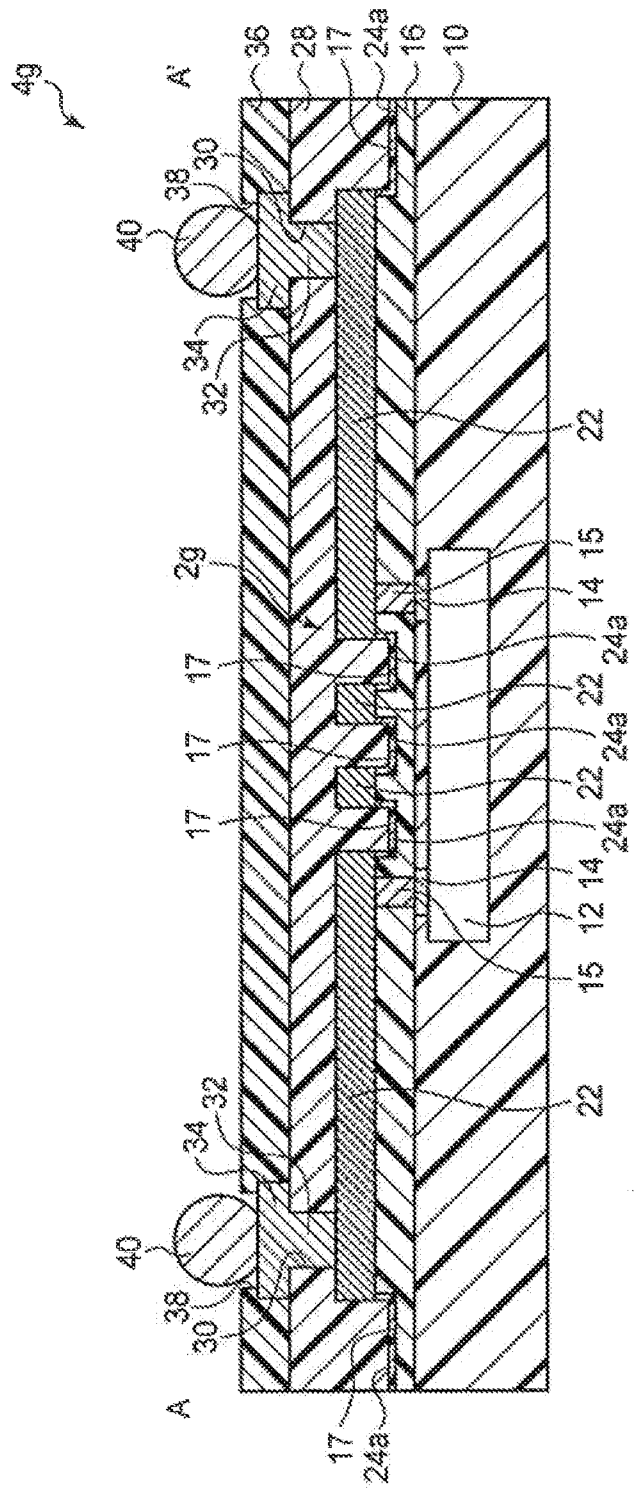
FIG. 39 is a cross-sectional view illustrating an electronic apparatus according to a modification (Part 3) of the second embodiment.

First, a wiring structure according to the present modification and an electronic apparatus having the wiring structure thereof will be described with reference to FIG. 39. FIG. 39 is a cross-sectional view illustrating the electronic apparatus according to the present modification.

The electronic apparatus according to the present modification is an electronic apparatus wherein while the recessed portions 17 are formed in the insulating film 16 in the region between the multiple wirings 22, the barrier film 26 for covering the upper and side faces of the wirings 22 is not formed.

As illustrated in FIG. 39, with the present modification, the recessed portions 17 are formed in the insulating film 16 in the region between the multiple wirings 22. Therefore, the height of the surface of the insulating film 16 in the region between the multiple wirings 22 is set lower than the height of the surface of the insulating film 16 in the region covered with the wirings 22.

The inducing layer 24*a* for inducing diffusion of the constituent atoms of the wirings 22 is formed on the insulating film 16 in the region between the multiple wirings 22. The inducing layer 24*a* is formed by damaging the surface portion of the insulating film 16.

With the present modification, the barrier film 26 (see FIG. 29) for covering the upper and side faces of the wirings 22 is not formed. In this way, an electronic apparatus 4*g* according to the present modification having a wiring structure 2*g* is formed wherein the inducing layer 24*a* for inducing diffusion of the constituent atoms of the wirings 22 is formed on the insulating film 16 in the region between the multiple wirings 22.

As described above, an arrangement may be made wherein while the recessed portions 17 is formed in the insulating film 16 in the region between the multiple wirings 22, the barrier film 26 for covering the upper and side faces of the wirings 22 is not formed.

With the present modification as well, the inducing layer 24*a* is formed on the insulating film 16 in the region between the multiple wirings 22, and accordingly, migration does not intensely advance at a partial portion, and migration gradually advances in an overall and even manner. Therefore, with the present modification as well, time until insulation breakdown occurs may sufficiently be prolonged, which contributes to improvement in reliability.

Next, a method for manufacturing the electronic apparatus according to the present modification will be described with reference to FIGS. 40A through 41B. FIGS. 40A through 41B are process cross-sectional views illustrating the method for manufacturing the electronic apparatus according to the present modification.

Figure 40A:
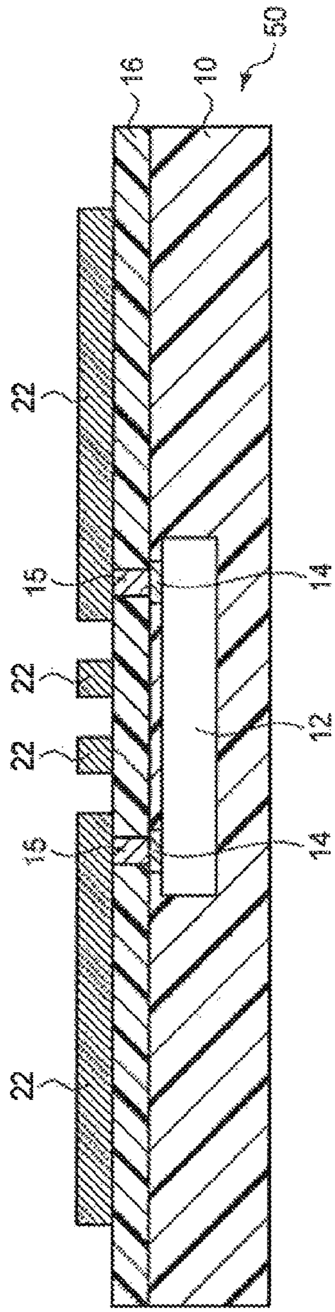
FIGS. 40A and 40B are process cross-sectional views (Part 1) illustrating a method for manufacturing the electronic apparatus according to the modification (Part 3) of the second embodiment.

First, from a process for forming the adhesive layer 48 on the supporting substrate 46 to a process for subjecting the seed layer 58 and so forth exposed around the wirings 22 to etching are the same as with the method for manufacturing the electronic apparatus according to the first embodiment illustrated in FIGS. 4A through 11A, and accordingly, description thereof will be omitted (see FIG. 40A).

Figure 11A:
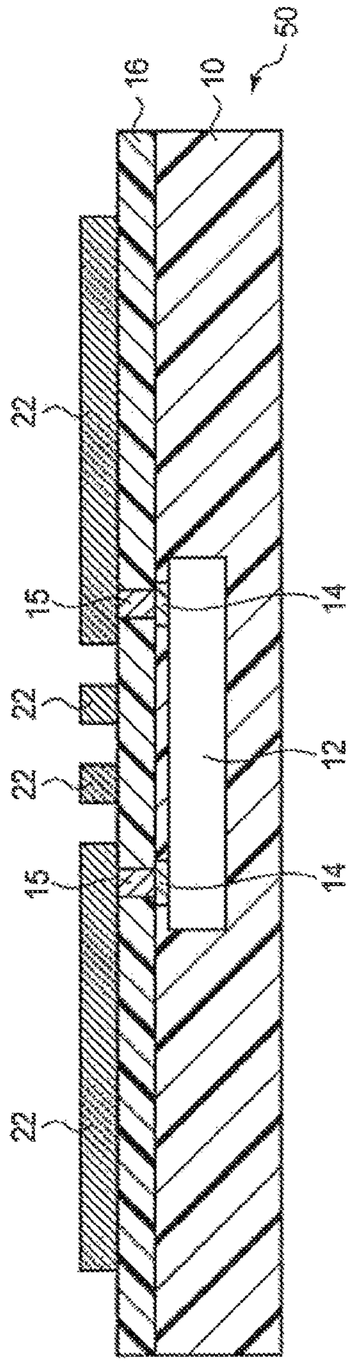
FIGS. 11A and 11B are process cross-sectional views (Part 8) illustrating a method for manufacturing the electronic apparatus according to the first embodiment.
Figure 11B:
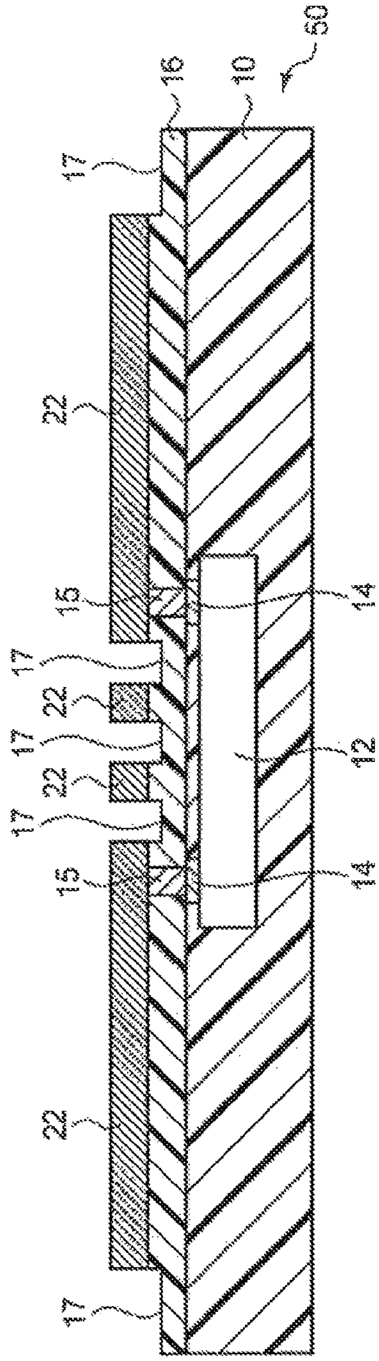
Figure 40B:
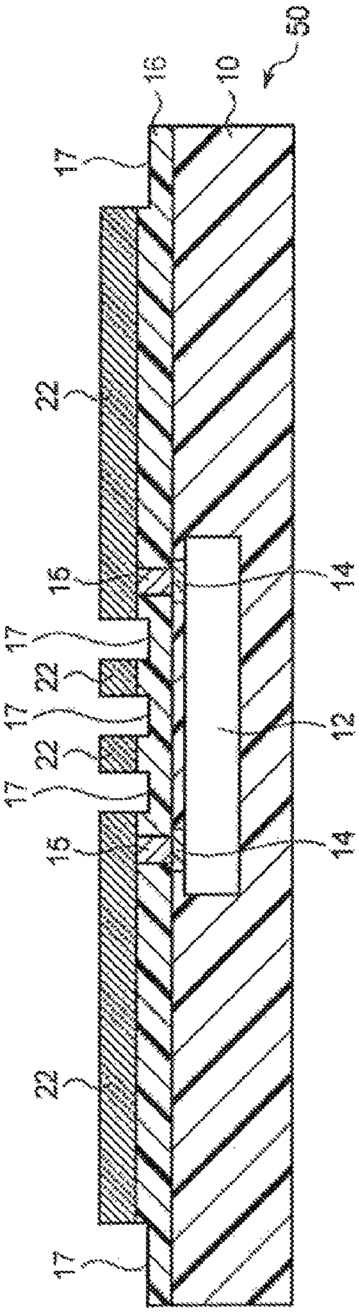

Next, in the same way as with the method for manufacturing the electronic apparatus according to the first embodiment described with reference to FIG. 11B, the insulating film 16 not covered with the wirings 22 is subjected to etching (see FIG. 40B).

Figure 41A:
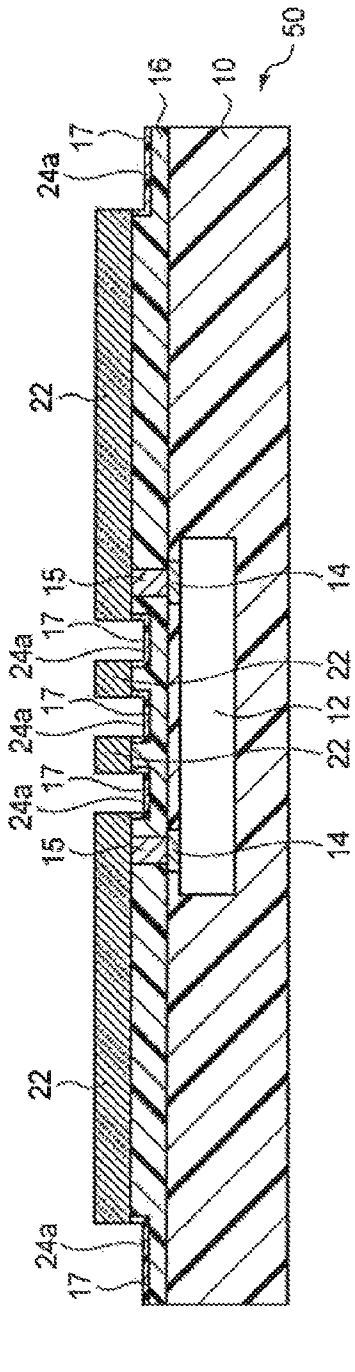
FIGS. 41A and 41B are process cross-sectional views (Part 2) illustrating the method for manufacturing the electronic apparatus according to the modification (Part 3) of the second embodiment.
Figure 41B:
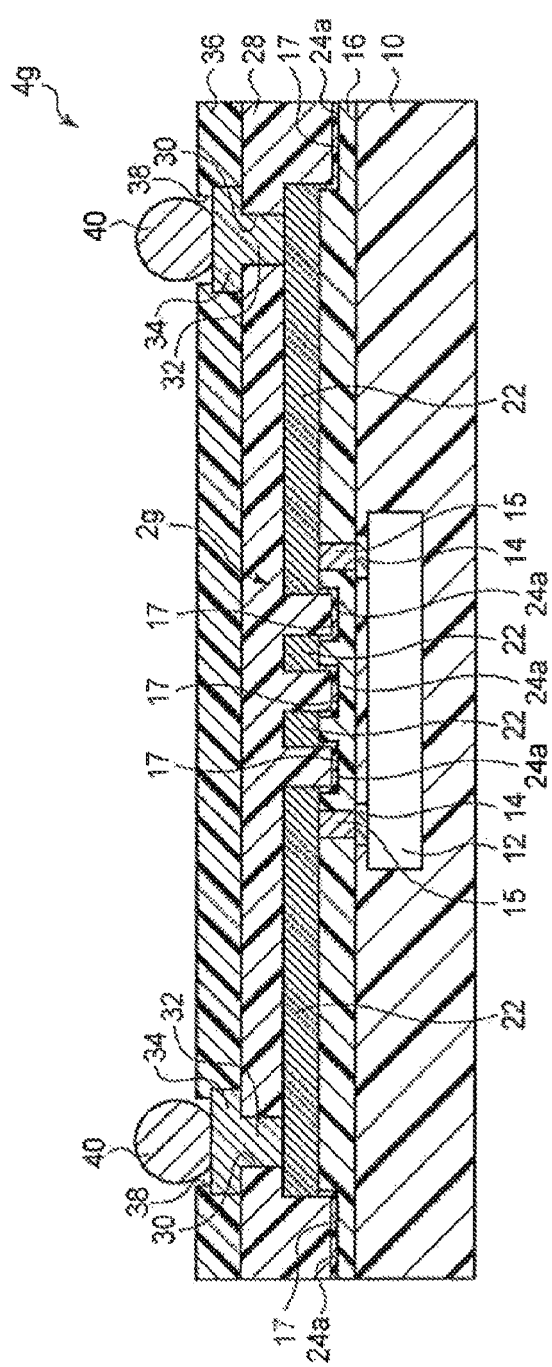

Next, in the same way as with the method for manufacturing the electronic apparatus according to the second embodiment described with reference to FIG. 30B, the inducing layer 24*a* for inducing diffusion of the constituent atoms of the wirings 22 is formed on the insulating film 16 in the region not covered with the wirings 22 (see FIG. 41A).

The method for manufacturing the electronic apparatus according to the present modification after this is the same as the method for manufacturing the electronic apparatus according to the first embodiment described with reference to FIGS. 13A through 15B, and accordingly, description thereof will be omitted. In this way, the electronic apparatus 4*g* according to the present modification having the wiring structure 2*g* is formed wherein the inducing layer 24*a* for inducing diffusion of the constituent atoms of the wirings 22 is formed on the insulating film 16 in the region not covered with the wirings 22 (see FIG. 41B).

The electronic apparatus 4*g* according to the present modification thus formed may be mounted on the circuit substrate 42 in the same way as with the method for manufacturing the electronic apparatus according to the first embodiment described with reference to FIGS. 16 and 17.

Next, the HAST test results of the wiring structure according to the present modification will be described.

The conditions for the HAST test according to the present modification were set as with the conditions for the HAST test as to the wiring structure according to the first embodiment described above.

As Example 10, a HAST test was performed on the wiring structure 2*g* according to the present modification. With Example 10, the inducing layer 24*a* was formed by damaging the surface portion of the insulating film 16 without forming the barrier film 26 for covering the upper and side faces of the wirings 22 while forming the recessed portions 17 in the insulating film 16 in the region between the multiple wirings 22. With Example 10, 50% of test samples were determined to be OK.

On the other hand, in the case of Comparative Example 5 wherein a HAST test was performed on the wiring structure where ultraviolet processing had been performed on the surface portion of the insulating film 16 without forming the barrier film 26 while forming the recessed portions 17 in the insulating film 16 in the region between the multiple wirings 22, the number of test samples determined to be OK was 0%.

Thus, the present modification also may contribute to improvement in reliability on some level. However, in the light of obtaining sufficient reliability, it is desirable to form the barrier film 26 for covering the upper and side faces of the wirings 22.

Third Embodiment

Description will be made regarding a wiring structure according to a third embodiment and a manufacturing method thereof, and an electronic apparatus and electronic apparatus manufacturing method employing the wiring structure thereof, with reference to FIGS. 42 through 45. The same components as with the wiring structure according to the first or second embodiment illustrated in FIGS. 1 through 41B and the manufacturing method thereof and so forth are denoted with the same reference numerals, and description thereof will be omitted or simplified.

(Electronic Apparatus)

Figure 42:
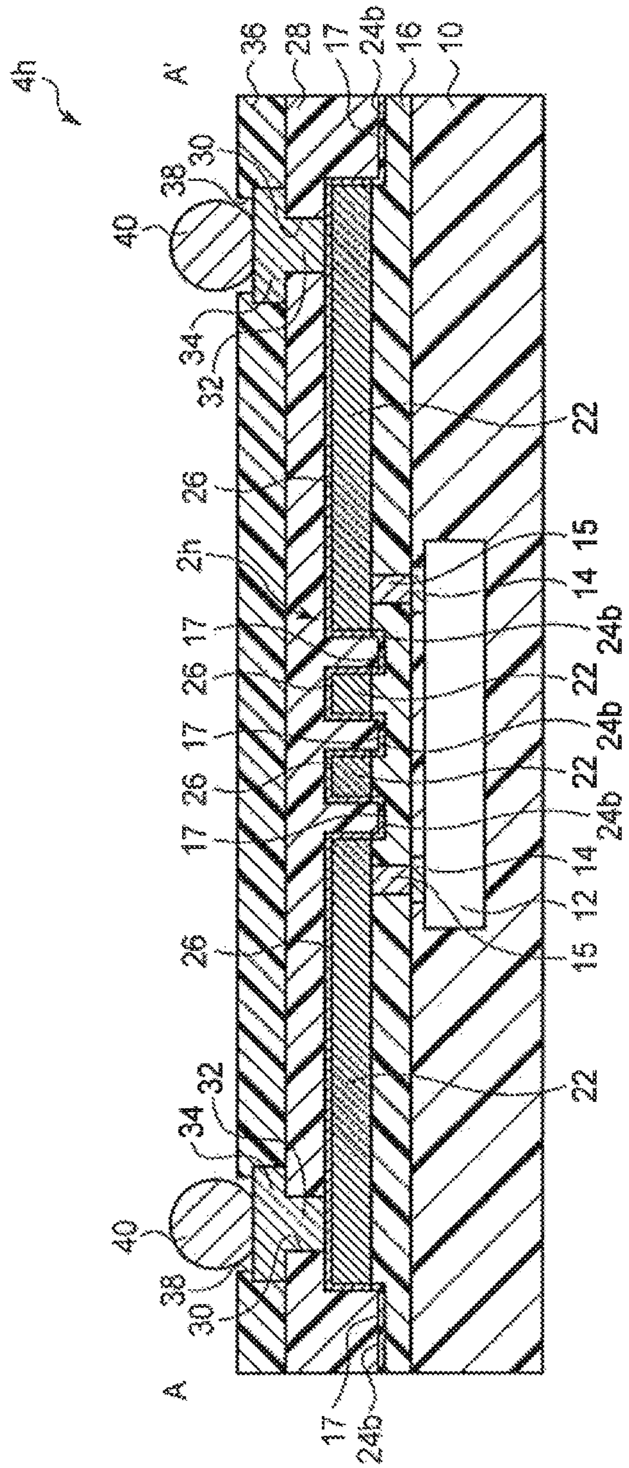
FIG. 42 is a cross-sectional view illustrating an electronic apparatus according to a third embodiment.

First, an electronic apparatus according to the present embodiment will be described with reference to FIG. 42. FIG. 42 is a cross-sectional view illustrating the electronic apparatus according to the present embodiment.

With the electronic apparatus according to the present embodiment, an inducing layer 24*b* separately from the insulating layer 16 is formed on the insulating layer 16.

The recessed portions 17 are formed in the insulating film 16 in the region between the multiple wirings 22. The depth of the recessed portions 17 is 800 nm or so, for example.

The inducing layer 24*b* for inducing diffusion of the constituent atoms (metal ions) of the wirings 22 is formed on the insulating film 16 in the region between the multiple wirings 22. In other words, the layer 24*b* whereby the constituent atoms of the wirings 22 may readily diffuse as compared to the insulating films 16 and 28 is formed on the insulating film 16 in the region between the multiple wirings 22. The inducing layer 24*b* is formed on the bottom and side portions of the recessed portions 17 formed in the insulating film 16 in the region between the multiple wirings 22. The inducing layer 24*b* is not formed by altering the surface portion of the insulating film 16, and is formed separately from the insulating film 16. The inducing layer 24*b* is a film whereby the constituent atoms of the wirings 22 may be ionized. More specifically, the inducing layer 24*b* is a film including anionic impurities. Further, specifically, the inducing layer 24*b* is a film including halogen ions. A negative-type phenol resin layer is employed here as the inducing layer 24*b*. The negative-type phenol resin is a material wherein the concentration of anionic impurities is high. Such an inducing layer 24*b* readily ionizes the constituent atoms of the wirings 22, and accordingly, the constituent atoms of the wirings 22 readily diffuse along the inducing layer 24*b*. The thickness of the inducing layer 24*b* is 10 through 100 nm or so. The concentration of halogen ions in the inducing layer 22 is 100 ppm or more, for example.

The insulation properties of the inducing layer 24*b* are lower than the insulation properties of the insulating films 15 and 28 in the same way as with the inducing layer 24 according to the first embodiment. Highness/lowness in insulation properties affects ease of movement of the constituent atoms of the wirings 22. The insulating films 16 and 28 are relatively high in insulation properties, and accordingly, the constituent atoms of the wirings 22 are relatively hard to move in the insulating films 16 and 28. On the other hand, the insulation properties of the inducing layer 24*b* is relatively low, and accordingly, the constituent atoms of the wirings 22 have relatively ease of movement in the inducing layer 24*b*.

The barrier film 26 is formed on the upper and side faces of the wirings 22 in the same way as with the electronic apparatus according to the first embodiment. In this way, an electronic apparatus 4*h* according to the present embodiment having a wiring structure 2*h* is formed wherein the inducing layer 24*b* for inducing diffusion of the constituent atoms of the wirings 22 is formed on the insulating film 16 in the region between the multiple wirings 22.

(Manufacturing Method of Electronic Apparatus)

Figure 43A:
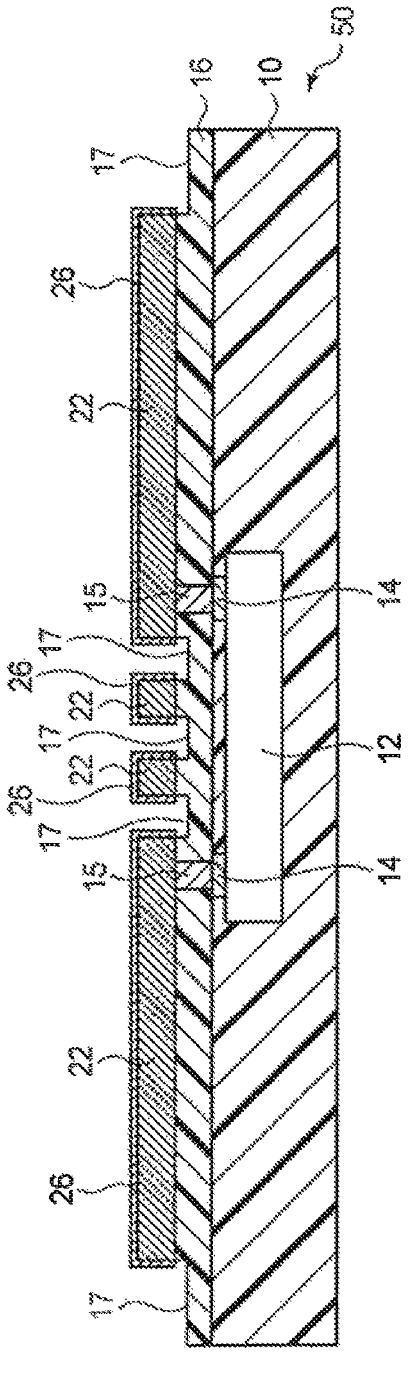
FIGS. 43A and 43B are process cross-sectional views (Part 1) illustrating a method for manufacturing the electronic apparatus according to the third embodiment.
Figure 43B:
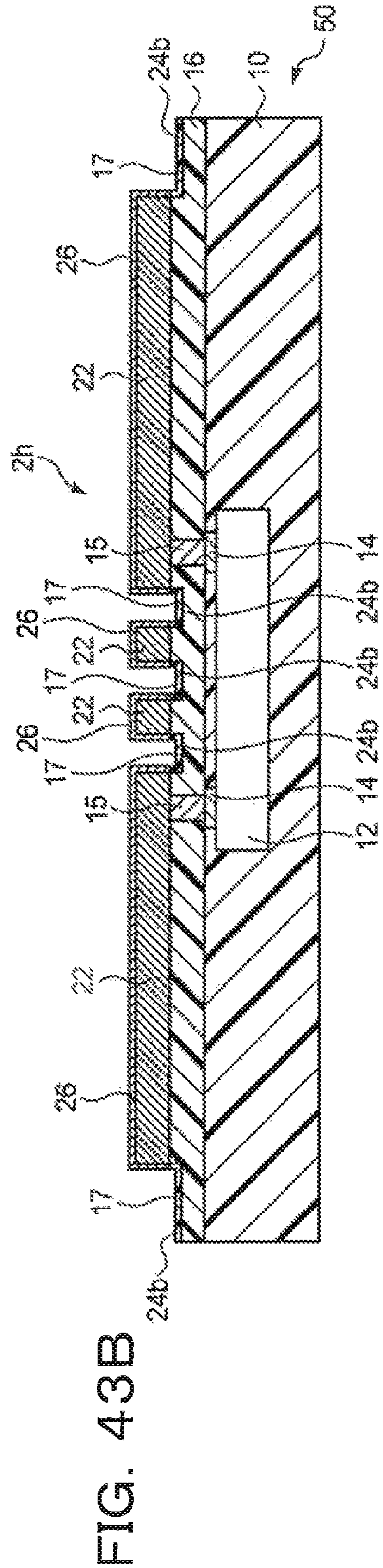
Figure 44:
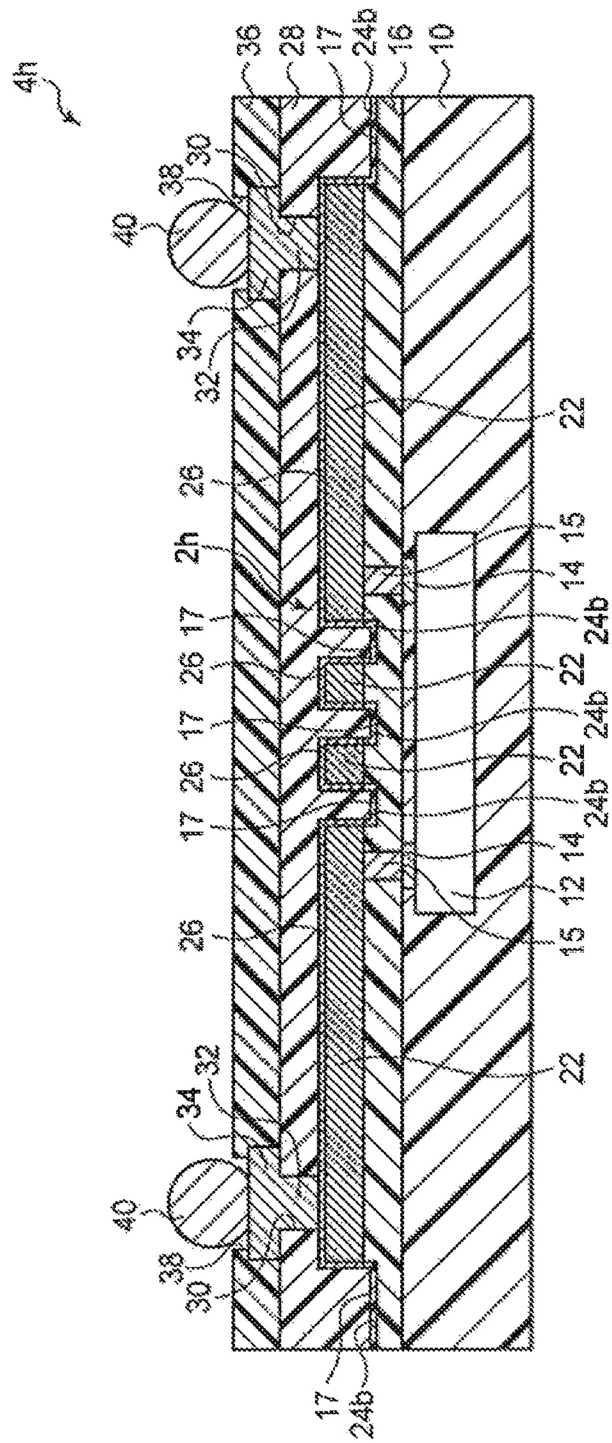
FIG. 44 is a process cross-sectional view (Part 2) illustrating the method for manufacturing the electronic apparatus according to the third embodiment.

Next, a method for manufacturing the electronic apparatus according to the present embodiment will be described with reference to FIGS. 43A through 44. FIGS. 43A through 44 are process cross-sectional views illustrating the method for manufacturing the electronic apparatus according to the present embodiment.

First, from a process for forming the adhesive layer 48 on the supporting substrate 46 to a process for forming the barrier film 26 on the upper and side faces of the wirings 22 are the same as with the method for manufacturing the electronic apparatus according to the first embodiment illustrated in FIGS. 4A through 12A, and accordingly, description thereof will be omitted (see FIG. 43A).

Next, the inducing layer 24*b* for inducing diffusion of the constituent atoms of the wirings 22 is formed on the entire surface of the structure 50 where the wirings 22 covered with the barrier film 26 are formed. That is to say, the inducing layer 24*b* whereby the constituent atoms of the wirings 22 readily diffuse as compared to the insulating films 16 and 28 is formed on the entire surface on the structure 50. Such an inducing layer 24*b* is a film whereby the constituent atoms of the wirings 22 may be ionized. More specifically, the inducing layer 24*b* is a film including anionic impurities. Further specifically, the inducing layer 24*b* is a film including halogen ions. A negative-type phenol resin layer is formed here as the inducing layer 24*b*. In the event that a negative-type phenol resin layer is employed as the material of the inducing layer 24*b*, the inducing layer 24*b* may be formed by the spray method or spin coating method, for example.

The concentration of halogen ions included in the inducing layer 24*b* is 100 ppm or more, for example. In the event that the inducing layer 24*b* is a negative-type phenol resin layer, a C1 ion is included as halogen ions. The inducing layer 24*b* including halogen ions readily ionizes the constituent atoms of the wirings 22, and accordingly, the constituent atoms of the wirings 22 readily diffuse along the inducing layer 24*b*. The thickness of the inducing layer 24*b* is 10 through 100 nm or so, for example.

Next, the inducing layer 24*b* is subjected to patterning using the photolithographic technique. Thus, the inducing layer 24*b* for inducing diffusion of the constituent atoms of the wirings 22 is formed on the insulating film 16 in the region not covered with the wirings 22 (see FIG. 43B). In this way, the wiring structure 2*h* according to the present embodiment is formed wherein the inducing layer 24*b* for inducing diffusion of the constituent atoms of the wirings 22 is formed on the insulating film 16 in the region not covered with the wirings 22.

The method for manufacturing the electronic apparatus according to the present embodiment after this is the same as the method for manufacturing the electronic apparatus according to the first embodiment described above with reference to FIGS. 13A through 15B, and accordingly, description thereof will be omitted.

In this way, the electronic apparatus 4*h* according to the present embodiment having the wiring structure 2*h* is formed wherein the inducing layer 24*b* for inducing diffusion of the constituent atoms of the wirings 22 is formed on the insulating film 16 in the region not covered with the wirings 22 (see FIG. 44).

The electronic apparatus 4*h* according to the present embodiment thus formed may be mounted on the circuit substrate 42 in the same way as with the method for manufacturing the electronic apparatus according to the first embodiment described with reference to FIGS. 16 and 17.

(Evaluation Results)

Next, evaluation results of the wiring structure according to the present embodiment will be described.

Figure 45:
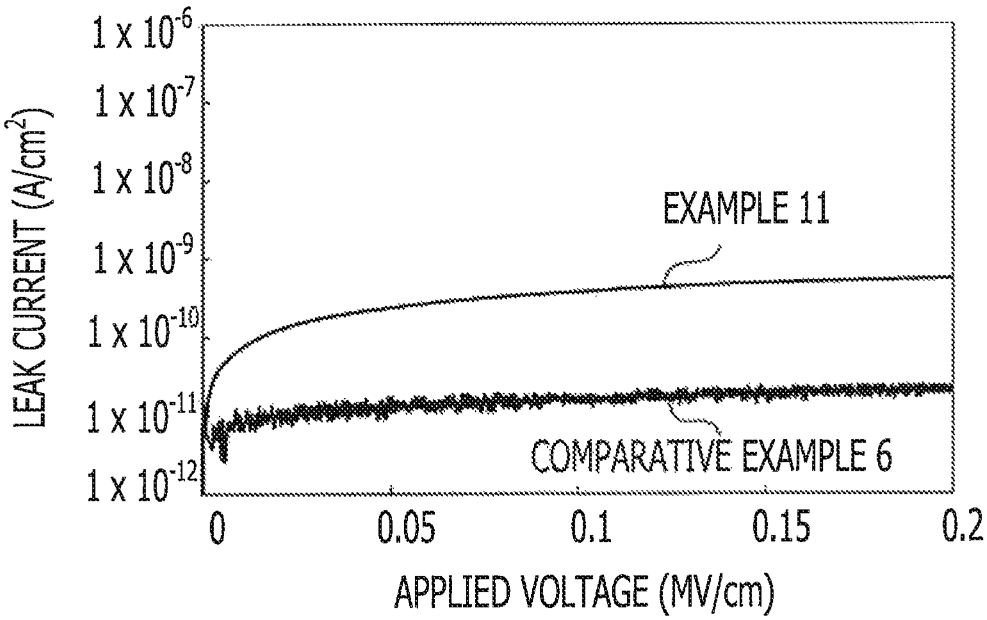
FIG. 45 is a graph (Part 3) illustrating measurement results of insulation properties.

FIG. 45 is a graph illustrating measurement results for insulation properties. The horizontal axis in FIG. 45 indicates applied voltage per increment length, and the vertical axis in FIG. 45 indicates leak current. As for the evaluation circuit, the same evaluation circuit as that of the first embodiment illustrated in FIG. 18 was employed.

Example 11 illustrated in FIG. 45 corresponds to the present embodiment. With Example 11, the insulating film 102 of the positive-type photosensitive phenol resin was formed on the silicon substrate 100.

As Comparative Example 6 the insulating film 102 of adhesion promoter (adherence accelerator, adhesion impact modifier) was formed on the silicon substrate 100. As for such an adhesion promoter, a silane coupling agent of trimethoxy aminosilane was employed.

As may be understood from FIG. 45, with Example 11, leak current is increased as compared to Comparative Example 6. Thus, according to Example 11, it may be seen that the insulating film 102 having relatively low insulation properties may be obtained.

The insulating film 102 according to Example 11 corresponds to the inducing layer 24*b* (see FIG. 42) formed on the insulating film 16 (see FIG. 42). With an insulating film having low insulation properties, the constituent atoms of the wirings 22 (see FIG. 42) readily diffuse. Accordingly, with the present embodiment as well, migration does not intensely advance at a partial portion, and migration gradually advances in an overall and even manner. Therefore, with the present embodiment as well, it may be seen that time until insulation breakdown occurs may sufficiently be prolonged, whereby the wiring structure having high reliability, and the electronic apparatus having the wiring structure thereof may be provided.

Next, the HAST test results of the wiring structure according to the present embodiment will be described.

The conditions for the HAST test according to the present embodiment were set as with the conditions for the HAST test as to the wiring structure according to the first embodiment described above.

As Example 12, a HAST test was performed on the wiring structure 2*h* according to the present embodiment, i.e., the wiring structure 2*h* wherein the inducing layer 24*b* was formed on the insulating film 16 in the region between the multiple wirings 22. With Example 12, 90% of test samples were determined to be OK.

On the other hand, in the case of Comparative Example 7 wherein a HAST test was performed on the wiring structure where the insulating film of adhesion promoter (adhesion reinforcement film) was formed on the insulating film 16 in the region between the multiple wirings 22, the number of test samples determined to be OK was a mere 5%.

As described above, it may be seen that according to the present embodiment, the wiring structure 2*h* having high reliability may be obtained.

(Modification (Part 1))

Next, description will be made regarding a wiring structure according to a modification (Part 1) of the present embodiment and a manufacturing method thereof, and an electronic apparatus employing the wiring structure thereof and a manufacturing method thereof, with reference to FIGS. 46 through 48B.

Figure 46:
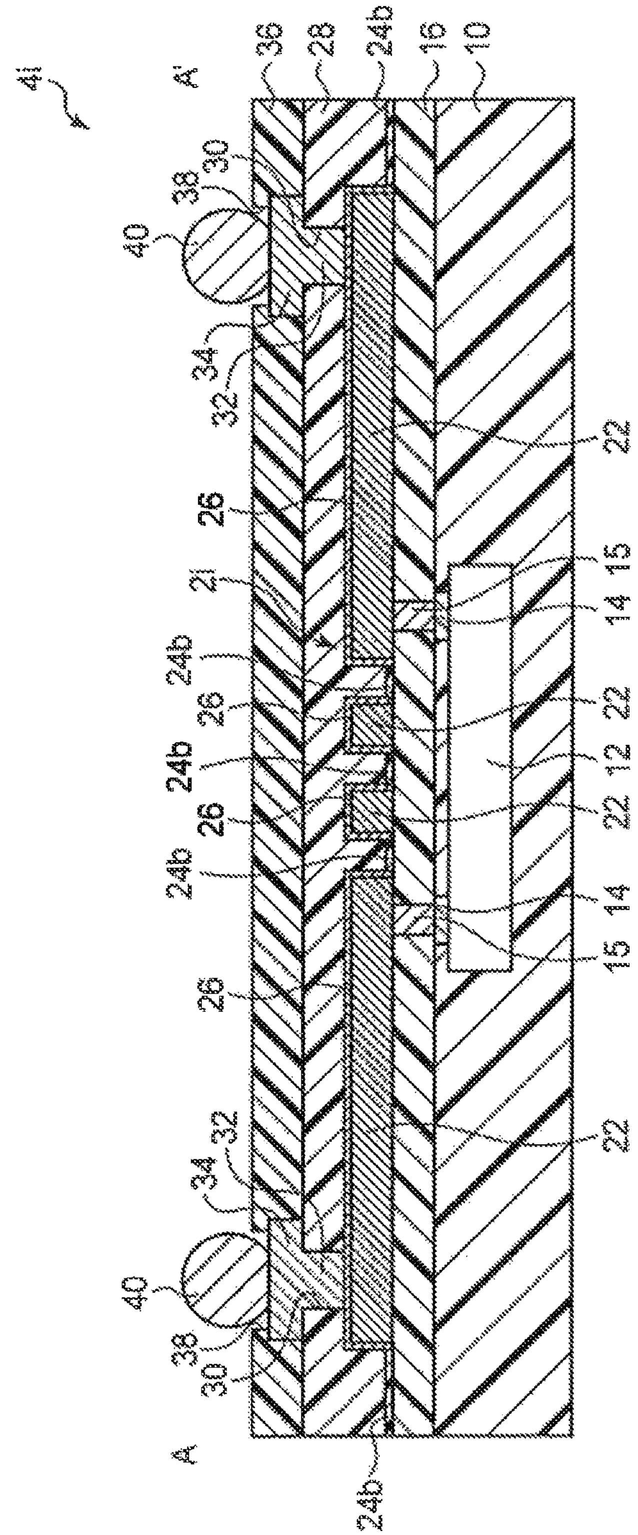
FIG. 46 is a cross-sectional view illustrating an electronic apparatus according to a modification (Part 1) of the third embodiment.

First, a wiring structure according to the present modification and an electronic apparatus having the wiring structure thereof will be described with reference to FIG. 46. FIG. 46 is a cross-sectional view illustrating the electronic apparatus according to the present modification.

The electronic apparatus according to the present modification is an electronic apparatus wherein the recessed portions 17 are not formed in the insulating film 16 in the region between the multiple wirings 22.

As illustrated in FIG. 46, with the present modification, the recessed portions 17 (see FIG. 42) are not formed in the insulating film 16 in the region between the multiple wirings 22.

In this way, the inducing layer 24*b* for inducing diffusion of the constituent atoms of the wirings 22 is formed on the insulating film 16 in the region between the multiple wirings 22.

In this way, a wiring structure 2*i* according to the present modification is formed wherein the inducing layer 24*b* for inducing diffusion of the constituent atoms of the wirings 22 is formed on the insulating film 16 in the region between the multiple wirings 22.

As described above, an arrangement may be made wherein the recessed portions 17 are not formed in the insulating film 16 in the region between the multiple wirings 22.

With the present modification as well, the inducing layer 24*b* is formed on the insulating film 16 in the region between the multiple wirings 22, and accordingly, migration does not intensely advance at a partial portion, and migration gradually advances in an overall and even manner. Therefore, with the present modification as well, time until insulation breakdown occurs may sufficiently be prolonged, whereby the wiring structure having high reliability, and the electronic apparatus having the wiring structure thereof may be provided.

Next, a method for manufacturing the electronic apparatus according to the present modification will be described with reference to FIGS. 47A through 48B. FIGS. 47A through 48B are process cross-sectional views illustrating the method for manufacturing the electronic apparatus according to the present modification.

Figure 47A:
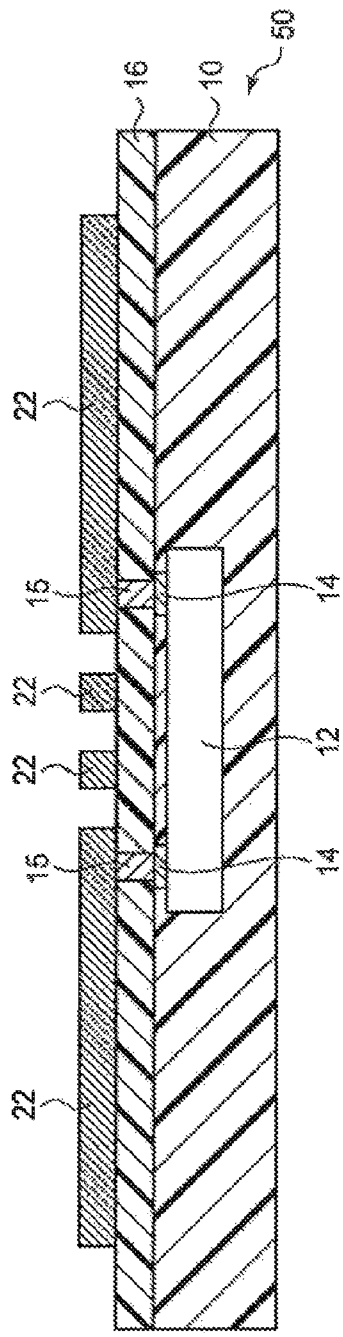
FIGS. 47A and 47B are process cross-sectional views (Part 1) illustrating a method for manufacturing the electronic apparatus according to the modification (Part 1) of the third embodiment.

First, from a process for forming the adhesive layer 48 on the supporting substrate 46 to a process for subjecting the seed layer 58 and so forth exposed around the wirings 22 to etching are the same as with the method for manufacturing the electronic apparatus according to the first embodiment illustrated in FIGS. 4A through 11A, and accordingly, description thereof will be omitted (see FIG. 47A).

Figure 47B:
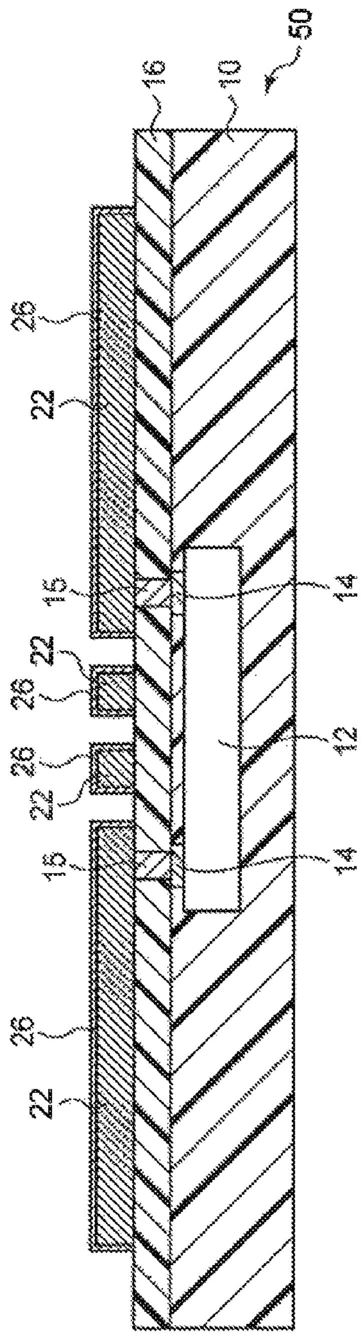

Next, in the same way as with the method for manufacturing the electronic apparatus according to the first embodiment described above with reference to FIG. 12A, the barrier film 26 is formed on the upper and side faces of the wirings 22 (see FIG. 47B).

Figure 48A:
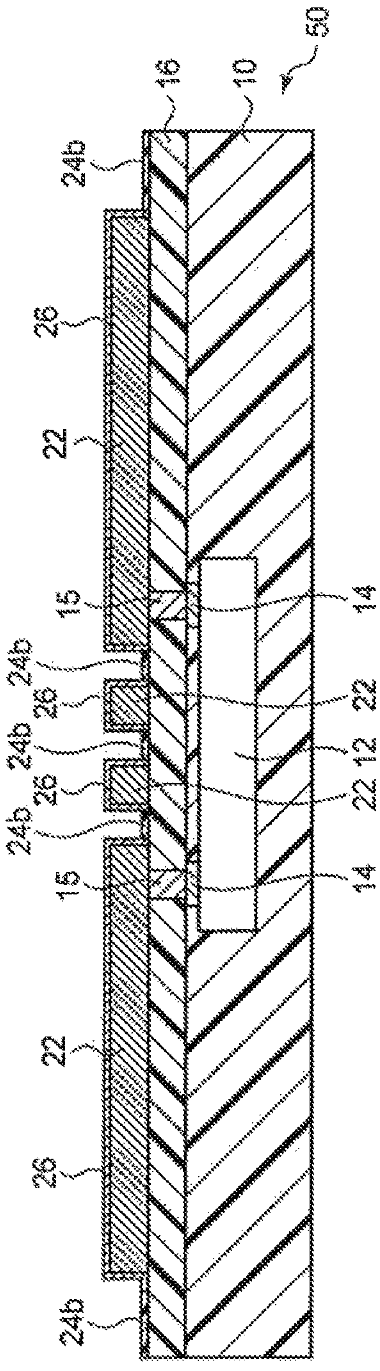
FIGS. 48A and 48B are process cross-sectional views (Part 2) illustrating the method for manufacturing the electronic apparatus according to the modification (Part 1) of the third embodiment.

Next, in the same way as with the method for manufacturing the electronic apparatus according to the third embodiment described above with reference to FIG. 43B, the inducing layer 24*b* for inducing diffusion of the constituent atoms of the wirings 22 is formed on the insulating film 16 in the region not covered with the wirings 22 (see FIG. 48A).

The method for manufacturing the electronic apparatus according to the present modification after this is the same as the method for manufacturing the electronic apparatus according to the first embodiment described above with reference to FIGS. 13A through 15B, and accordingly, description thereof will be omitted.

Figure 48B:
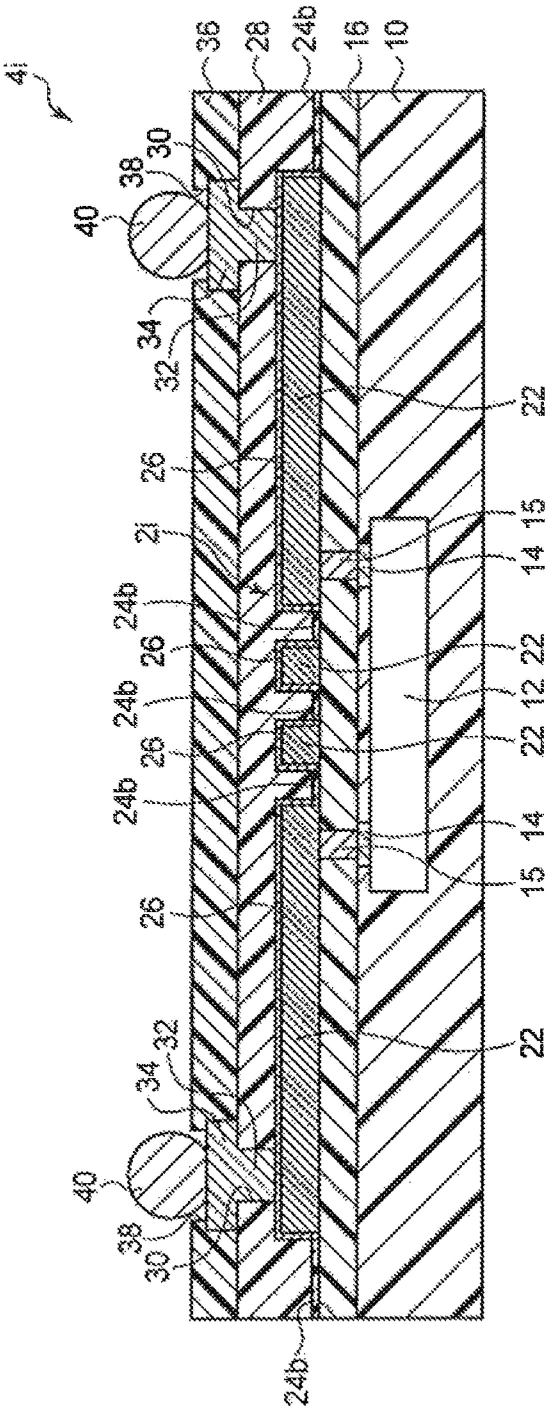

In this way, an electronic apparatus 4*i* according to the present modification having a wiring structure 2*i* is formed wherein the inducing layer 24*b* for inducing diffusion of the constituent atoms of the wirings 22 is formed on the insulating film 16 in the region not covered with the wirings 22 (see FIG. 48B).

The electronic apparatus 4*i* according to the present modification thus formed may be mounted on the circuit substrate 42 in the same way as with the method for manufacturing the electronic apparatus according to the first embodiment described with reference to FIGS. 16 and 17.

Next, the HAST test results of the wiring structure according to the present modification will be described.

The conditions for the HAST test according to the present modification were set as with the conditions for the HAST test as to the wiring structure according to the first embodiment described above.

As Example 13, a HAST test was performed on the wiring structure 2*i* according to the present modification. With Example 13, the inducing layer 24*b* was formed on the insulating film 16 in the region between the multiple wirings 22 without forming the recessed portions 17 in the insulating film 16 in the region between the multiple wirings 22. With Example 13, 60% of test samples were determined to be OK.

On the other hand, in the case of Comparative Example 8 wherein a HAST test was performed on the wiring structure where an adhesion reinforcement film was formed on the insulating film 16 without forming the recessed portions 17 in the insulating film 16 in the region between the multiple wirings 22, the number of test samples determined to be OK was 0%.

Thus, it may be seen that with the present modification as well, reliability is obtained on some level. However, in the light of obtaining sufficient reliability, it is desirable to form the recessed portions 17 in the insulating film 16 in the region between the multiple wirings 22.

(Modification (Part 2))

Next, description will be made regarding a wiring structure according to a modification (Part 2) of the present embodiment and a manufacturing method thereof, and an electronic apparatus employing the wiring structure thereof and a manufacturing method thereof, with reference to FIGS. 49 through 51.

First, a wiring structure according to the present modification and an electronic apparatus having the wiring structure thereof will be described with reference to FIG. 49. FIG. 49 is a cross-sectional view illustrating the electronic apparatus according to the present modification.

The electronic apparatus according to the present modification is an electronic apparatus wherein the recessed portions 17 are not formed in the insulating film 16 in the region between the multiple wirings 22, and the barrier film 26 for covering the upper and side faces of the wirings 22 is not formed.

Figure 49:
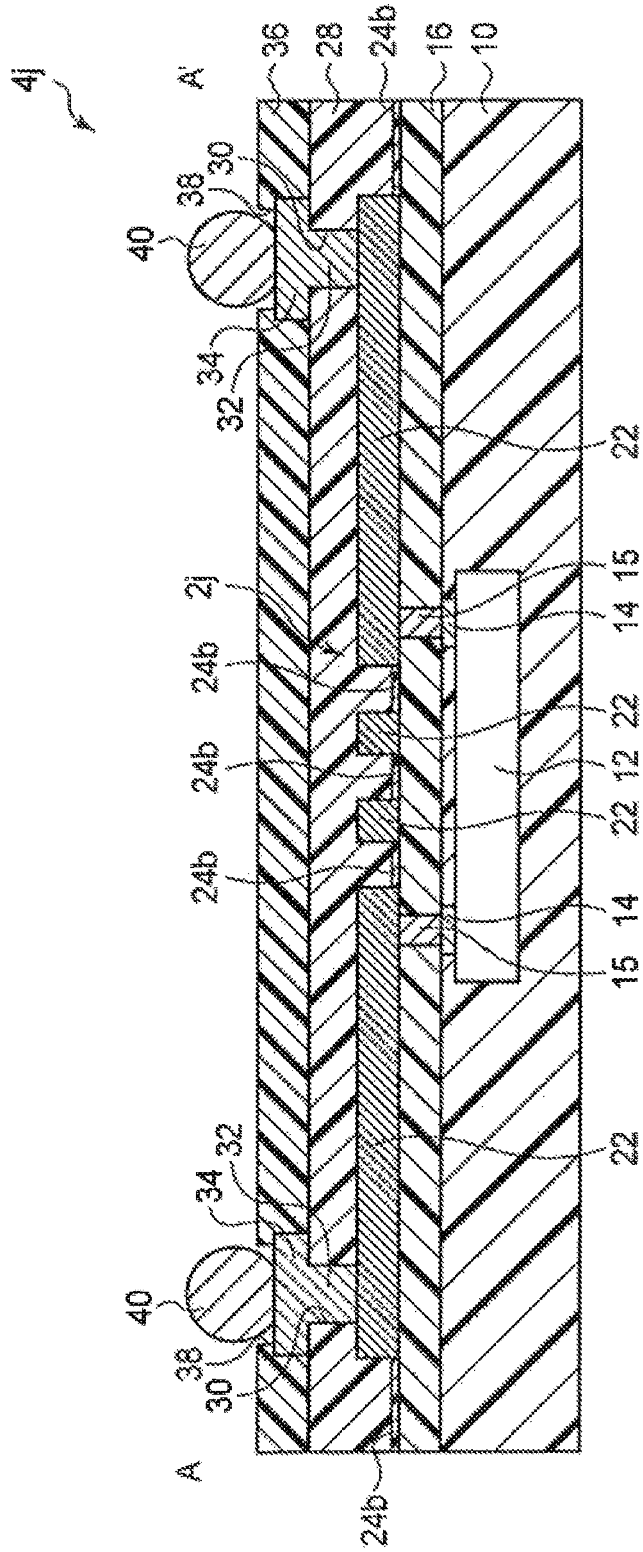
FIG. 49 is a cross-sectional view illustrating an electronic apparatus according to a modification (Part 2) of the third embodiment.
Figure 50A:
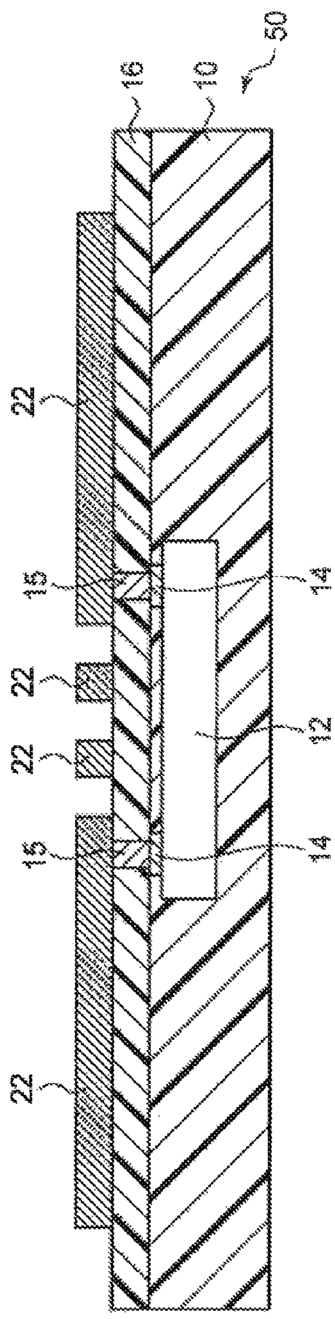
FIGS. 50A and 50B are process cross-sectional views (Part 1) illustrating a method for manufacturing the electronic apparatus according to the modification (Part 2) of the third embodiment.

As illustrated in FIG. 49, with the present modification, the recessed portions 17 (see FIG. 42) are not formed in the insulating film 16 in the region between the multiple wirings 22.

The inducing layer 24*b* for inducing diffusion of the constituent atoms of the wirings 22 is formed on the insulating film 16 in the region between the multiple wirings 22.

With the present modification, the barrier film 26 (see FIG. 42) for covering the upper and side faces of the wirings 22 is not formed.

In this way, an electronic apparatus 4*j* according to the present modification having a wiring structure 2*j* is formed wherein the inducing layer 24*b* for inducing diffusion of the constituent atoms of the wirings 22 is formed on the insulating film 16 in the region between the multiple wirings 22.

As described above, an arrangement may be made wherein the recessed portions 17 is not formed in the insulating film 16 in the region between the multiple wirings 22, and also the barrier film 26 for covering the upper and side faces of the wirings 22 is not formed.

With the present modification as well, the inducing layer 24*b* is formed on the insulating film 16 in the region between the multiple wirings 22, and accordingly, migration does not intensely advance at a partial portion, and migration gradually advances in an overall and even manner. Therefore, with the present embodiment as well, time until insulation breakdown occurs may sufficiently be prolonged, which contributes to improvement in reliability.

Next, a method for manufacturing the electronic apparatus according to the present modification will be described with reference to FIGS. 50A through 51. FIGS. 50A through 51 are process cross-sectional views illustrating the method for manufacturing the electronic apparatus according to the present modification.

First, from a process for forming the adhesive layer 48 on the supporting substrate 46 to a process for subjecting the seed layer 58 and so forth exposed around the wirings 22 to etching are the same as with the method for manufacturing the electronic apparatus according to the first embodiment illustrated in FIGS. 4A through 11A, and accordingly, description thereof will be omitted (see FIG. 50A).

Figure 50B:
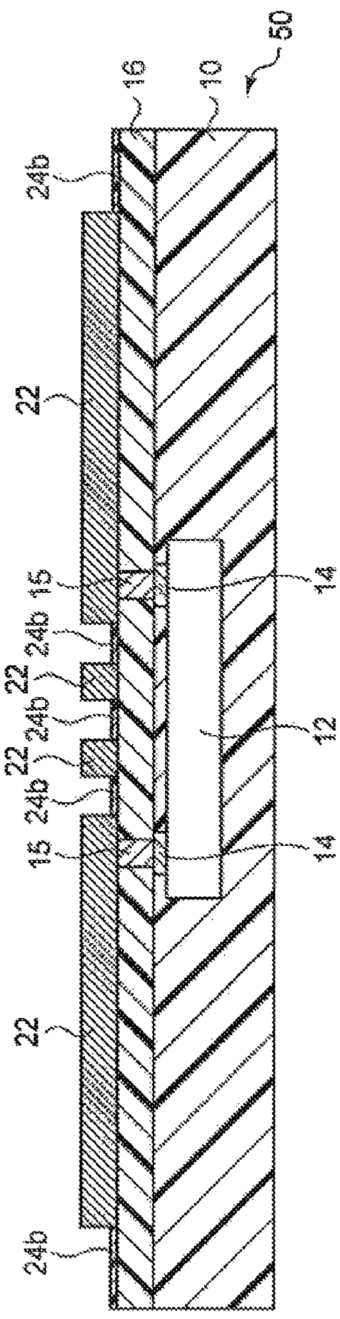
Figure 51:
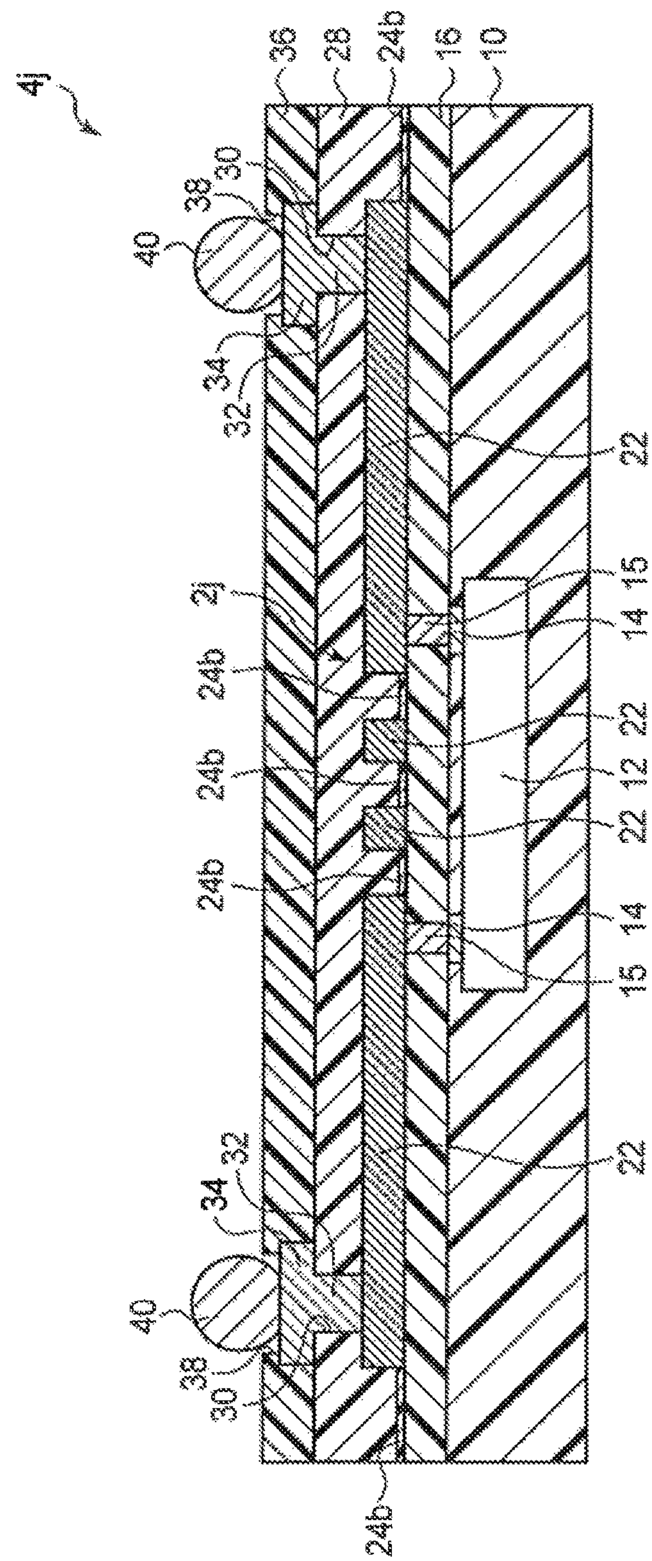
FIG. 51 is a process cross-sectional view (Part 2) illustrating the method for manufacturing the electronic apparatus according to the modification (Part 2) of the third embodiment.

Next, in the same way as with the method for manufacturing the electronic apparatus according to the third embodiment described above with reference to FIG. 43B, the inducing layer 24*b* for inducing diffusion of the constituent atoms of the wirings 22 is formed on the insulating film 16 in the region not covered with the wirings 22 (see FIG. 50B).

The method for manufacturing the electronic apparatus according to the present modification after this is the same as the method for manufacturing the electronic apparatus according to the first embodiment described above with reference to FIGS. 13A through 15B, and accordingly, description thereof will be omitted. In this way, an electronic apparatus 4*j* according to the present modification having a wiring structure 2*j* is formed wherein the inducing layer 24*b* for inducing diffusion of the constituent atoms of the wirings 22 is formed on the insulating film 16 in the region not covered with the wirings 22 (see FIG. 51).

The electronic apparatus 4*j* according to the present modification thus formed may be mounted on the circuit substrate 42 in the same way as with the method for manufacturing the electronic apparatus according to the first embodiment described with reference to FIGS. 16 and 17.

Next, the HAST test results of the wiring structure according to the present modification will be described.

The conditions for the HAST test according to the present modification were set as with the conditions for the HAST test as to the wiring structure according to the first embodiment described above.

As Example 14, a HAST test was performed on the wiring structure 2*i* according to the present modification. With Example 14, the inducing layer 24*b* of a negative-type phenol resin was formed on the insulating film 16 without forming the recessed portions 17 in the insulating film 16 in the region between the multiple wirings 22, and without forming the barrier film 26 for covering the upper and side faces of the wirings 22. With Example 14, 10% of test samples were determined to be OK.

On the other hand, in the case of Comparative Example 9 wherein a HAST test was performed on the wiring structure where an adhesion reinforcement film was formed on the insulating film 16 without forming the recessed portions 17 in the insulating film 16 in the region between the multiple wirings 22, and without forming the barrier film 26, the number of test samples determined to be OK was 0%.

Thus, it may be seen that the present modification also may contribute to improvement in reliability on some level. However, in the light of obtaining sufficient reliability, it is desirable to form the recessed portions 17 in the insulating film 16 in the region between the multiple wirings 22, and to form the barrier film 26 for covering the upper and side faces of the wirings 22.

(Modification (Part 3))

Next, description will be made regarding a wiring structure according to a modification (Part 3) of the present embodiment and a manufacturing method thereof, and an electronic apparatus employing the wiring structure thereof and a manufacturing method thereof, with reference to FIGS. 52 through 54B.

Figure 52:
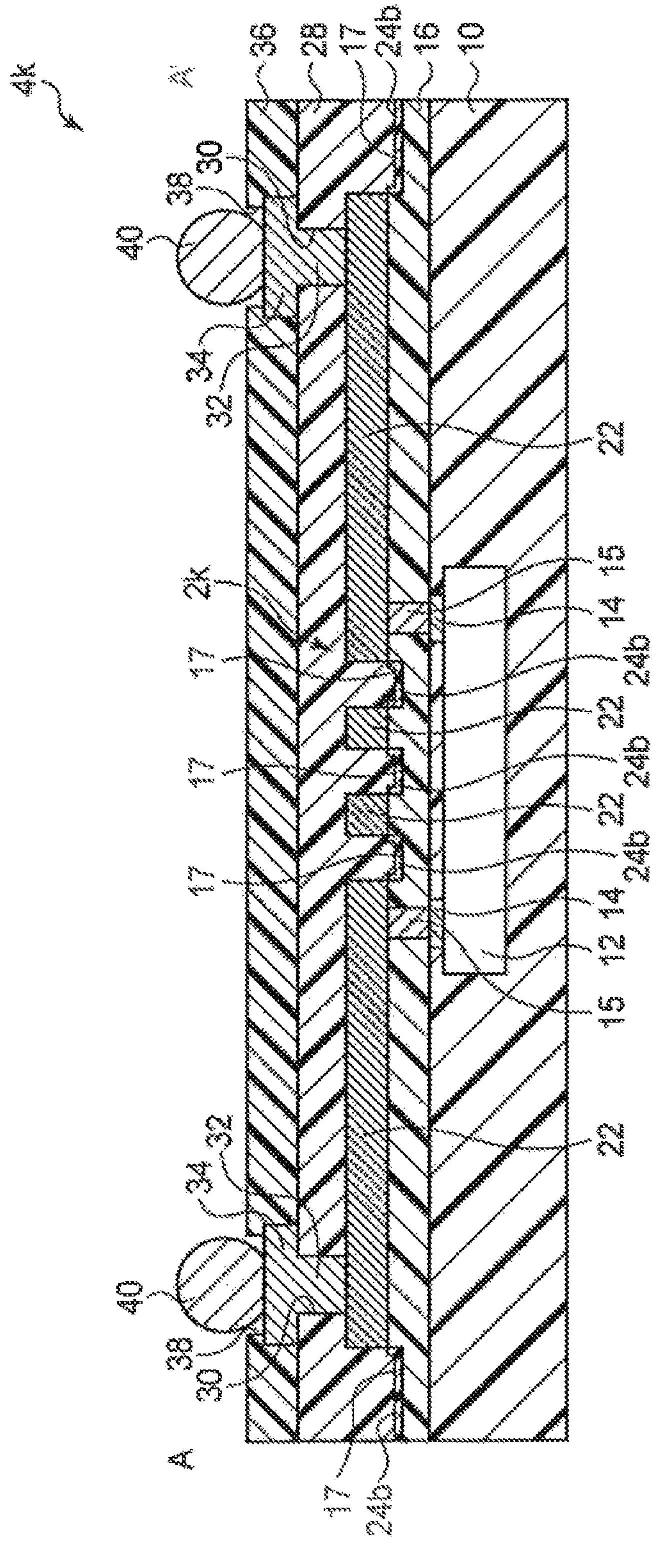
FIG. 52 is a cross-sectional view illustrating an electronic apparatus according to a modification (Part 3) of the third embodiment.

First, a wiring structure according to the present modification and an electronic apparatus having the wiring structure thereof will be described with reference to FIG. 52. FIG. 52 is a cross-sectional view illustrating the electronic apparatus according to the present modification.

The electronic apparatus according to the present modification is an electronic apparatus wherein while the recessed portions 17 are formed in the insulating film 16 in the region between the multiple wirings 22, the barrier film 26 for covering the upper and side faces of the wirings 22 is not formed.

As illustrated in FIG. 52, with the present modification, the recessed portions 17 are formed in the insulating film 16 in the region between the multiple wirings 22.

The inducing layer 24*b* for inducing diffusion of the constituent atoms of the wirings 22 is formed on the insulating film 16 in the region between the multiple wirings 22.

With the present modification, the barrier film 26 (see FIG. 42) for covering the upper and side faces of the wirings 22 is not formed. In this way, an electronic apparatus 4*k* having a wiring structure 2*k* is formed wherein the inducing layer 24*b* for inducing diffusion of the constituent atoms of the wirings 22 is formed on the insulating film 16 in the region between the multiple wirings 22.

As described above, an arrangement may be made wherein while the recessed portions 17 is formed in the insulating film 16 in the region between the multiple wirings 22, the barrier film 26 for covering the upper and side faces of the wirings 22 is not formed.

With the present modification as well, the inducing layer 24*b* is formed on the insulating film 16 in the region between the multiple wirings 22, and accordingly, migration does not intensely advance at a partial portion, and migration gradually advances in an overall and even manner. Therefore, with the present modification as well, time until insulation breakdown occurs may sufficiently be prolonged, which contributes to improvement in reliability.

Next, a method for manufacturing the electronic apparatus according to the present modification will be described with reference to FIGS. 53A through 54B. FIGS. 53A through 54B are process cross-sectional views illustrating the method for manufacturing the electronic apparatus according to the present modification.

Figure 53A:
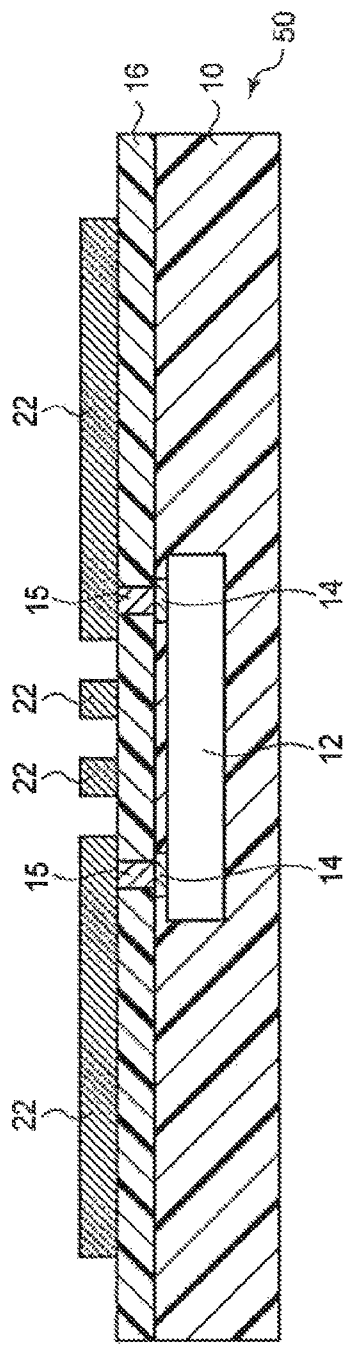
FIGS. 53A and 53B are process cross-sectional views (Part 1) illustrating a method for manufacturing the electronic apparatus according to the modification (Part 3) of the third embodiment.

First, from a process for forming the adhesive layer 48 on the supporting substrate 46 to a process for subjecting the seed layer 58 and so forth exposed around the wirings 22 to etching are the same as with the method for manufacturing the electronic apparatus according to the first embodiment illustrated in FIGS. 4A through 11A, and accordingly, description thereof will be omitted (see FIG. 53A).

Figure 53B:
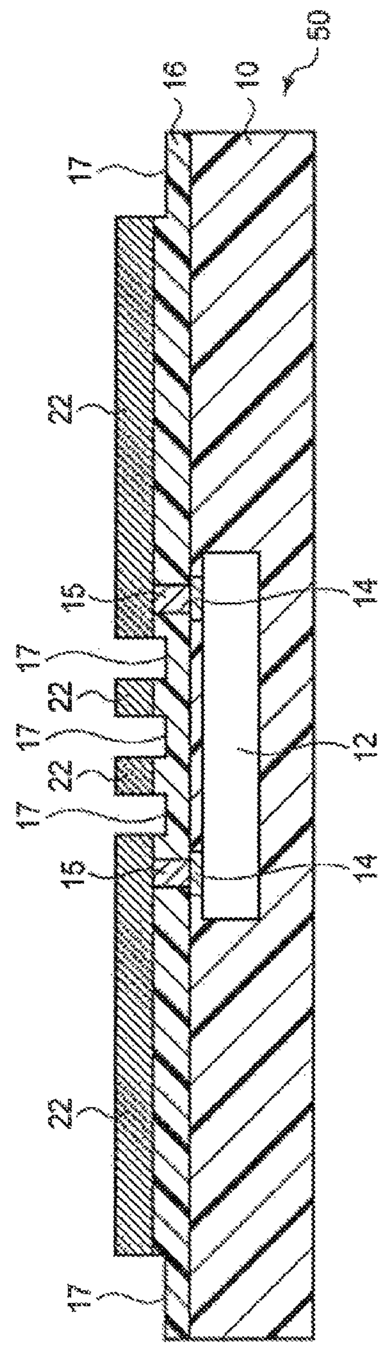

Next, in the same way as with the method for manufacturing the electronic apparatus according to the first embodiment described with reference to FIG. 11B, the insulating film 16 in the region not covered with the wirings 22 is subjected to etching (see FIG. 53B).

Figure 54A:
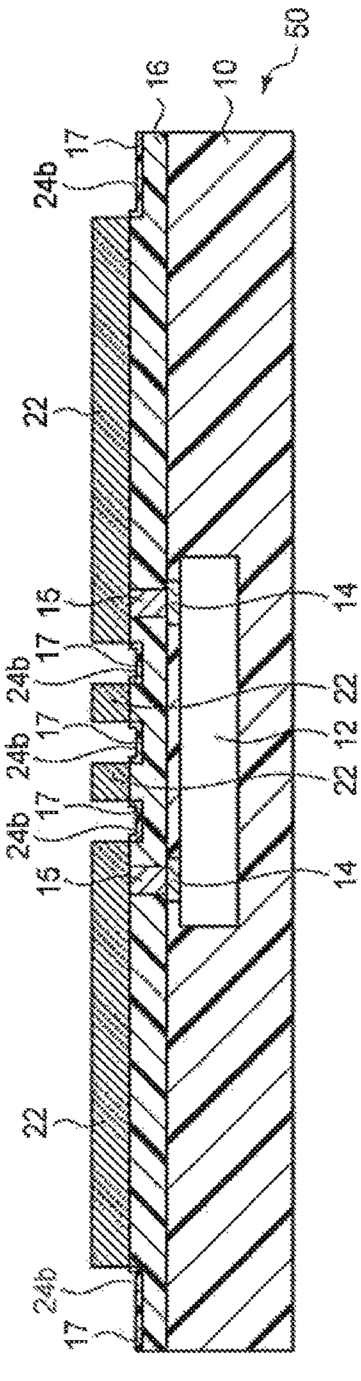
FIGS. 54A and 54B are process cross-sectional views (Part 2) illustrating the method for manufacturing the electronic apparatus according to the modification (Part 3) of the third embodiment.

Next, in the same way as with the method for manufacturing the electronic apparatus according to the second embodiment described with reference to FIG. 30B, the inducing layer 24*b* for inducing diffusion of the constituent atoms of the wirings 22 is formed on the insulating film 16 in the region not covered with the wirings 22 (see FIG. 54A).

The method for manufacturing the electronic apparatus according to the present modification after this is the same as the method for manufacturing the electronic apparatus according to the first embodiment described with reference to FIGS. 13A through 15B, and accordingly, description thereof will be omitted.

Figure 54B:
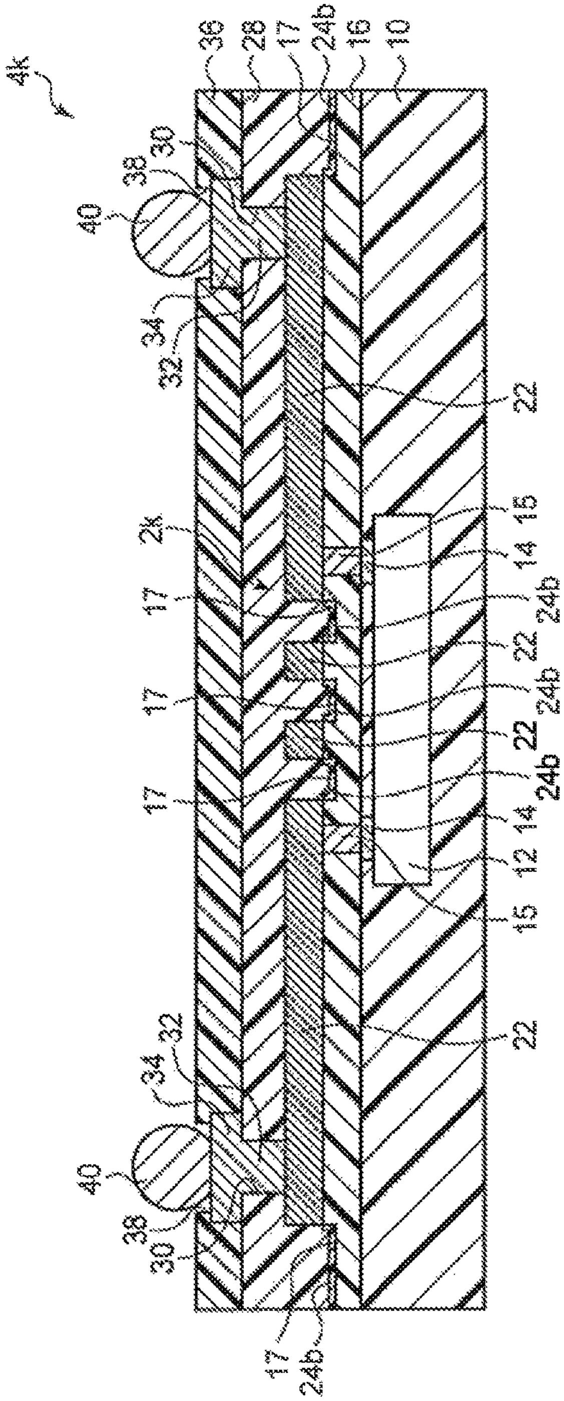

In this way, the electronic apparatus 4*k* according to the present modification having the wiring structure 2*k* is formed wherein the inducing layer 24*b* for inducing diffusion of the constituent atoms of the wirings 22 is formed on the insulating film 16 in the region not covered with the wirings 22 (see FIG. 54B).

The electronic apparatus 4*k* thus formed may be mounted on the circuit substrate 42 in the same way as with the method for manufacturing the electronic apparatus according to the first embodiment described with reference to FIGS. 16 and 17.

Next, the HAST test results of the wiring structure according to the present modification will be described.

The conditions for the HAST test according to the present modification were set as with the conditions for the HAST test as to the wiring structure according to the first embodiment described above.

As Example 15, a HAST test was performed on the wiring structure according to the present modification. With Example 15, the inducing layer 24*b* was formed on the insulating film 16 without forming the barrier film 26 for covering the upper and side faces of the wirings 22 while forming the recessed portions 17 in the insulating film 16 in the region between the multiple wirings 22. With Example 15, 40% of test samples were determined to be OK.

On the other hand, in the case of Comparative Example 10 wherein a HAST test was performed on the wiring structure where an adhesion reinforcement film was formed on the insulating film 16 without forming the barrier film 26 while forming the recessed portions 17 in the insulating film 16 in the region between the multiple wirings 22, the number of test samples determined to be OK was 0%.

Thus, the present modification also may contribute to improvement in reliability on some level. However, in the light of obtaining sufficient reliability, it is desirable to form the barrier film 26 for covering the upper and side faces of the wirings 22.

Fourth Embodiment

Description will be made regarding a wiring structure according to a fourth embodiment and a manufacturing method thereof, and an electronic apparatus and electronic apparatus manufacturing method employing the wiring structure thereof, with reference to FIGS. 55 through 58. The same components as with the wiring structure according to the first through third embodiments illustrated in FIGS. 1 through 54B and the manufacturing method thereof and so forth are denoted with the same reference numerals, and description thereof will be omitted or simplified.

(Electronic Apparatus)

Figure 55:
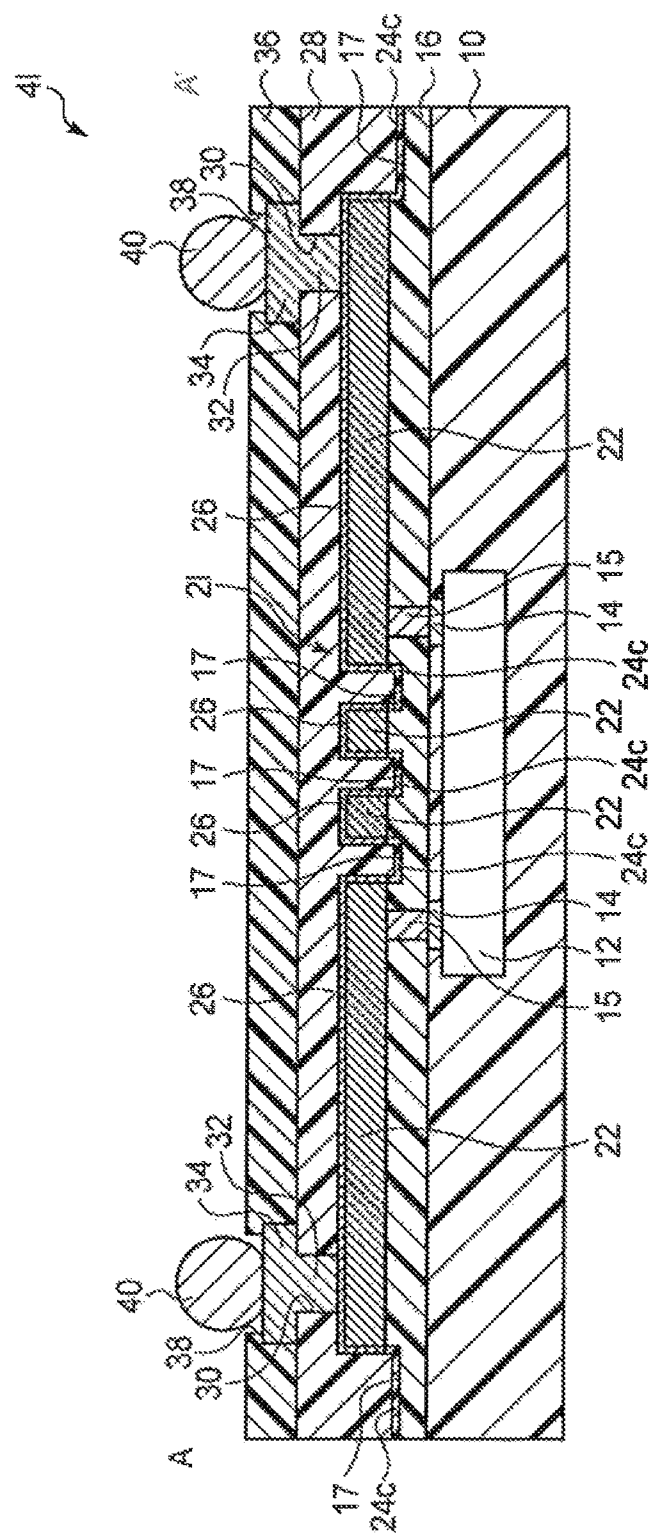
FIG. 55 is a cross-sectional view illustrating an electronic apparatus according to a fourth embodiment.

First, an electronic apparatus according to the present embodiment will be described with reference to FIG. 55. FIG. 55 is a cross-sectional view illustrating the electronic apparatus according to the present embodiment.

With the electronic apparatus according to the present embodiment, an inducing layer 24*c* of a material with relatively high hygroscopicity is formed on the insulating layer 16.

The recessed portions 17 are formed in the insulating film 16 in the region between the multiple wirings 22 in the same way as with the electronic apparatus according to the first embodiment. The depths of the recessed portions 17 is 800 nm or so, for example.

The inducing layer 24*c* for inducing diffusion of the constituent atoms of the wirings 22 is formed on the insulating film 16 in the region between the multiple wirings 22. In other words, the layer 24*c* whereby the constituent atoms of the wirings 22 may readily diffuse as compared to the insulating films 16 and 28 is formed on the insulating film 16 in the region between the multiple wirings 22. The inducing layer 24*c* is formed on the bottom and side portions of the recessed portions 17 formed in the insulating film 16 in the region between the multiple wirings 22. The inducing layer 24*c* is not formed by altering the surface portion of the insulating film 16, and is formed separately from the insulating film 16. The inducing layer 24*c* is formed of a material with relatively high hygroscopicity. More specifically, the inducing layer 24*b* is a film including polyacrylic acid. Further specifically, the inducing layer 24*c* is a film formed with a polyacrylic surface activating agent. A polyacrylic material is a material having relatively high hygroscopicity. Such an inducing layer 24*c* readily takes the constituent atoms of the wirings 22 therein, and accordingly, the constituent atoms of the wirings 22 readily diffuse within the inducing layer 24*c*. The thickness of the inducing layer 24*c* is 10 through 100 nm or so, for example.

The insulation properties of the inducing layer 24*c* are lower than the insulation properties of the insulating films 16 and 28 in the same way as with the inducing layer 24 according to the first embodiment. Highness/lowness in insulation properties affects ease of movement of the constituent atoms of the wirings 22. The insulating films 16 and 28 are relatively high in insulation properties, and accordingly, the constituent atoms of the wirings 22 are relatively hard to move in the insulating films 16 and 28. On the other hand, the insulation properties of the inducing layer 24*c* are relatively low, and accordingly, the constituent atoms of the wirings 22 have relatively ease of movement in the inducing layer 24*c*.

The barrier film 26 is formed on the upper and side faces of the wirings 22 in the same way as with the electronic apparatus according to the first embodiment. In this way, an electronic apparatus 4*l* according to the present embodiment having a wiring structure 2*l* is formed wherein the inducing layer 24*c* for inducing diffusion of the constituent atoms of the wirings 22 is formed on the insulating film 16 in the region between the multiple wirings 22.

(Manufacturing Method of Electronic Apparatus)

Figure 56A:
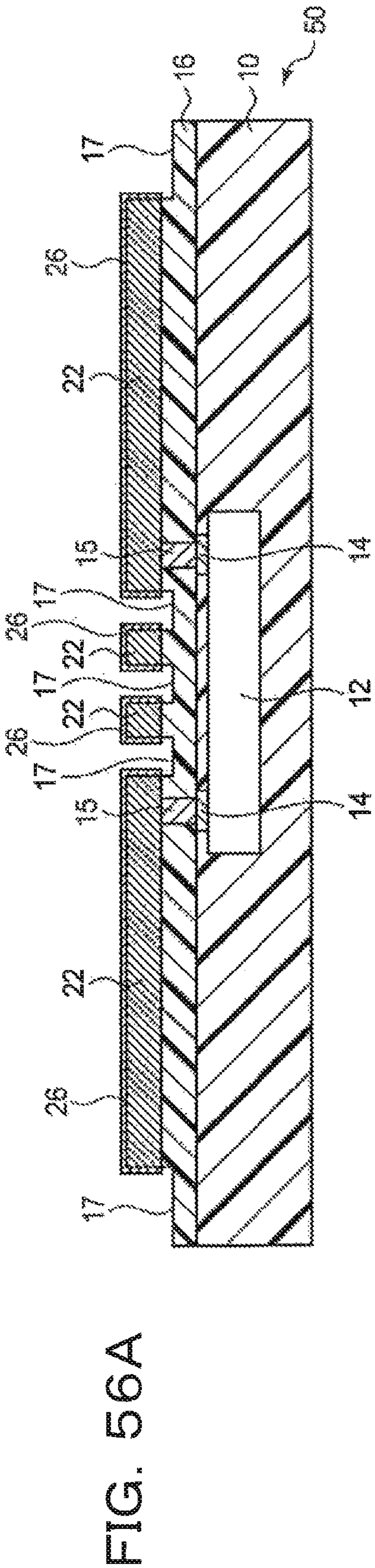
FIGS. 56A and 56B are process cross-sectional views (Part 1) illustrating a method for manufacturing the electronic apparatus according to the fourth embodiment.

Next, a method for manufacturing the electronic apparatus according to the present embodiment will be described with reference to FIGS. 56A through 57. FIGS. 56A through 57 are process cross-sectional views illustrating the method for manufacturing the electronic apparatus according to the present embodiment.

First, from a process for forming the adhesive layer 48 on the supporting substrate 46 to a process for forming the barrier film 26 on the upper and side faces of the wirings 22 are the same as with the method for manufacturing the electronic apparatus according to the first embodiment illustrated in FIGS. 4A through 12A, and accordingly, description thereof will be omitted (see FIG. 56A).

Figure 56B:
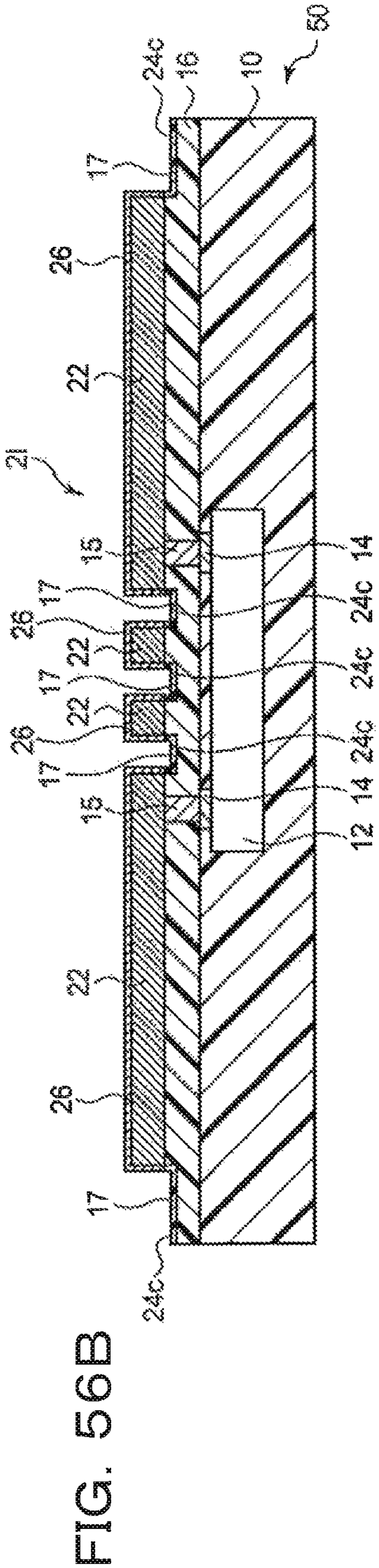
Figure 57:
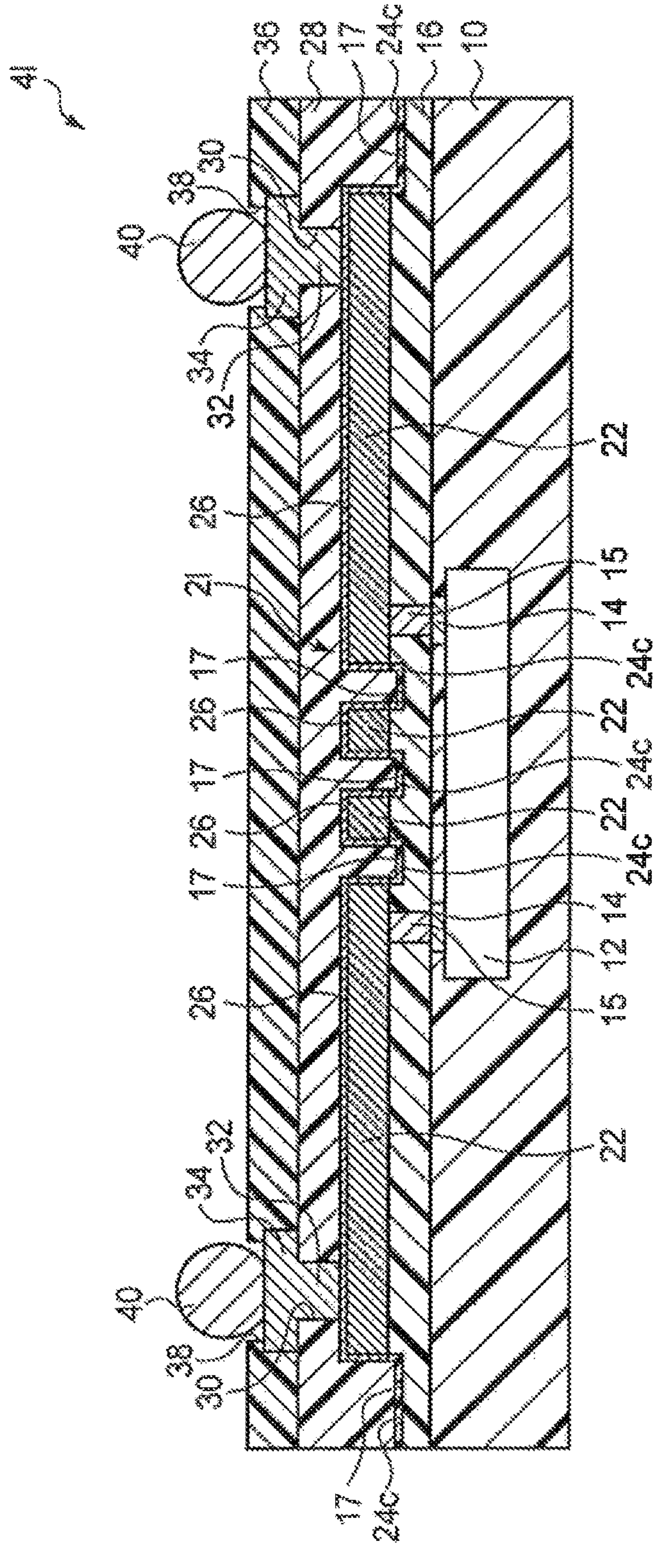
FIG. 57 is a process cross-sectional view (Part 2) illustrating the method for manufacturing the electronic apparatus according to the fourth embodiment.

Next, the inducing layer 24*c* for inducing diffusion of the constituent atoms (metal ions) of the wirings 22 is formed on the insulating film 16 in the region not covered with the wirings 22 (see FIG. 56B). That is to say, the layer 24*c* whereby the constituent atoms of the wirings 22 readily diffuse as compared to the insulating films 16 and 28 is formed on the insulating film 16 in the region not covered with the wirings 22. The inducing layer 24*c* is formed of a material having relatively high hygroscopicity. More specifically, a material including polyacrylic acid is employed as the inducing layer 24*c*. Further specifically, a polyacrylic surface activating agent is employed as the inducing layer 24*c*.

A polyacrylic material is a material having relatively high hygroscopicity. Such an inducing layer 24*c* readily takes the constituent atoms of the wirings 22 therein, and accordingly, the constituent atoms of the wirings 22 readily diffuse within the inducing layer 24*c*. The thickness of the inducing layer 24*c* is 10 through 100 nm or so, for example. The inducing layer 24*c* may be formed by dipping the insulating film 16 in the region not covered with the wirings 22 in a chemical, for example. In the case of forming the inducing layer 24*c* of a polyacrylic surface activating agent, a sodium polyacrylate solution is employed as a chemical. The concentration of the sodium polyacrylate solution within the chemical is 1 through 10 wt %, for example. Time for dipping the inducing layer 24*c* in the chemical is ten minutes or so, for example. In this way, the inducing layer 24*c* including polyacrylic acid is formed on the insulating film 16 in the region not covered with the wirings 22.

In this way, the wiring structure 2*l* according to the present embodiment is formed wherein the inducing layer 24*c* for inducing diffusion of the constituent atoms of the wirings 22 is formed on the insulating film 16 in the region not covered with the wirings 22.

The method for manufacturing the electronic apparatus according to the present embodiment after this is the same as the method for manufacturing the electronic apparatus according to the first embodiment described above with reference to FIGS. 13A through 15B, and accordingly, description thereof will be omitted. In this way, the electronic apparatus 4*l* according to the present embodiment having the wiring structure 2*l* is formed wherein the inducing layer 24*c* for inducing diffusion of the constituent atoms of the wirings 22 is formed on the insulating film 16 in the region not covered with the wirings 22 (see FIG. 57).

The electronic apparatus 4*l* thus formed may be mounted on the circuit substrate 42 in the same way as with the method for manufacturing the electronic apparatus according to the first embodiment described with reference to FIGS. 16 and 17.

(Evaluation Results)

Next, evaluation results of the wiring structure according to the present embodiment will be described.

Figure 58:
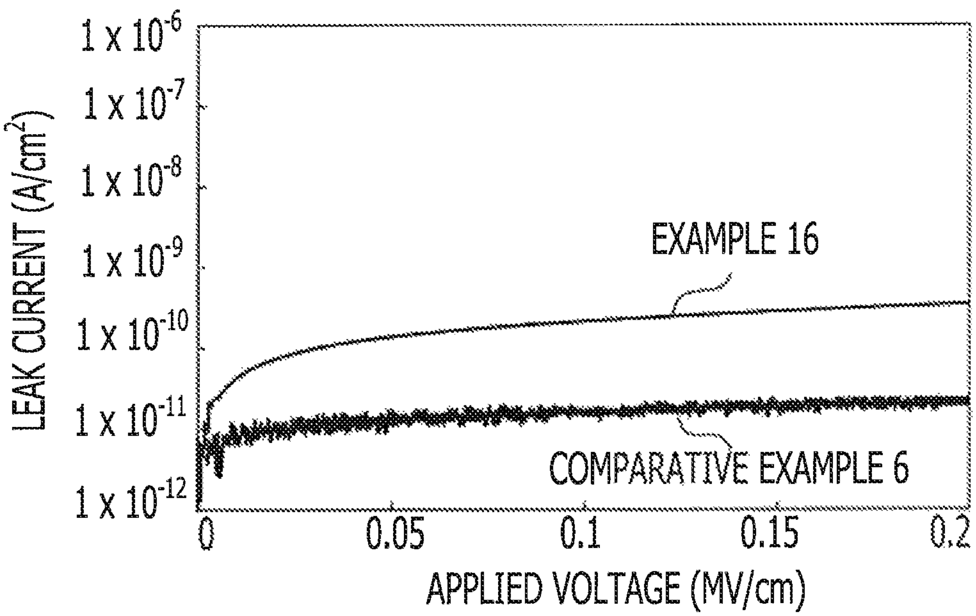
FIG. 58 is a graph (Part 4) illustrating measurement results of insulation properties.

FIG. 58 is a graph illustrating measurement results for insulation properties. The horizontal axis in FIG. 58 indicates applied voltage per increment length, and the vertical axis in FIG. 58 indicates leak current. As for the evaluation circuit, the same evaluation circuit as that of the first embodiment illustrated in FIG. 18 was employed.

Example 16 illustrated in FIG. 58 corresponds to the present embodiment. With Example 16, the insulating film 102 of a polyacrylic surface activating agent was formed on the silicon substrate 100.

As may be understood from FIG. 45, with Example 16, leak current is increased as compared to Comparative Example 6 where the adhesion reinforcement film was formed. Thus, according to Example 16, it may be seen that the insulating film 102 having relatively low insulation properties may be obtained.

The insulating film 102 according to Example 16 corresponds to the inducing layer 24*c* (see FIG. 55) formed on the insulating film 16 (see FIG. 55). With an insulating film having low insulation properties, the constituent atoms of the wirings 22 (see FIG. 55) readily diffuse. Accordingly, with the present embodiment as well, migration does not intensely advance at a partial portion, and migration gradually advances in an overall and even manner. Therefore, with the present embodiment as well, it may be seen that time until insulation breakdown occurs may sufficiently be prolonged, whereby the wiring structure having high reliability, and the electronic apparatus having the wiring structure thereof may be provided.

Next, the HAST test results of the wiring structure according to the present embodiment will be described.

The conditions for the HAST test according to the present embodiment were set as with the conditions for the HAST test as to the wiring structure according to the first embodiment described above.

As Example 17, a HAST test was performed on the wiring structure 2*l* according to the present embodiment, i.e., the wiring structure 2*l* wherein the inducing layer 24*c* was formed on the insulating film 16 in the region between the multiple wirings 22. With Example 17, 90% of test samples were determined to be OK.

On the other hand, with Comparative Example 7 wherein a HAST test was performed on the wiring structure where the adhesion reinforcement film was formed on the insulating film 16 in the region between the multiple wirings 22, the number of test samples determined to be OK was a mere 5%, as described above.

As described above, it may be seen that according to the present embodiment, the wiring structure **2*l*** having high reliability may be obtained.

(Modification (Part 1))

Next, description will be made regarding a wiring structure according to a modification (Part 1) of the present embodiment and a manufacturing method thereof, and an electronic apparatus employing the wiring structure thereof and a manufacturing method thereof, with reference to FIGS. 59 through 61B.

Figure 59:
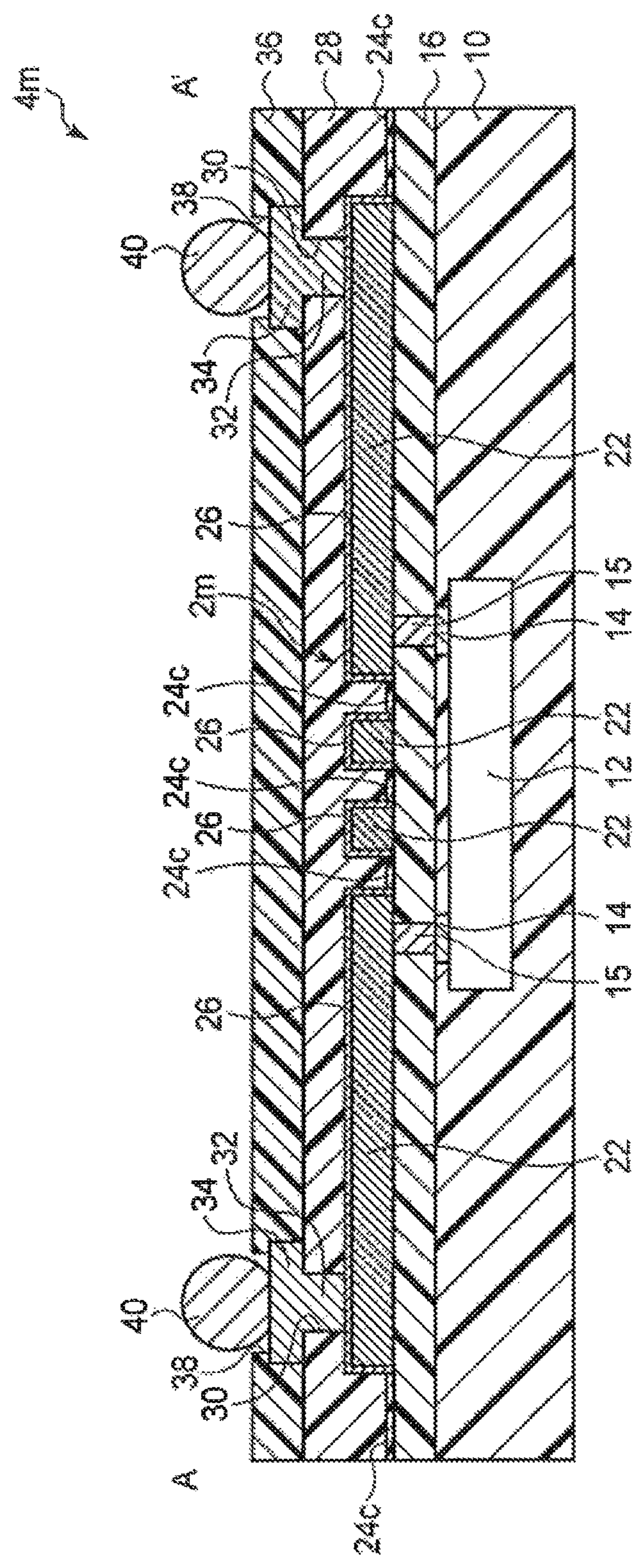
FIG. 59 is a cross-sectional view illustrating an electronic apparatus according to a modification (Part 1) of the fourth embodiment.

First, a wiring structure according to the present modification and an electronic apparatus having the wiring structure thereof will be described with reference to FIG. 59. FIG. 59 is a cross-sectional view illustrating the electronic apparatus according to the present modification.

The electronic apparatus according to the present modification is an electronic apparatus wherein the recessed portions 17 are not formed in the insulating film 16 in the region between the multiple wirings 22.

As illustrated in FIG. 59, with the present modification, the recessed portions 17 (see FIG. 55) are not formed in the insulating film 16 in the region between the multiple wirings 22.

The inducing layer **24*c* for inducing diffusion of the constituent atoms of the wirings 22 is formed on the insulating film 16 in the region between the multiple wirings 22**.

In this way, an electronic apparatus **4*m* according to the present modification having a wiring structure 2*m* is formed wherein the inducing layer 24*c* for inducing diffusion of the constituent atoms of the wirings 22 is formed on the insulating film 16 in the region between the multiple wirings 22**.

As described above, an arrangement may be made wherein the recessed portions 17 are not formed in the insulating film 16 in the region between the multiple wirings 22.

With the present modification as well, the inducing layer **24*c* is formed on the insulating film 16 in the region between the multiple wirings 22, and accordingly, migration does not intensely advance at a partial portion, and migration gradually advances in an overall and even manner. Therefore, with the present modification as well, time until insulation breakdown occurs may sufficiently be prolonged, whereby the wiring structure 2*m* having high reliability, and the electronic apparatus 4*m* having the wiring structure 2*m*** thereof may be provided.

Next, a method for manufacturing the electronic apparatus according to the present modification will be described with reference to FIGS. 60A through 61B. FIGS. 60A through 61B are process cross-sectional views illustrating the method for manufacturing the electronic apparatus according to the present modification.

Figure 60A:
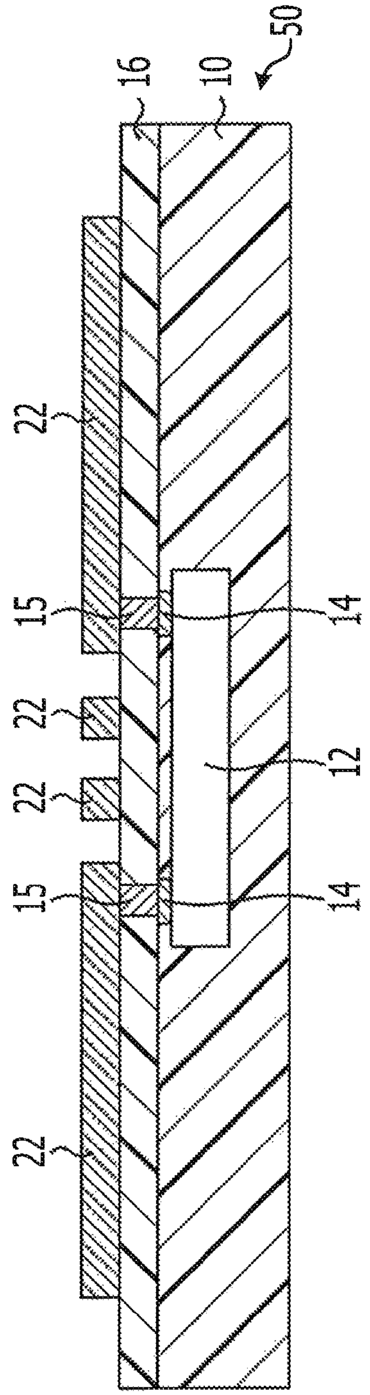
FIGS. 60A and 60B are process cross-sectional views (Part 1) illustrating a method for manufacturing the electronic apparatus according to the modification (Part 1) of the fourth embodiment.

First, from a process for forming the adhesive layer 48 on the supporting substrate 46 to a process for subjecting the seed layer 58 and so forth exposed around the wirings 22 to etching are the same as with the method for manufacturing the electronic apparatus according to the first embodiment illustrated in FIGS. 4A through 11A, and accordingly, description thereof will be omitted (see FIG. 60A).

Figure 60B:
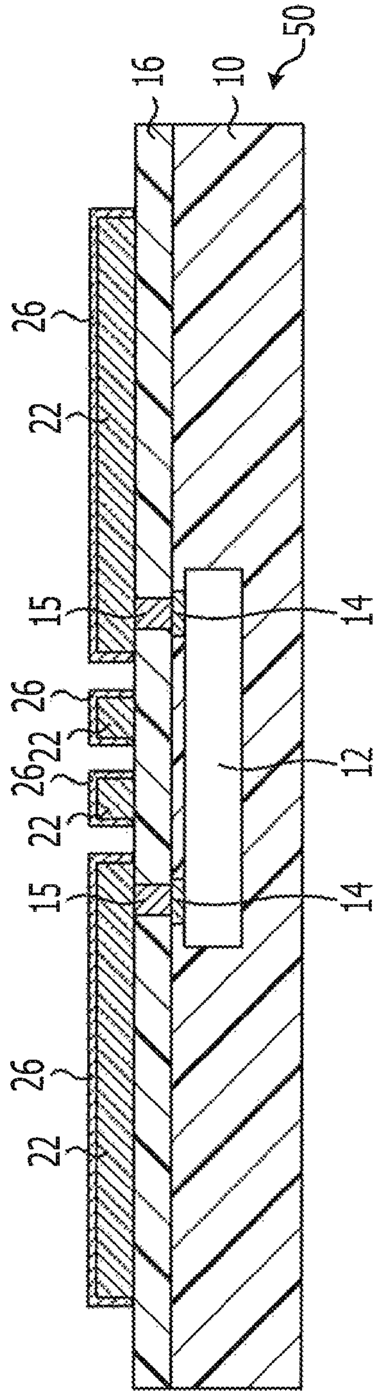

Next, in the same way as with the method for manufacturing the electronic apparatus according to the first embodiment described above with reference to FIG. 12A, the barrier film 26 is formed on the upper and side faces of the wirings 22 (see FIG. 60B).

Figure 61A:
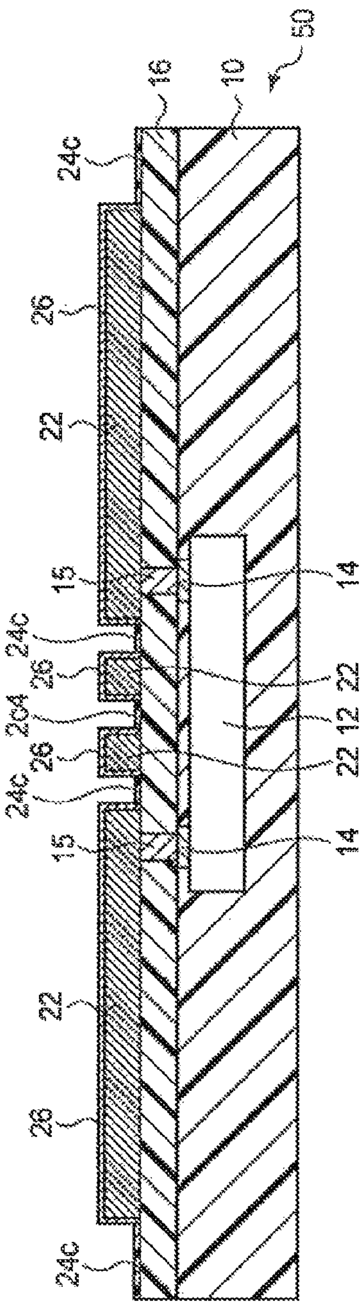
FIGS. 61A and 61B are process cross-sectional views (Part 2) illustrating the method for manufacturing the electronic apparatus according to the modification (Part 1) of the fourth embodiment.
Figure 61B:
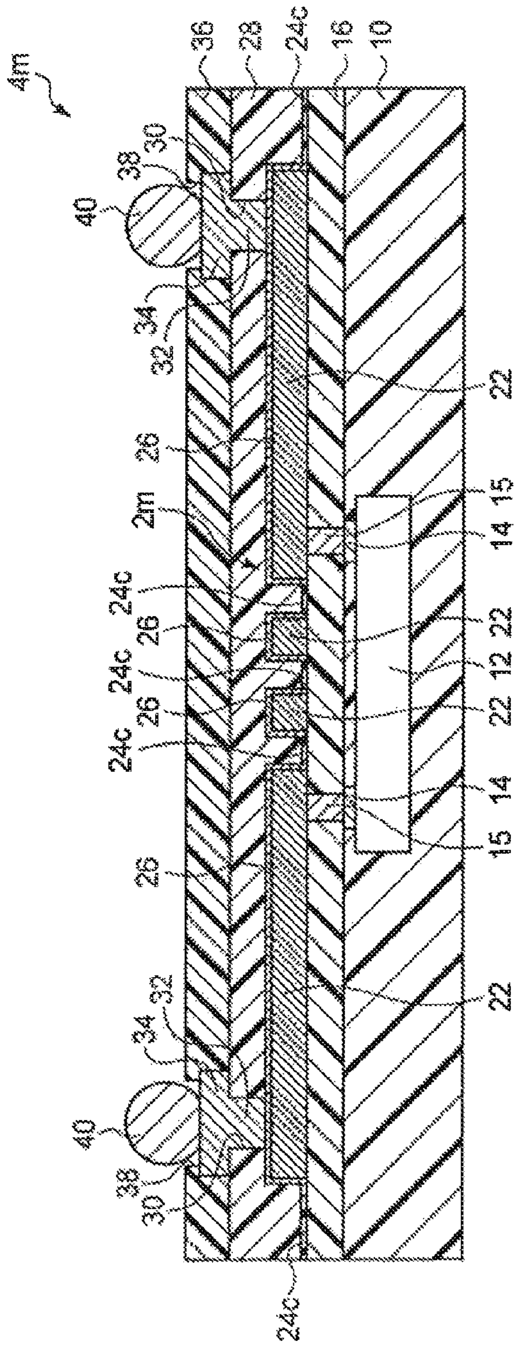

Next, in the same way as with the method for manufacturing the electronic apparatus described above with reference to FIG. 56B, the inducing layer **24*c* for inducing diffusion of the constituent atoms of the wirings 22 is formed on the insulating film 16 in the region not covered with the wirings 22 (see FIG. 61**A).

The method for manufacturing the electronic apparatus according to the present modification after this is the same as the method for manufacturing the electronic apparatus according to the first embodiment described above with reference to FIGS. 13A through 15B, and accordingly, description thereof will be omitted.

In this way, an electronic apparatus **4*m* according to the present modification having a wiring structure 2*m* is formed wherein the inducing layer 24*c* for inducing diffusion of the constituent atoms of the wirings 22 is formed on the insulating film 16 in the region not covered with the wirings 22 (see FIG. 61**B).

The electronic apparatus **4*m* according to the present modification thus formed may be mounted on the circuit substrate 42 in the same way as with the method for manufacturing the electronic apparatus according to the first embodiment described with reference to FIGS. 16 and 17**.

Next, the HAST test results of the wiring structure according to the present modification will be described.

The conditions for the HAST test according to the present modification were set as with the conditions for the HAST test as to the wiring structure according to the first embodiment described above.

As Example 18, a HAST test was performed on the wiring structure **2*m* according to the present modification. With Example 18, the inducing layer 24*c* was formed on the insulating film 16 without forming the recessed portions 17 in the insulating film 16 in the region between the multiple wirings 22**. With Example 18, 50% of test samples were determined to be OK.

On the other hand, in the case of Comparative Example 8 described above wherein a HAST test has been performed on the wiring structure where an adhesion reinforcement film had been formed on the insulating film 16 without forming the recessed portions 17 in the insulating film 16 in the region between the multiple wirings 22, the number of test samples determined to be OK is 0%.

Thus, it may be seen that with the present modification as well, reliability is obtained on some level. However, in the light of obtaining sufficient reliability, it is desirable to form the recessed portions 17 in the insulating film 16 in the region between the multiple wirings 22.

(Modification (Part 2))

Next, description will be made regarding a wiring structure according to a modification (Part 2) of the present embodiment and a manufacturing method thereof, and an electronic apparatus employing the wiring structure thereof and a manufacturing method thereof, with reference to FIGS. 62 through 64.

First, a wiring structure according to the present modification and an electronic apparatus having the wiring structure thereof will be described with reference to FIG. 62. FIG. 62 is a cross-sectional view illustrating the electronic apparatus according to the present modification.

The electronic apparatus according to the present modification is an electronic apparatus wherein the recessed portions 17 are not formed in the insulating film 16 in the region between the multiple wirings 22, and the barrier film 26 for covering the upper and side faces of the wirings 22 is not formed.

Figure 62:
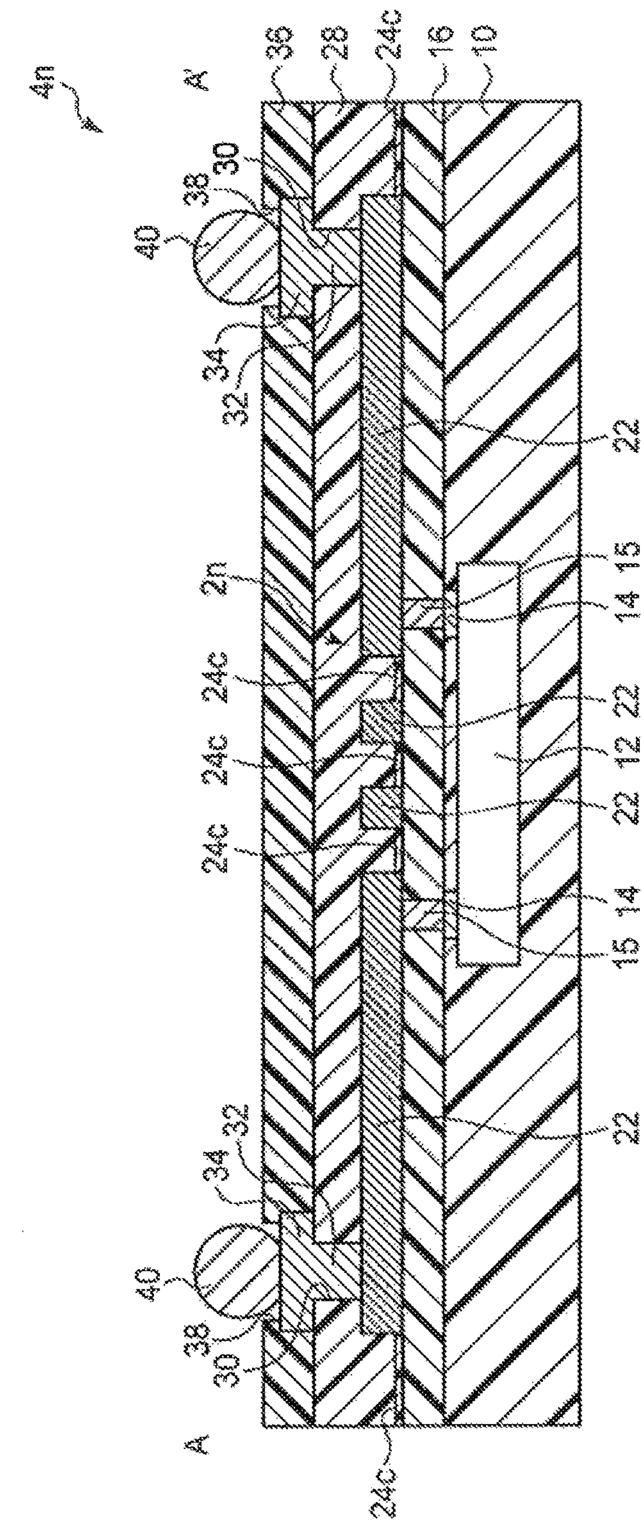
FIG. 62 is a cross-sectional view illustrating an electronic apparatus according to a modification (Part 2) of the fourth embodiment.
Figure 63A:
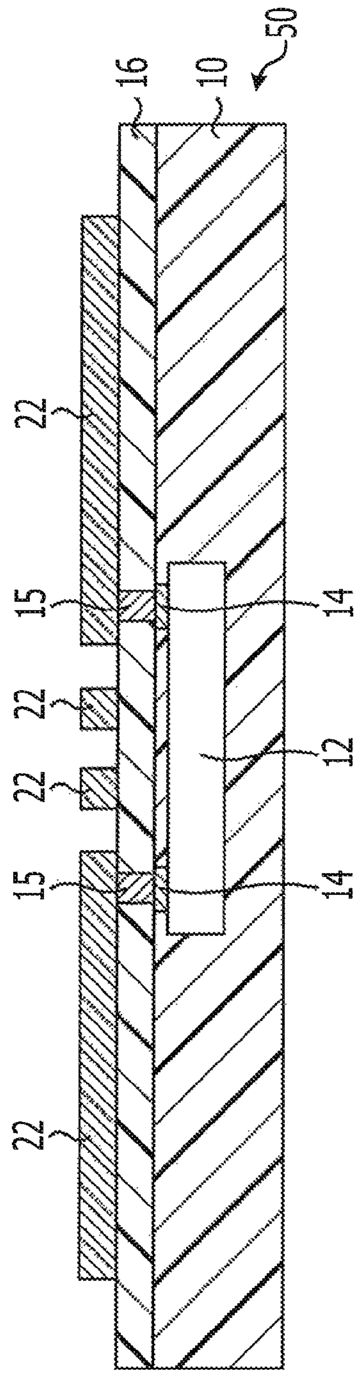
FIGS. 63A and 63B are process cross-sectional views (Part 1) illustrating a method for manufacturing the electronic apparatus according to the modification (Part 2) of the fourth embodiment.

As illustrated in FIG. 62, with the present modification, the recessed portions 17 (see FIG. 55) are not formed in the insulating film 16 in the region between the multiple wirings 22.

The inducing layer 24*c* for inducing diffusion of the constituent atoms of the wirings 22 is formed on the insulating film 16 in the region between the multiple wirings 22.

With the present modification, the barrier film 26 (see FIG. 55) for covering the upper and side faces of the wirings 22 is not formed. In this way, an electronic apparatus 4*n* according to the present modification having a wiring structure 2*n* is formed wherein the inducing layer 24*c* for inducing diffusion of the constituent atoms of the wirings 22 is formed on the insulating film 16 in the region between the multiple wirings 22.

As described above, an arrangement may be made wherein the recessed portions 17 are not formed in the insulating film 16 in the region between the multiple wirings 22, and also the barrier film 26 for covering the upper and side faces of the wirings 22 is not formed.

With the present modification as well, the inducing layer 24*c* is formed on the insulating film 16 in the region between the multiple wirings 22, and accordingly, migration does not intensely advance at a partial portion, and migration gradually advances in an overall and even manner. Therefore, with the present modification as well, time until insulation breakdown occurs may sufficiently be prolonged, which may contribute to improvement in reliability.

Next, a method for manufacturing the electronic apparatus according to the present modification will be described with reference to FIGS. 63A through 64. FIGS. 63A through 64 are process cross-sectional views illustrating the method for manufacturing the electronic apparatus according to the present modification.

First, from a process for forming the adhesive layer 48 on the supporting substrate 46 to a process for subjecting the seed layer 58 and so forth exposed around the wirings 22 to etching are the same as with the method for manufacturing the electronic apparatus according to the first embodiment illustrated in FIGS. 4A through 11A, and accordingly, description thereof will be omitted (see FIG. 63A).

Figure 63B:
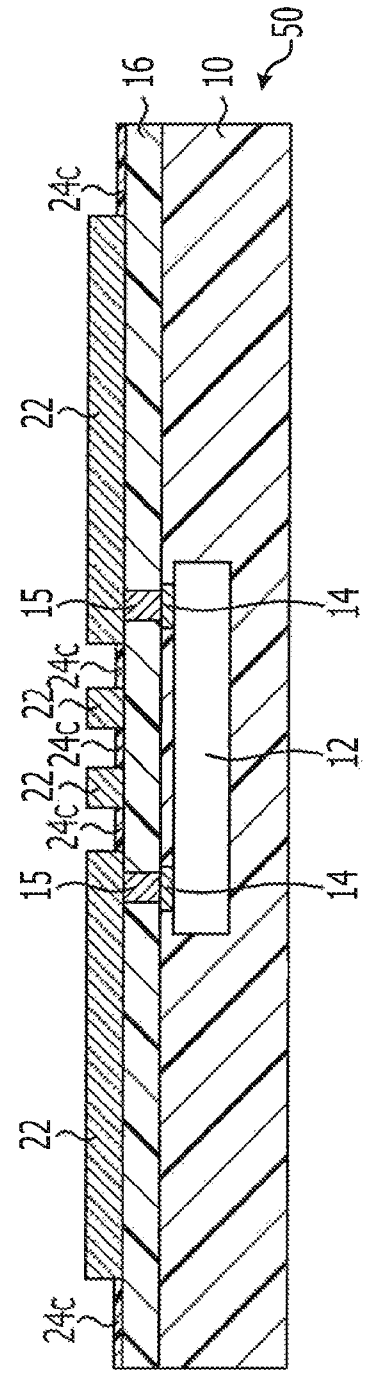
Figure 64:
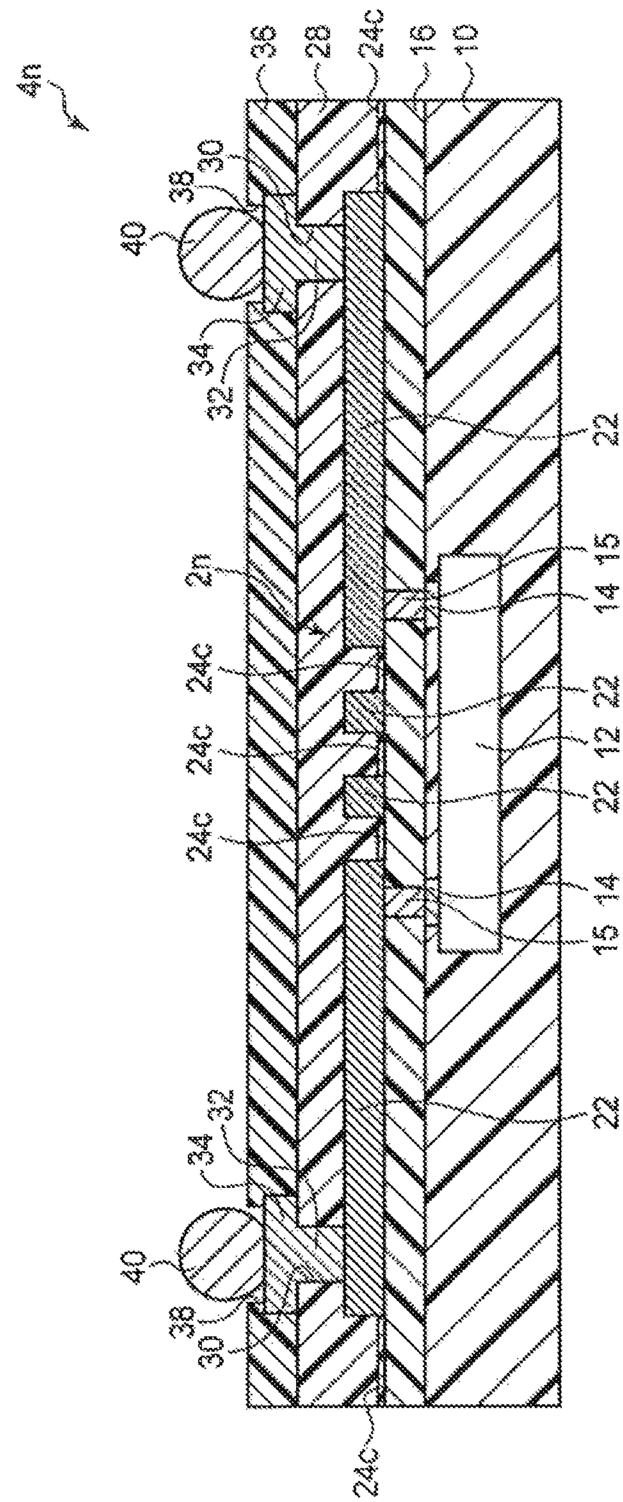
FIG. 64 is a process cross-sectional view (Part 2) illustrating the method for manufacturing the electronic apparatus according to the modification (Part 2) of the fourth embodiment.

Next, in the same way as with the method for manufacturing the electronic apparatus according to the third embodiment described above with reference to FIG. 43B, the inducing layer 24*c* for inducing diffusion of the constituent atoms of the wirings 22 is formed on the insulating film 16 in the region not covered with the wirings 22 (see FIG. 63B).

The method for manufacturing the electronic apparatus according to the present modification after this is the same as the method for manufacturing the electronic apparatus according to the first embodiment described above with reference to FIGS. 13A through 15B, and accordingly, description thereof will be omitted. In this way, an electronic apparatus 4*n* according to the present modification having a wiring structure 2*n* is formed wherein the inducing layer 24*c* for inducing diffusion of the constituent atoms of the wirings 22 is formed on the insulating film 16 in the region not covered with the wirings 22 (see FIG. 64).

The electronic apparatus 4*n* according to the present modification thus formed may be mounted on the circuit substrate 42 in the same way as with the method for manufacturing the electronic apparatus according to the first embodiment described with reference to FIGS. 16 and 17.

Next, the HAST test results of the wiring structure according to the present modification will be described.

The conditions for the HAST test according to the present modification were set as with the conditions for the HAST test as to the wiring structure according to the first embodiment described above.

As Example 19, a HAST test was performed on the wiring structure 2*n* according to the present modification. With Example 19, the inducing layer 24*c* including polyacrylic acid was formed on the insulating film 16 without forming the recessed portions 17 in the insulating film 16 in the region between the multiple wirings 22, and without forming the barrier film 26 for covering the upper and side faces of the wirings 22. With Example 19, 10% of test samples were determined to be OK.

On the other hand, in the case of Comparative Example 9 wherein a HAST test was performed on the wiring structure where an adhesion reinforcement film was formed on the insulating film 16 without forming the recessed portions 17 in the insulating film 16 in the region between the multiple wirings 22, and without forming the barrier film 26, the number of test samples determined to be OK was 0%.

Thus, it may be seen that the present modification also may contribute to improvement in reliability on some level. However, in the light of obtaining sufficient reliability, it is desirable to form the recessed portions 17 in the insulating film 16 in the region between the multiple wirings 22, and to form the barrier film 26 for covering the upper and side faces of the wirings 22.

(Modification (Part 3))

Next, description will be made regarding a wiring structure according to a modification (Part 3) of the present embodiment and a manufacturing method thereof, and an electronic apparatus employing the wiring structure thereof and a manufacturing method thereof, with reference to FIGS. 65 through 67B.

Figure 65:
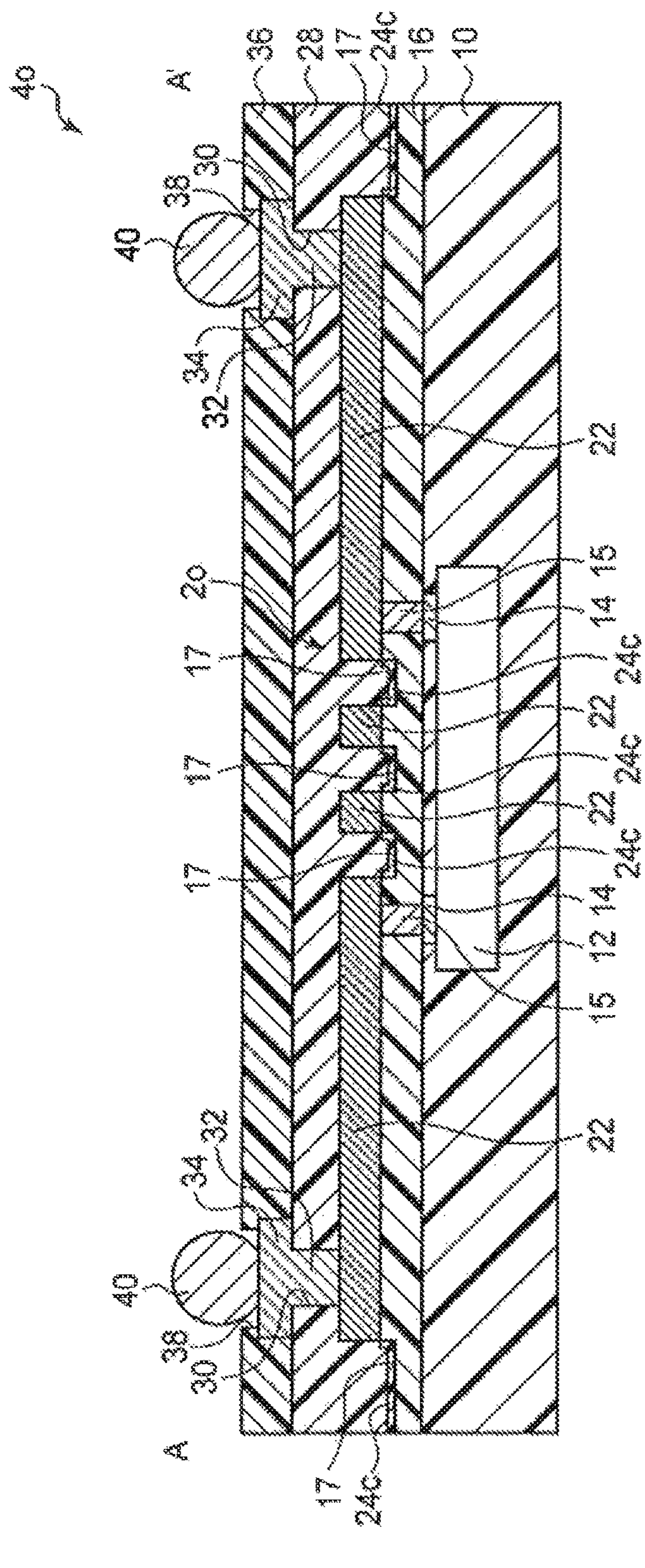
FIG. 65 is a cross-sectional view illustrating an electronic apparatus according to a modification (Part 3) of the fourth embodiment.

First, a wiring structure according to the present modification and an electronic apparatus having the wiring structure thereof will be described with reference to FIG. 65. FIG. 65 is a cross-sectional view illustrating the electronic apparatus according to the present modification.

The electronic apparatus according to the present modification is an electronic apparatus wherein while the recessed portions 17 are formed in the insulating film 16 in the region between the multiple wirings 22, the barrier film 26 for covering the upper and side faces of the wirings 22 is not formed.

As illustrated in FIG. 65, with the present modification, the recessed portions 17 are formed in the insulating film 16 in the region between the multiple wirings 22.

The inducing layer 24*c* for inducing diffusion of the constituent atoms of the wirings 22 is formed on the insulating film 16 in the region between the multiple wirings 22.

With the present modification, the barrier film 26 (see FIG. 55) for covering the upper and side faces of the wirings 22 is not formed. In this way, an electronic apparatus 4*o* according to the present modification having a wiring structure 2*o* is formed wherein the inducing layer 24*c* for inducing diffusion of the constituent atoms of the wirings 22 is formed on the insulating film 16 in the region between the multiple wirings 22.

As described above, an arrangement may be made wherein while the recessed portions 17 are formed in the insulating film 16 in the region between the multiple wirings 22, and also the barrier film 26 for covering the upper and side faces of the wirings 22 is not formed.

With the present modification as well, the inducing layer 24*c* is formed on the insulating film 16 in the region between the multiple wirings 22, and accordingly, migration does not intensely advance at a partial portion, and migration gradually advances in an overall and even manner. Therefore, with the present modification as well, time until insulation breakdown occurs may sufficiently be prolonged, which may contribute to improvement in reliability.

Next, a method for manufacturing the electronic apparatus according to the present modification will be described with reference to FIGS. 66A through 67B. FIGS. 66A through 67B are process cross-sectional views illustrating the method for manufacturing the electronic apparatus according to the present modification.

Figure 66A:
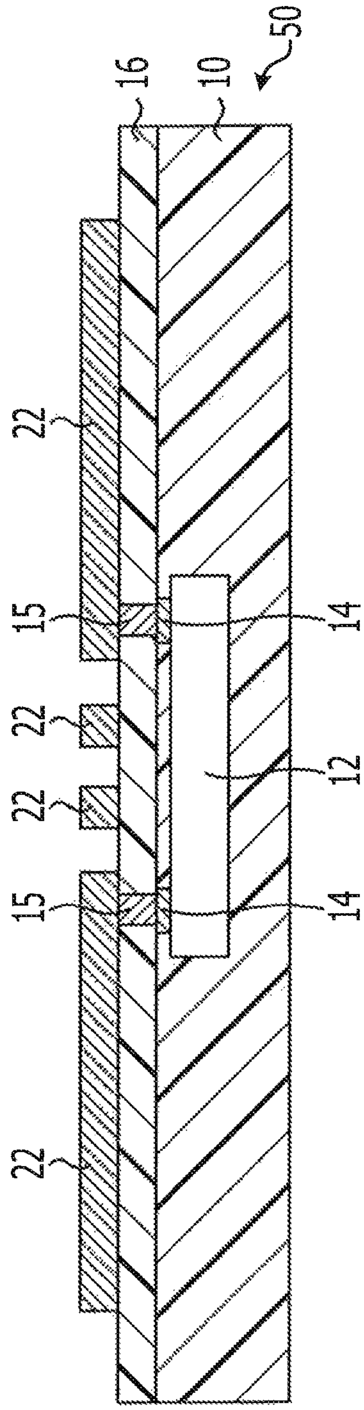
FIGS. 66A and 66B are process cross-sectional views (Part 1) illustrating a method for manufacturing the electronic apparatus according to the modification (Part 3) of the fourth embodiment.
Figure 66B:
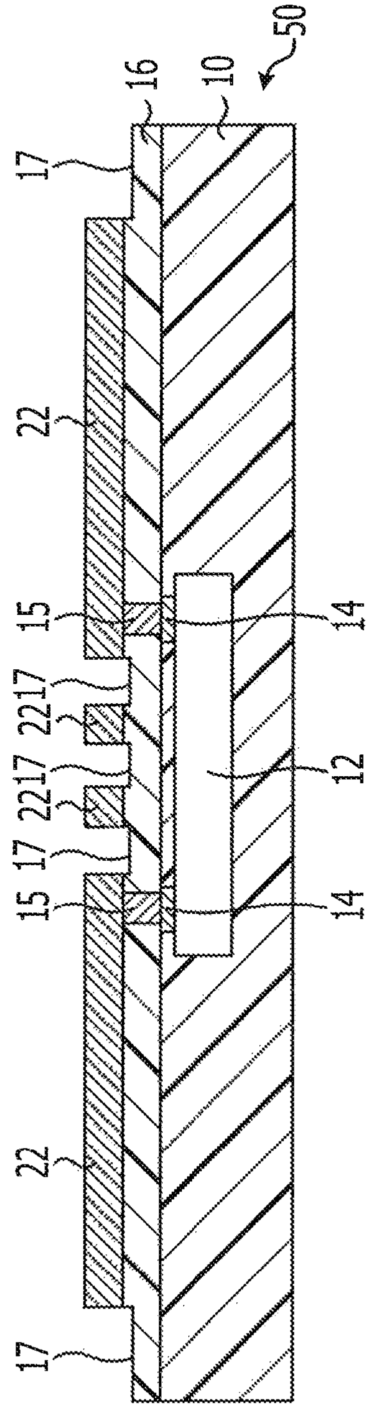

First, from a process for forming the adhesive layer 48 on the supporting substrate 46 to a process for subjecting the seed layer 58 and so forth exposed around the wirings 22 to etching are the same as with the method for manufacturing the electronic apparatus according to the first embodiment illustrated in FIGS. 4A through 11A, and accordingly, description thereof will be omitted (see FIG. 66A).

Next, in the same way as with the method for manufacturing the electronic apparatus according to the first embodiment described with reference to FIG. 11B, the insulating film 16 not covered with the wirings 22 is subjected to etching (see FIG. 67B).

Figure 67A:
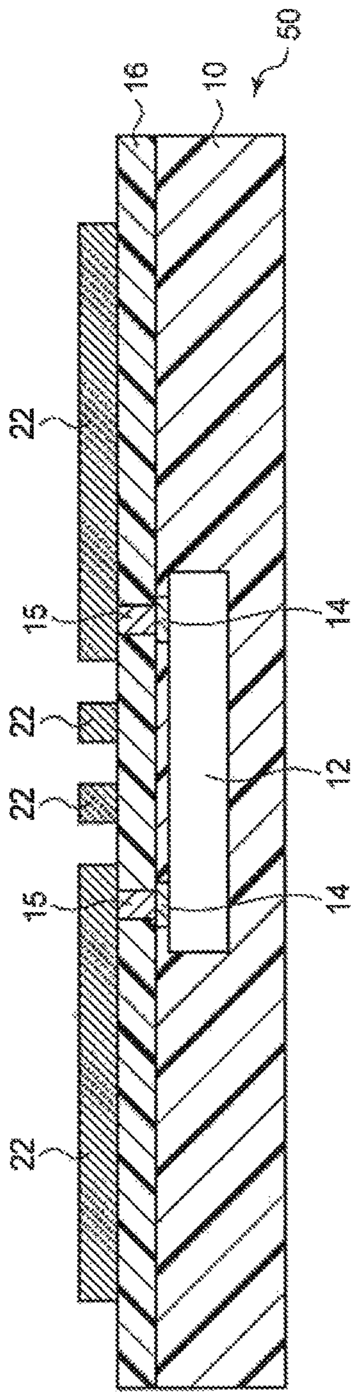
FIGS. 67A and 67B are process cross-sectional views (Part 2) illustrating the method for manufacturing the electronic apparatus according to the modification (Part 3) of the fourth embodiment.

Next, in the same way as with the method for manufacturing the electronic apparatus according to the fourth embodiment described with reference to FIG. 56B, the inducing layer 24*c* for inducing diffusion of the constituent atoms of the wirings 22 is formed on the insulating film 16 in the region not covered with the wirings 22 (see FIG. 67A).

The method for manufacturing the electronic apparatus according to the present modification after this is the same as the method for manufacturing the electronic apparatus according to the first embodiment described with reference to FIGS. 13A through 15B, and accordingly, description thereof will be omitted.

Figure 67B:
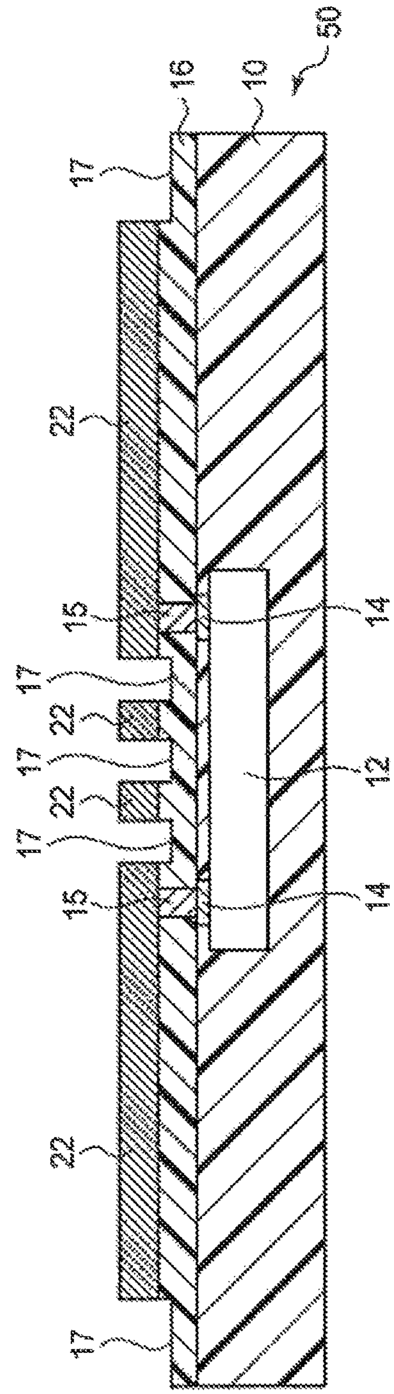

In this way, an electronic apparatus 4*o* according to the present modification having a wiring structure 2*o* is formed wherein the inducing layer 24*c* for inducing diffusion of the constituent atoms of the wirings 22 is formed on the insulating film 16 in the region not covered with the wirings 22 (see FIG. 67B).

The electronic apparatus 4*o* thus formed may be mounted on the circuit substrate 42 in the same way as with the method for manufacturing the electronic apparatus according to the first embodiment described with reference to FIGS. 16 and 17.

Next, the HAST test results of the wiring structure according to the present modification will be described.

The conditions for the HAST test according to the present modification were set as with the conditions for the HAST test as to the wiring structure according to the first embodiment described above.

As Example 20, a HAST test was performed on the wiring structure according to the present modification. With Example 20, the inducing layer 24*c* was formed on the insulating film 16 without forming the barrier film 26 for covering the upper and side faces of the wirings 22 while forming the recessed portions 17 in the insulating film 16 in the region between the multiple wirings 22. With Example 20, 40% of test samples were determined to be OK.

On the other hand, in the case of Comparative Example 10 wherein a HAST test was performed on the wiring structure where an adhesion reinforcement film was formed on the insulating film 16 without forming the barrier film 26 while forming the recessed portions 17 in the insulating film 16 in the region between the multiple wirings 22, the number of test samples determined to be OK was 0%.

Thus, the present modification also may contribute to improvement in reliability on some level. However, in the light of obtaining sufficient reliability, it is desirable to form the barrier film 26 for covering the upper and side faces of the wirings 22.

[Modifications]

Various modifications may be made besides the above mentioned embodiments. For example, with the first embodiment, though an example has been described wherein the surface of the insulating film 16 is subjected to plasma processing using a plasma generated with Ar gas, the present disclosure is not restricted to this. For example, the surface of the insulating film 16 may be subjected to plasma processing using plasma generated with $O_2$ gas, $CF_4$ gas, $Cl_2$ gas, or mixed gas of these.

Also, with the above embodiments, though an example has been described wherein the wiring structure is formed on a resin layer (substrate) 10 where the chip 12 is embedded, the present disclosure is not restricted to this. For example, the wiring structures 2, and 2*a* though 2*o* as described above may be applied to a wiring structure formed on a semiconductor substrate (substrate), for example. Alternatively, the wiring structures 2, and 2*a* though 2*o* as described above may be applied to a wiring structure of a circuit substrate, for example.

Also, with the above embodiments, though an example has been described wherein the depth of the recessed portions 17 to be formed in the region between the multiple wirings 22 is 800 nm or so, the depths of the recessed portions 17 are not restricted to this. Forming at least the recessed portions 17 enables an advancing route of migration to be bypassed, whereby this contributes to improvement in reliability. However, the route to be bypassed is prolonged as the depths of the recessed portions 17 is deepened, and accordingly, it is desirable to set the depths of the recessed portions 17 deeper. For example, it is desirable to set the depths of the recessed portions 17 100 nm or deeper. It is more desirable to set the depths of the recessed portions 17 500 nm or deeper.

Also, with the above embodiments, though an example has been described wherein a phenol resin is employed as the materials of the insulating films 16 and 28, the materials of the insulating films 16 and 28 are not restricted to this. For example, a polyimide resin or the like may be employed as the materials of the insulating films 16 and 28.

Also, with the above embodiments, though an example has been described wherein a photosensitive organic resin is employed as the materials of the insulating films 16 and 28, the materials of the insulating films 16 and 28 are not restricted to a photosensitive organic resin. For example, a nonphotosensitive organic resin may be employed as the materials of the insulating films 16 and 28.

Also, with the above embodiments, though an example has been described wherein an organic resin is employed as the materials of the insulating films 16 and 28, the materials of the insulating films 16 and 18 are not restricted to this. The insulating films 16 and 18 may be inorganic materials such as a silicon dioxide film or the like, for example.

Also, with the above embodiments, though an example has been described wherein Ti is employed as the material of the adherence layer (not illustrated), the material of the adherence layer is not restricted to this. For example, tantalum (Ta), tungsten (W), zirconium (Zr), chromium (Cr), or the like may be employed as the material of the adherence layer. Also, alloy of Ti, Ta, W, Zr, and Cr may be employed as the material of the adherence layer. Also, nitride of Ti, Ta, W, Zr, and Cr may be employed as the material of the adherence layer.

Also, with the above embodiments, though an example has been described wherein Cu is employed as the materials of the seed layers 52, 58, and 64, the materials of the seed layers 52, 58, and 64 are not restricted to this. For example, nickel (Ni), cobalt (Co), or the like may be employed as the materials of the seed layers 52, 58, and 64.

Also, with the above embodiments, though an example has been described wherein the adherence layer and the seed layers 52, 58, and 64 are formed by the spattering method, the method for forming the adherence layer and the seed layers 52, 58, and 64 are not restricted to this. For example, the adherence layer and the seed layers 52, 58, and 64 may be formed by the electroless plating method or CVD (Chemical Vapor Deposition) method.

Also, with the above embodiments, though an example has been described wherein the photo resist films 54, 60, and 66 are altered, an arrangement may be made wherein altering of the photo resist films 54, 60, and 66 is not performed.

Also, with the above embodiments, though an example has been described wherein the wirings 22 are formed by the electroplating method, the method for forming the wirings 22 is not restricted to this. For example, the wirings 22 may be formed by the electroless plating method.

Also, with the above embodiments, though an example has been described wherein CoWP is employed as the material of the barrier film 26, the material of the barrier film 26 is not restricted to this. A material including Co, i.e., a Co material may widely be employed as the material of the barrier film 26. Also, a material including Ni, i.e., a Ni material may be employed as the material of the barrier film 26. More specifically, NIP may be employed as the material of the barrier film 26. The barrier film 26 of NIP may be formed by the electroless plating method.

Also, a SiN material, SiC material, SiO material, or complex compound of these may be employed as the material of the barrier film 26. The barrier film 26 of SiN, SiC, or SiO may be formed by the CVD method, for example.

Also, Ti, Ta, W, Zr, or compound of these, or nitride of these may be employed as the material of the barrier film 26. Such a barrier film 26 may be formed by the CVD method, for example.

Also, with the above embodiments, though an example has been described wherein the inducing layer 24*b* including halogen ions is formed separately from the insulating film 16 on the insulating film 16 in the region between the multiple wirings 22, the method for forming the inducing layer 24*b* is not restricted to this. For example, the inducing layer may be formed by attaching halogen ions on the surface of the insulating film 16 in the region between the multiple wirings 22, or by introducing halogen ions into the surface portion of the insulating film 16 in the region between the multiple wirings 22.

Figure 68:
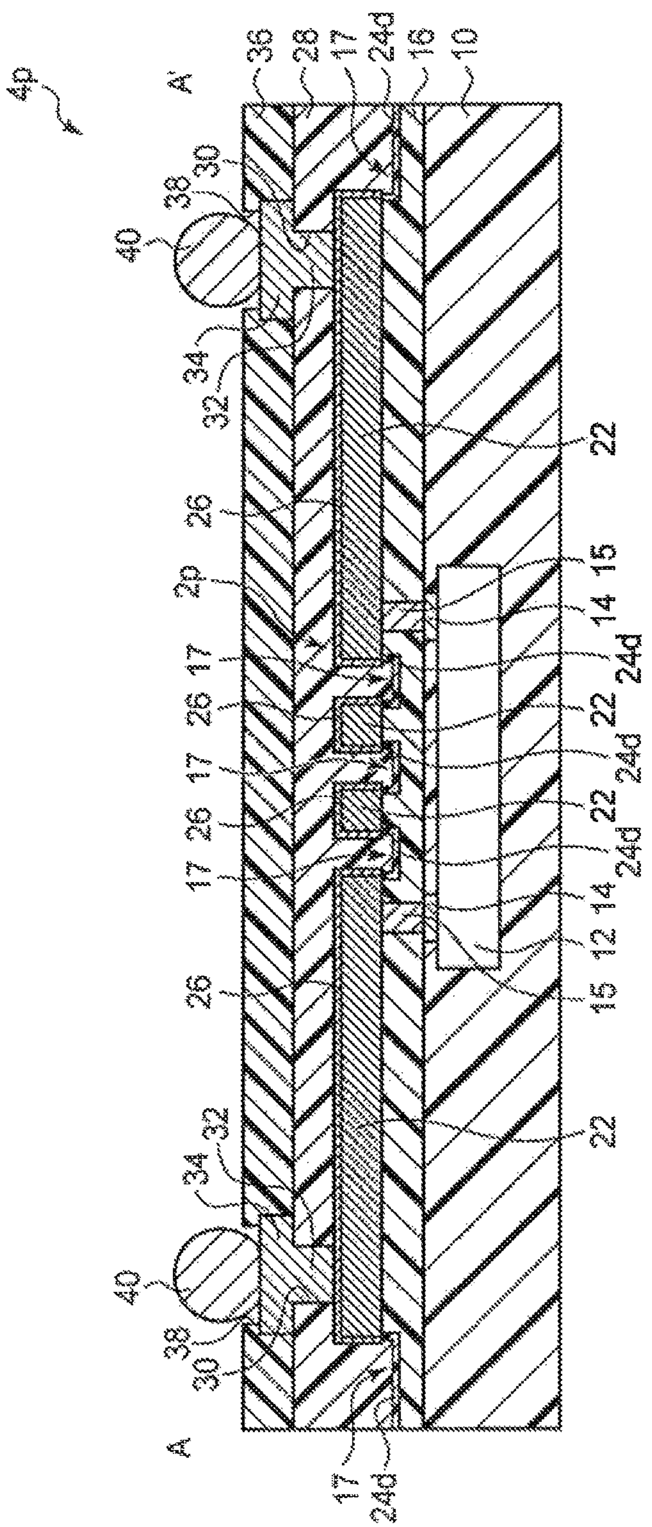
FIG. 68 is a cross-sectional view illustrating an electronic apparatus according to a modification embodiment.

FIG. 68 is a cross-sectional view illustrating an electronic apparatus according to the modification embodiment. As illustrated in FIG. 68, an inducing layer 24*d* for inducing diffusion of the constituent atoms of the wirings 22 is formed on the insulating film 16 in the region between the multiple wirings 22. The inducing layer 24*d* is formed on the bottom and side portions of the recessed portions 17 formed in the insulating film 16 in the region between the multiple wirings 22. The inducting layer 24*d* has been formed by attaching halogen ions on the surface of the insulating film 16 in the region between the multiple wirings 22, or by introducing halogen ions into the surface portion of the insulating film 16 in the region between the multiple wirings 22.

Figure 69A:
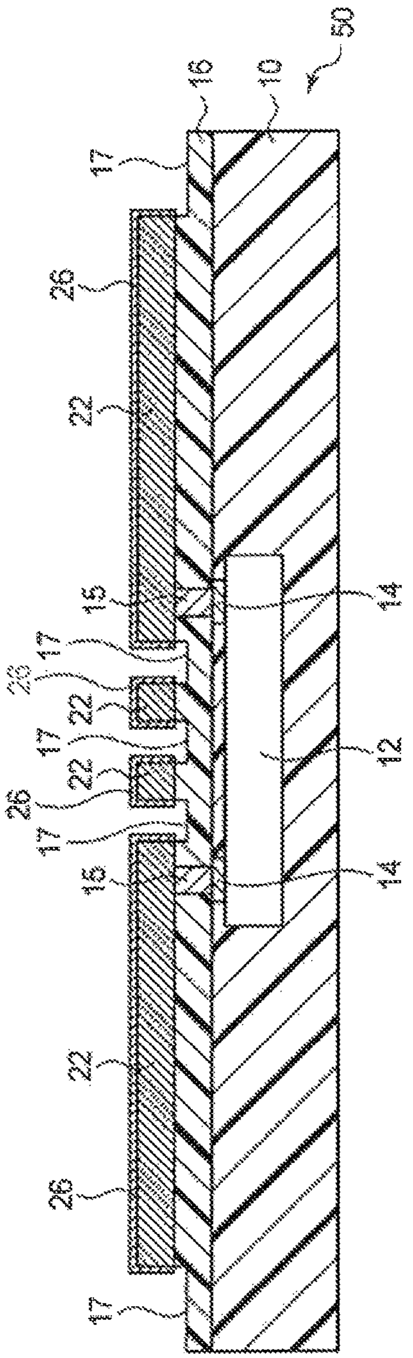
FIGS. 69A and 69B are process cross-sectional views (Part 1) illustrating a method for manufacturing the electronic apparatus according to the modification embodiment.
Figure 69B:
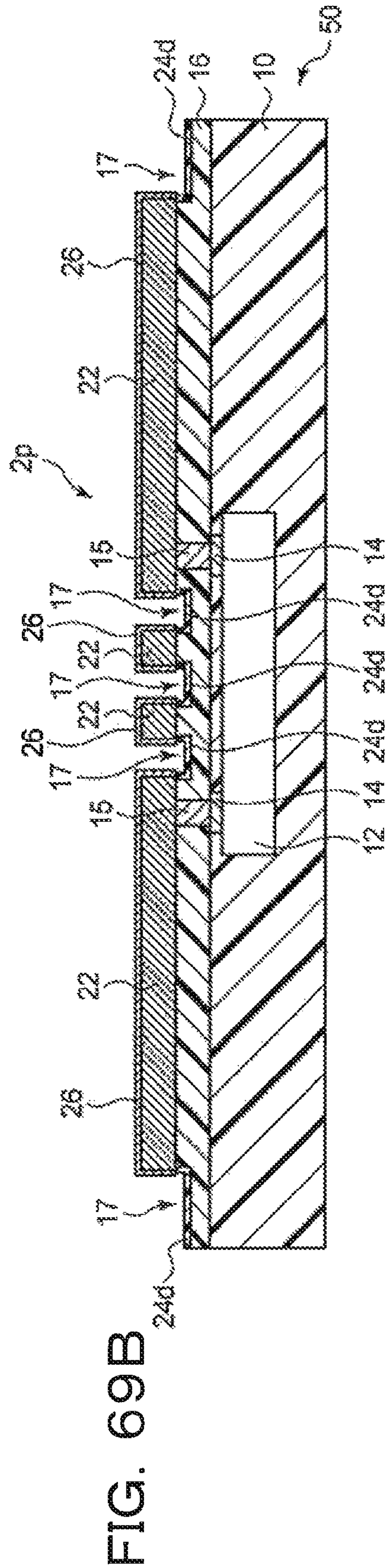
Figure 70:
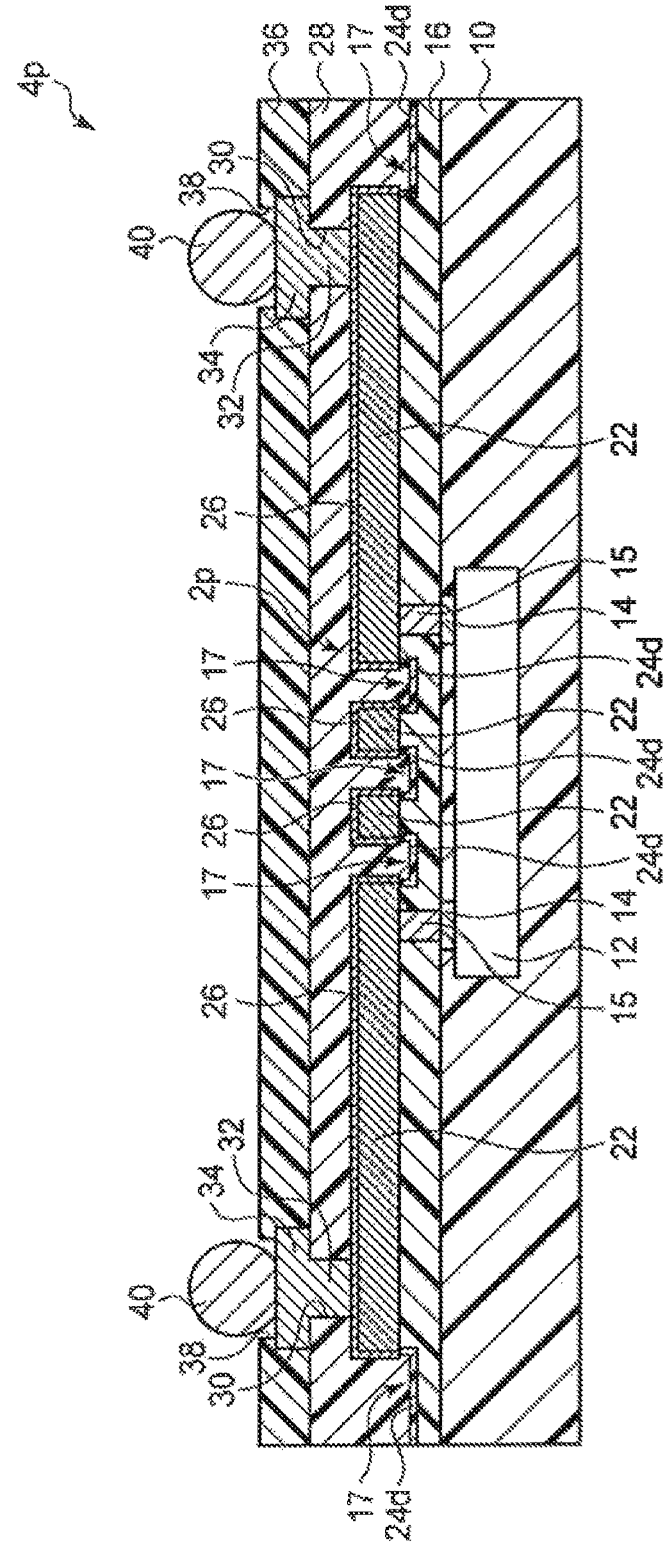
FIG. 70 is a process cross-sectional view (Part 2) illustrating the method for manufacturing the electronic apparatus according to the modification embodiment.

FIGS. 69A through 70 are process cross-sectional views illustrating a method for manufacturing the electronic apparatus according to the modification embodiment. From a process for forming the adhesive layer 48 on the supporting substrate 46 to a process for forming the barrier film 26 on the upper and side faces of the wirings 22 are the same as with the method for manufacturing the electronic apparatus according to the first embodiment illustrated in FIG. 4A through FIG. 12A, and accordingly, description thereof will be omitted (see FIG. 69A).

Next, the inducing layer 24*d* for inducing diffusion of the constituent atoms of the wirings 22 is formed on the insulating film 16 in the region not covered with the wirings 22. The inducing layer 24*d* may be formed by attaching halogen ions on the surface of the insulating film 16 in the region not covered with the wirings 22, or by introducing halogen ions into the surface portion of the insulating film 16 in the region not covered with the wirings 22. Halogen ions may be attached or introduced to the insulating film 16 by subjecting the insulating film 16 to plasma processing employing $CF_4$ gas or $CCl_4$ gas or the like. Also, halogen ions may also be attached or introduced to the insulating film 16 by dipping the insulating film 16 into a chemical including chlorine, more specifically, a $Cl_2$ solution. In this way, the inducing layer 24*d* for inducing diffusion of the constituent atoms of the wirings 22 is formed on the insulating film 16 in the region not covered with the wirings 22.

The method for manufacturing the electronic apparatus according to the modification embodiment after this is the same as the method for manufacturing the electronic apparatus according to the first embodiment described above with reference to FIGS. 13A through 15B, and accordingly, description thereof will be omitted. In this way, an electronic apparatus 4*p* according to the modification embodiment having a wiring structure 2*p* is formed wherein the inducing layer 24 for inducing diffusion of the constituent atoms of the wirings 22 is formed on the insulating film 16 in the region not covered with the wirings 22 (see FIG. 70).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring structure, comprising:

an insulating film formed over a substrate;

a plurality of wirings formed on the insulating film; and an inducing layer, which is formed on the insulating film in a region between the plurality of wirings, a constituent atoms of the wirings are diffused in the inducing layer, wherein a recessed portion is formed in the insulating film in the region between the plurality of wirings, and wherein the inducing layer is formed on the bottom and side portions of the recessed portion.

2. The wiring structure according to claim 1, wherein the inducing layer is formed on the surface portion of the insulating film in the region between the plurality of wirings, and is a roughened portion of the insulating film.

3. The wiring structure according to claim 1, wherein the inducing layer is formed on the surface portion of the insulating film in the region between the plurality of wirings, and is a damaged portion of the insulating film.

4. The wiring structure according to claim 1, wherein the inducing layer includes halogen ions.

5. The wiring structure according to claim 1, wherein the inducing layer includes polyacrylic acid.

6. The wiring structure according to claim 1, further comprising: a barrier film formed on the upper and side faces of the wirings, and restrains diffusion of constituent atoms of the wirings; and another insulating film formed so as to cover the plurality of wirings.

7. The wiring structure according to claim 1, wherein the insulating film is an organic resin film.

8. A method for manufacturing a wiring structure, comprising:

forming an insulating film over a substrate;

forming a plurality of wirings on the insulating film; and forming an inducing layer on the insulating film in a region between the plurality of wirings, a constituent atoms of the wirings are diffused in the inducing layer, wherein a recessed portion is formed in the insulating film in the region between the plurality of wirings, and wherein the inducing layer is formed on the bottom and side portions of the recessed portion.

9. The method for manufacturing a wiring structure according to claim 8, further comprising:

forming a recessed portion in the insulating film in a region between the plurality of wirings by subjecting the insulating film in the region between the plurality of wirings to etching after the forming of the plurality of wirings before the forming of the inducing layer;

wherein, with the forming of the inducing layer, the inducing layer is formed on the bottom and side portions of the recessed portion.

10. The method for manufacturing a wiring structure according to claim 8, wherein, with the forming of the inducing layer, the inducing layer is formed by roughening the surface portion of the insulating film in the region between the plurality of wirings.

11. The method for manufacturing a wiring structure according to claim 8, wherein, with the forming of the inducing layer, the inducing layer is formed by damaging the surface portion of the insulating film in the region between the plurality of wirings.

12. The method for manufacturing a wiring structure according to claim 8, wherein, with the forming of the inducing layer, the inducing layer including halogen ions is formed on the insulating film in the region between the plurality of wirings.

13. The method for manufacturing a wiring structure according to claim 8, wherein, with the forming of the inducing layer, the inducing layer including halogen ion is formed by attaching or introducing halogen ions to the insulating film in the region between the plurality of wirings.

14. The method for manufacturing a wiring structure according to claim 8, wherein, with the forming of the inducing layer, the inducing layer including polyacrylic acid is formed on the insulating film in the region between the plurality of wirings.

15. The method for manufacturing a wiring structure according to claim 8, further comprising: forming a barrier film configured to restrain diffusion of constituent atoms of the wirings, on the upper and side faces of the wirings; and forming another insulating film so as to cover the plurality of wirings.

16. The method for manufacturing a wiring structure according to claim 8, wherein the insulating film is an organic resin film.

17. An electronic apparatus, comprising:

an insulating film formed over a substrate;

a plurality of wirings formed on the insulating film; and an inducing layer formed on the insulating film in a region between the plurality of wirings, a constituent atoms of the wirings are diffused in the inducing layer, wherein a recessed portion is formed in the insulating film in the region between the plurality of wirings, and wherein the inducing layer is formed on the bottom and side portions of the recessed portion.

* * * * *